US010180928B2

(12) United States Patent
Nurvitadhi et al.

(10) Patent No.: US 10,180,928 B2
(45) Date of Patent: Jan. 15, 2019

(54) HETEROGENEOUS HARDWARE ACCELERATOR ARCHITECTURE FOR PROCESSING SPARSE MATRIX DATA WITH SKEWED NON-ZERO DISTRIBUTIONS

(71) Applicant: Intel Corporation, Santa Clara, CA (US)

(72) Inventors: Eriko Nurvitadhi, Hillsboro, OR (US); Deborah Marr, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 15/396,513

(22) Filed: Dec. 31, 2016

(65) Prior Publication Data

US 2018/0189239 A1    Jul. 5, 2018

(51) Int. Cl.
*G06F 17/16* (2006.01)
*G06F 9/30* (2018.01)
*H03M 7/30* (2006.01)

(52) U.S. Cl.
CPC ............ *G06F 17/16* (2013.01); *G06F 9/3001* (2013.01); *G06F 9/30036* (2013.01); *H03M 7/30* (2013.01)

(58) Field of Classification Search
None
See application file for complete search history.

(56) References Cited

U.S. PATENT DOCUMENTS

| 5,206,822 | A  | * | 4/1993  | Taylor    | G06F 15/8061 |
|           |    |   |         |           | 708/607      |
| 2007/0198621 | A1 | * | 8/2007 | Lumsdaine | G06F 17/16   |
|           |    |   |         |           | 708/200      |
| 2015/0379054 | A1 | * | 12/2015 | Kernert  | G06F 17/16   |
|           |    |   |         |           | 707/625      |
| 2017/0168990 | A1 | * | 6/2017  | Kernert  | G06F 17/16   |
| 2018/0189234 | A1 | * | 7/2018  | Nurvitadhi | G06F 15/8069 |

(Continued)

OTHER PUBLICATIONS

Buluc, et al., "On the Representation and Multiplication of Hypersparse Matrices," IPDPS, 2008, 11 pages.

(Continued)

*Primary Examiner* — David H Malzahn
(74) *Attorney, Agent, or Firm* — Nicholson De Vos Webster & Elliott, LLP

(57) ABSTRACT

Heterogeneous hardware accelerator architectures for processing sparse matrix data having skewed non-zero distributions are described. An accelerator includes sparse tiles to access data from a first memory over a high bandwidth interface and very/hyper sparse tiles to randomly access data from a second memory over a low-latency interface. The accelerator determines that one or more computational tasks involving a matrix are to be performed, partitions the matrix into a first plurality of blocks that includes one or more sparse sections of the matrix, and a second plurality of blocks that includes sections of the matrix that are very- or hyper-sparse. The accelerator causes the sparse tile(s) to perform one or more matrix operations for the computational task(s) using the first plurality of blocks and further causes the very/hyper sparse tile(s) to perform the one or more matrix operations for the computational task(s) using the second plurality of blocks.

20 Claims, 41 Drawing Sheets

(56) References Cited

U.S. PATENT DOCUMENTS

2018/0189239 A1\* 7/2018 Nurvitadhi ............ G06F 9/3001
2018/0189675 A1\* 7/2018 Nurvitadhi .............. G06F 17/16

OTHER PUBLICATIONS

Buluc, et al., "Parallel Sparse Matrix-Matrix Multiplication and Indexing: Implementation and Experiments," Society for Industrial and Applied Mathematics, SIAM J. Sci. Comput. 2012, vol. 34, No. 4, pp. C170-C191.
Lavenier, D., "FPGA implementation of the K-means clustering algorithm for hyperspectral images," Los Alamos National Laboratory, LAUR # 00-3079, Jul. 2000, 18 pages.
Sculley, D., "Web-Scale K-Means Clustering," WWW 2010, ACM, 2 pages.
Winterstein, et al., "FPGA-based K-means clustering using tree-based data structures," 23rd International Conference on Field Programmable Logic and Applications (FPL), 2013, 6 pages.
European Search Report for Application No. 17207348.8-1231, dated May 29, 2018, 9 pages.
Lugowski, Adam et al., "Efficient Sparse Matrix-Matrix Multiplication on Multicore Architectures," May 8, 2014, Retrieved from the Internet: URL:http://gauss.cs.ucsb.edu/publication/QuadMat_CSC14.pdf [retrieved on May 9, 2018], 2 pages.
Buluc, Aydin et al., "On the representation and multiplication of hypersparse matrices," 2014 IEEE 28th International Parallel and Distributed Processing Symposium, Apr. 14, 2008, 11 pages.
Zhu, Qiuling et al., "Accelerating sparse matrix-matrix multiplication with 3D-stacked logic-in-memory hardware," 2013 IEEE High Performance Extreme Computing Conference (HPEC), Sep. 10, 2013, 6 pages.
Nurvitadhi, Eriko et al., "Hardware accelerator for analytics of sparse data," Design, Automation & Test in Europe, EDA Consortium, Mar. 14, 2016, 6 pages.
European Search Report for Application No. 17207532.7-1231, dated May 29, 2018, 12 pages.
Nurvitadhi, Eriko et al., "A sparse matrix vector multiply accelerator for support vector machine," 2015 International Conference on Compilers, Architecture and Synthesis for Embedded Systems (CASES), IEEE, Oct. 4, 2015, 8 pages.
Yavits, L. et al., "Sparse Matrix Multiplication on an Associative Processor," IEEE Transactions on Parallel and Distributed Systems, IEEE Service Center, vol. 26, No. 11, Nov. 1, 2015, 9 pages.
Anonymous, "High throughout vs low latency in HDFS," May 23, 2013, Retrieved from the Internet: URL:https://slackoverflow.com/questions/16718095/high-throughput-vs-low-latency-in-hdfs [retrieved on May 14, 2018], 2 pages.
Saule, Erik et al., "Performance Evaluation of Sparse Matrix Multiplication Kernels on Intel Xeon Phi," In: "Medical image computing and computer-assisted intervention—MICCAI 2015: 18th international conference, Munich, Germany, Oct. 5-9, 2015; proceedings," Feb. 5, 2013, 19 pages.
Lijbrink, Sander, "Irregular algorithms on the Xeon Phi," Jun. 17, 2015, Retrieved from the Internet: URL:http://esc.fnwi.uva.nl/thesis/centraal/files/f1908787907.pdf, 26 pages.
Buluc, Aydin et al., "Highly Parallel Sparse Matrix-Matrix Multiplication," Jun. 10, 2010, Retrieved from the Internet: URL:https://arxiv.org/ftp/arxiv/papers/1006/1006.2183.pdf, 44 pages.
Corrected Notice of Allowance from U.S. Appl. No. 15/396,511, dated Sep. 19, 2018, 7 pages.
Notice of Allowance from U.S. Appl. No. 15/396,511, dated Jul. 31, 2018, 17 pages.

\* cited by examiner

FIG. 2

| Operation Type | Input operand1 910 | Input operand2 911 | Output 912 | Matrix Data Format 913 | Operation Identifier 914 |
|---|---|---|---|---|---|
| Multiply 900 | Sparse matrix | Sparse vector | Dense vector | Compressed sparse row (CSR) | mul_spMspV_row |
| | | | | Compressed sparse column (CSC) | mul_spMspV_col |
| | | Dense vector | Dense vector | Compressed sparse row (CSR) | mul_spMdV_row |
| | | | | Compressed sparse column (CSC) | mul_spMdV_col |
| Multiply 901 | Dense matrix | Sparse vector | Dense vector | Row-oriented | mul_dMspV_row |
| | | | | Column-oriented | mul_dMspV_col |
| | | Dense vector | Dense vector | Row-oriented | mul_dMdV_row |
| | | | | Column-oriented | mul_dMdV_col |
| Scale & Update 902 | Sparse matrix | Dense vector | Dense vector | Row-oriented | sau_spMdV |
| | Sparse vector | | | | sau_spVdV |
| Dot product 903 | Sparse vector | Sparse vector | Scalar | N/A | dot_spVspV |
| | Dense vector | Sparse vector | | | dot_dVspV |
| | Sparse vector | Dense vector | | | dot_spVdV |
| | Dense vector | Dense vector | | | dot_dVdV |

FIG. 9

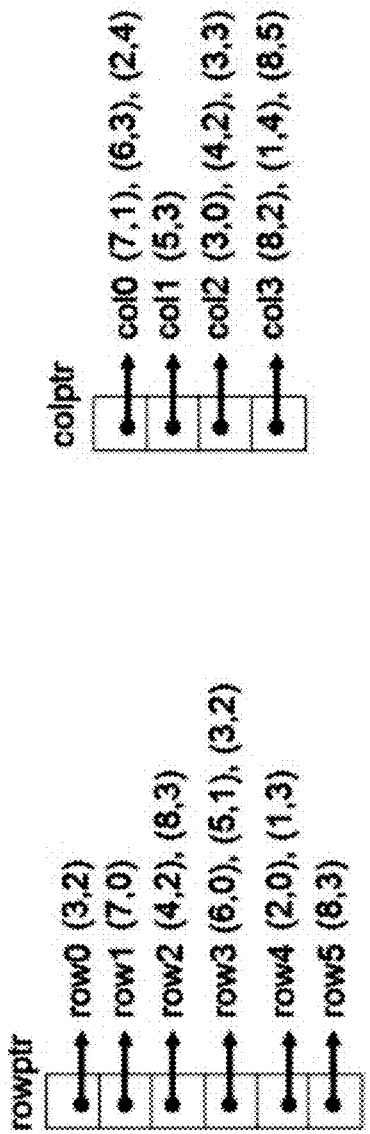

```
spMdV_csr(A, x, y) {
  for each row r of A {
    y[r.idx] = dot_product(r, x)
  }
}
```

*FIG. 11a*

```
spMspV_csc(A, x, y) {
  for each element x_e in vector x {
    col = get column(x_e.idx) of A
    for each element col_e in col
      y[col_e.idx] += x_e.val * col_e.val
  }
}
```

*FIG. 11b*

```
scale_update(A, x, y) {
  for each row r of A {
    for each element r_e in r
      y[r_e.idx] += r_e.val * x[r.idx]
  }
}
```

*FIG. 11c*

| CATEGORY | DETAILS |
|---|---|
| RAMs, buffers | Size, ports, number of banks, shared/private banks |
| Cache | Size, associativity, include/exclude |
| Scaling | Number of tiles, number of PEs/tile |
| Memory interface | Number of interfaces, width, burst size |
| Compute blocks (PROCESS_MSG, REDUCE, SEND_MSG, APPLY) | Content generation strategy (e.g., pipelined, multi-cycle), interface pruning |
| PE scheduling | Scheduling scheme (e.g., row/block interleaved, dynamic) |
| Data storage format | Array of structures, structure of arrays, doubly compressed, unique value compressed |
| Pack/unpack logic | Generation strategy, compression on/off |
| Active vertex handling | Bitvector, N-level compressed |

*FIG. 18a*

| TUNING CONSIDERATIONS | EXAMPLE OF AFFECTED TEMPLATE PARAMETERS |
|---|---|
| Locality of data (x vector) from graph data properties | Cache, interface width |
| Graph data sizes | Sizes of on-chip storage, pack/unpack |
| Graph compute functions | Compute blocks, active vertex handling |
| Graph data structure (non-zeros distribution in adjacency matrix) | Scaling tiles and PEs, memory interfaces, PE scheduling, data storage format |
| Graph data access attributes (read-only, write-only, read/write) | On-chip structures (ports, banks), active vertex handling |
| Graph data types | On-chip structures (ports, banks), pack/unpack |
| Graph data patterns (e.g., commonly recurring values) | Data storage format, pack/unpack logic |

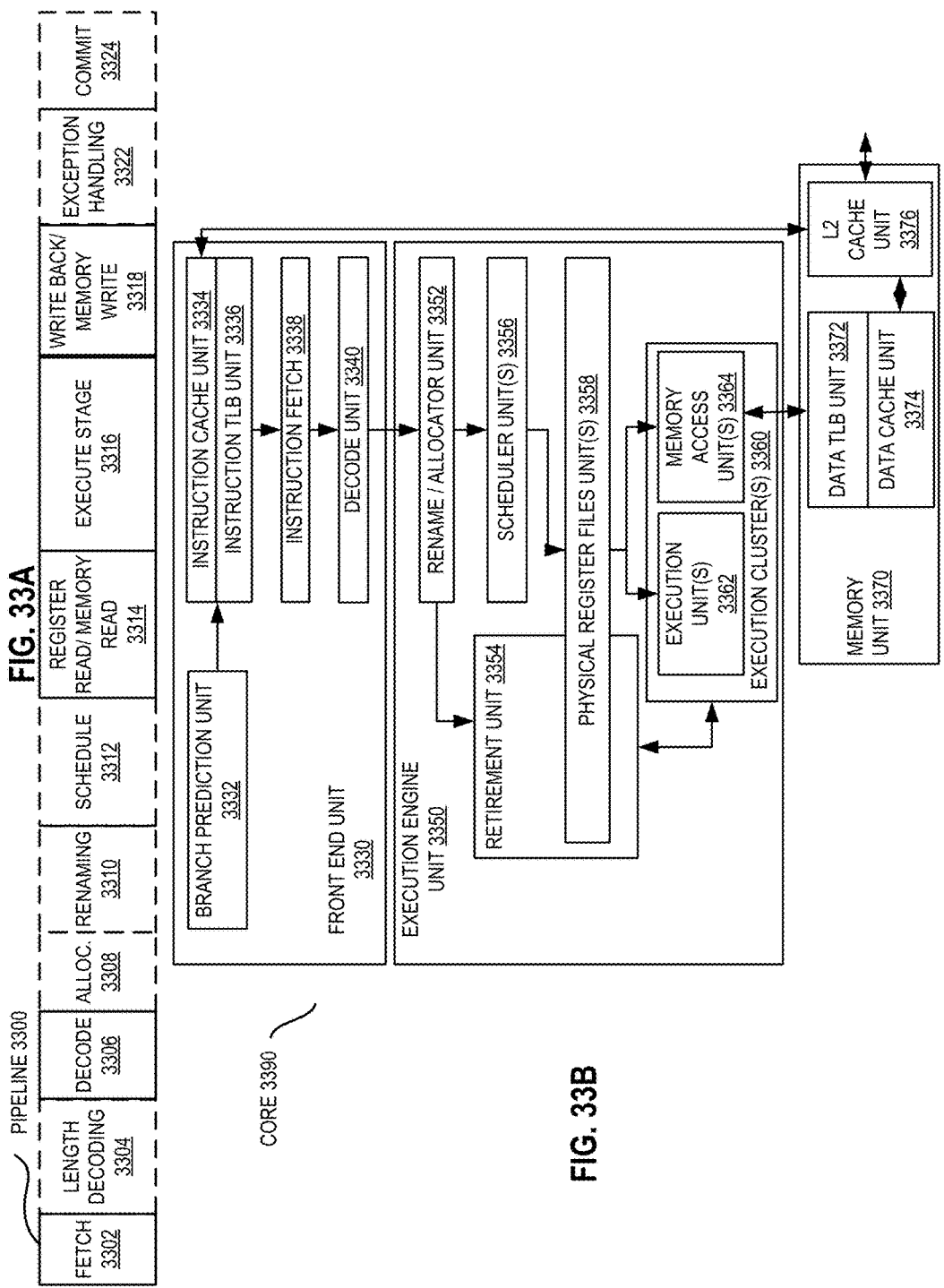

HETEROGENEOUS HARDWARE ACCELERATOR ARCHITECTURE FOR PROCESSING SPARSE MATRIX DATA WITH SKEWED NON-ZERO DISTRIBUTIONS

TECHNICAL FIELD

The disclosure relates generally to electronics, and, more specifically, embodiments relate to heterogeneous hardware accelerator architectures for processing sparse matrix data having skewed non-zero distributions.

BACKGROUND

In just the past few years, algorithms from the relatively nascent field of machine learning have been widely applied for many types of practical applications, resulting in technologies such as self-driving vehicles, improved Internet search engines, speech, audio, and/or visual recognition systems, human health data and genome analysis, recommendation systems, fraud detection systems, etc. The growth of the use of these algorithms has in part been fueled by recent increases in the amount and types of data being produced by both humans and non-humans. Thus, as the increased amount of data available for analysis has skyrocketed, so too has the interest in machine learning.

In many different contexts, machine learning algorithms are commonly being implemented using large matrices. Further, many of these matrices are "sparse" matrices in that they have a significant number of "empty" or "background" values—e.g., zero values. For example, social graphs can be modeled as matrices (e.g., "adjacency matrices") that have as many rows and columns as there are people in the data set, where the elements in the cells of the matrix represent some information about the connections between each pair of people.

When storing and utilizing sparse matrices, it is useful (and sometimes, strictly necessary) to use specialized algorithms and data structures that can take advantage of the sparse structure of the matrix. This is because performing matrix operations using regular dense-matrix structures and algorithms will be quite inefficient when applied to large, sparse matrices as processing and storage resources are effectively "wasted" due to the existence of the substantial amount of zeros. Thus, sparse data can be easily compressed to require significantly less storage, and particular algorithms and computing architectures can be implemented to accommodate these compressed structures.

However, algorithms involving matrix manipulations, which include many machine learning algorithms, tend to be computationally expensive, as they can involve performing huge numbers of non-trivial operations with huge amounts of data. As a result, it is extremely important to implement these algorithms as efficiently as possible, as any small inefficiency is quickly magnified due to the large scale of computation.

Accordingly, techniques and processing architectures that can enhance the performance of these types of operations involving sparse matrix data are strongly desired.

BRIEF DESCRIPTION OF THE DRAWINGS

The invention may best be understood by referring to the following description and accompanying drawings that are used to illustrate some embodiments. In the drawings:

FIG. 2 is a block diagram illustrating an exemplary sparse matrix, very-sparse matrix, and hyper-sparse matrix according to some embodiments.

FIG. 9 illustrates an exemplary set of operations performed by the processing elements according to some embodiments.

FIG. 10a depicts an example of a multiplication between a sparse matrix A against a vector x to produce a vector y according to some embodiments.

FIG. 10b illustrates the CSR representation of matrix A in which each value is stored as a (value, row index) pair according to some embodiments.

FIG. 10c illustrates a CSC representation of matrix A which uses a (value, column index) pair according to some embodiments.

FIGS. 11a, 11b, and 11c illustrate pseudo code of each compute pattern, in which:

FIG. 11a illustrates a row-oriented sparse matrix dense vector multiply (spMdV_csr) according to some embodiments.

FIG. 11b illustrates a column-oriented sparse matrix sparse vector multiply (spMspC_csc) according to some embodiments.

FIG. 11c illustrates a scale and update operation (scale_update) according to some embodiments.

FIG. 14a shows an exemplary graph.

FIG. 14b shows an example of representing the graph of FIG. 14a as an adjacency matrix.

FIG. 14c illustrates a vertex program according to some embodiments.

FIG. 14d illustrates exemplary program code for executing a vertex program according to some embodiments.

FIG. 14e shows a generalized sparse matrix vector multiply (GSPMV) formulation according to some embodiments.

FIG. 18a illustrates a table summarizing the customizable parameters of one implementation of the template according to some embodiments.

FIG. 18b illustrates tuning considerations of one implementation of the framework that performs automatic tuning to determine the best design parameters to use to customize the hardware architecture template in order to optimize it for the input vertex program and (optionally) graph data according to some embodiments.

FIG. 30 illustrates an example of a computation using specific values according to some embodiments.

FIG. 33A is a block diagram illustrating both an exemplary in-order pipeline and an exemplary register renaming, out-of-order issue/execution pipeline according to some embodiments.

FIG. 33B is a block diagram illustrating both an exemplary embodiment of an in-order architecture core and an exemplary register renaming, out-of-order issue/execution architecture core to be included in a processor according to some embodiments.

FIG. 34A is a block diagram of a single processor core, along with its connection to the on-die interconnect network and with its local subset of the Level 2 (L2) cache, according to some embodiments.

FIG. 34B is an expanded view of part of the processor core in FIG. 34A according to some embodiments.

FIG. 36 shown a block diagram of a system in accordance with some embodiments.

FIG. 37 is a block diagram of a first more specific exemplary system in accordance with some embodiments.

FIG. 38 is a block diagram of a second more specific exemplary system in accordance with some embodiments.

FIG. 39 is a block diagram of a SoC in accordance with some embodiments.

DETAILED DESCRIPTION

Figure 1:
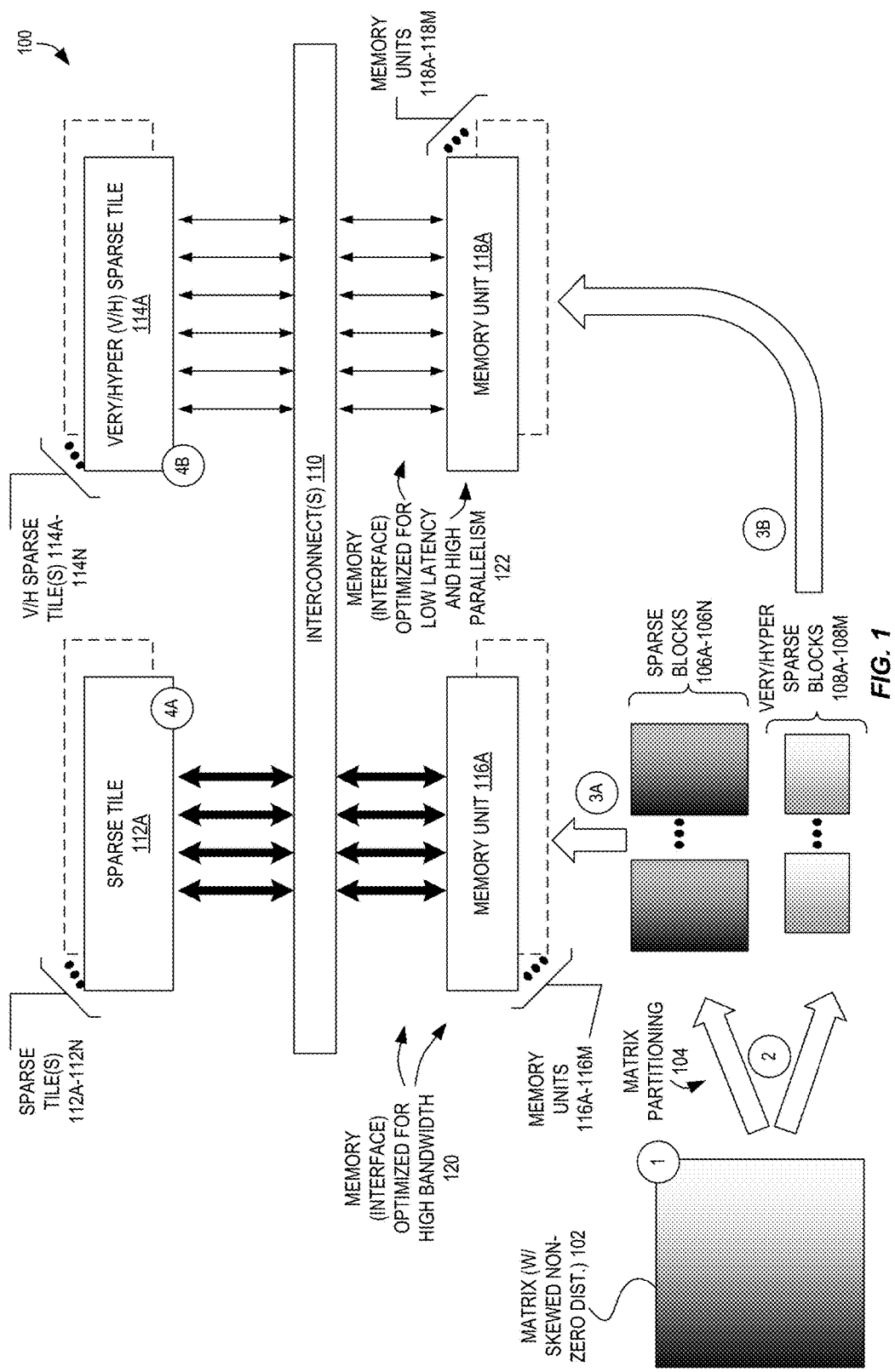
FIG. 1 is a block diagram illustrating a system utilizing a heterogeneous hardware accelerator architecture for processing sparse matrix data having skewed non-zero distributions according to some embodiments.

The following description describes a hardware accelerator architecture for efficiently performing operations involving very-sparse and hyper-sparse matrix data. In this description, numerous specific details such as logic implementations, types and interrelationships of system components, etc., may be set forth in order to provide a more thorough understanding of some embodiments. It will be appreciated, however, by one skilled in the art that the invention may be practiced without such specific details. In other instances, control structures, gate level circuits, and/or full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Bracketed text and blocks with dashed borders (e.g., large dashes, small dashes, dot-dash, and dots) may be used herein to illustrate optional operations that add additional features to embodiments of the invention. However, such notation should not be taken to mean that these are the only options or optional operations, and/or that blocks with solid borders are not optional in certain embodiments of the invention.

Throughout this description, the use of a letter character at the end of a reference numeral (corresponding to an illustrated entity) is not meant to indicate that any particular number of that entity must necessarily exist, but merely that the entity is one of potentially many similar entities. For example, processing elements 306A-306Z include both "A" and "Z" letter suffixes, which means that there could be two processing elements, three processing elements, sixteen processing elements, etc. Moreover, the use of dashed lines, as described above, indicates that one or more of the entities could be optional; thus, in some embodiments only one sparse tile 112A may utilized, whereas in other embodiments multiple sparse tiles 112A-112N may be utilized. Additionally, the use of different letter characters as reference suffixes for different entities is not meant to indicate that there must be different numbers of these entities. For example, although the sparse tiles 112A-112N and the memory units 116A-116M include different letter suffixes—i.e., "N" and "M"—there could be the same number (or different numbers) of these in various embodiments. Similarly, the use of the same letter character as a reference suffix for different entities is not meant to indicate that there must be the same numbers of these entities, although there could be in some embodiments.

Embodiments disclosed herein provide heterogeneous hardware accelerator architectures for processing sparse matrix data having skewed non-zero distributions. In some embodiments, an accelerator can perform a matrix operation with a matrix by having a set of sparse tiles perform the operation for portions of the matrix that are sparse, and having a set of very/hyper sparse tiles perform the operation for portions of the matrix that are very- or hyper-sparse. In some embodiments, the sparse tiles can be architected according to a first architecture enabling regular "sparse" matrix portions to be processed extremely efficiently, and in some embodiments, the very/hyper sparse tiles can be architected according to a second architecture enabling very- or hyper-sparse matrix portions to be processed extremely efficiently. The output (or results) generated by the sparse tile(s) and the very/hyper-sparse tile(s) can be combined to yield the ultimate result for the originally-requested matrix operation. Accordingly, embodiments utilizing separate matrix processing architectures can provide substantial performance increases compared to solutions using just one such architecture, and an extremely large performance increase compared to general-purpose matrix processing systems.

FIG. 1 is a block diagram illustrating a system 100 utilizing a heterogeneous hardware accelerator architecture for processing sparse matrix 102 data having skewed non-zero distributions according to some embodiments. FIG. 1 is shown at a high-level to allow for clarity and ease of understanding. FIG. 1 includes one or more sparse tile(s) 112A-112N coupled with one or more memory unit(s) 116A-116M using one or more interconnects 110, where the interface/memory is optimized for high-bandwidth data transfers between the memory unit(s) 116A-116M and the sparse tile(s) 112A-112N. FIG. 1 also includes one or more very/hyper sparse tiles 114A-114N coupled with one or more memory unit(s) 118A-118M using one or more interconnects 110, where the interface/memory is optimized for low-latency, random, highly-parallel data transfers between the memory units 118A-118M and the very/hyper-sparse tile(s) 114A-114N. In some embodiments, the sparse tile(s) 112A-112N and very/hyper-sparse tile(s) 114A-114N may all be implemented on a same microchip or hardware processor, which may be (or be part of) an accelerator device.

In some embodiments, an accelerator may receive a request (or command) to perform one or more computational tasks involving one or more matrices. For example, a central processing unit (CPU) may offload an instruction to perform certain computational tasks, such as a dot-product of matrices, matrix multiplications, etc., to an accelerator. Upon this offload, at illustrated circle '1', the accelerator can determine whether the involved matrix 102 is sparse and has a skewed non-zero distribution.

In practice, sparse matrix datasets can have skewed distribution of non-zeros, where part of the matrix is sparse (e.g., with a particular threshold number of non-zeros per column or row) and other parts are very-sparse (e.g., with only a few non-zeros per column or row) or hyper-sparse (e.g., with empty columns or rows, such that number of non-zeros could be less than the number of rows and columns in the matrix).

Moreover, skewed non-zero distributions can result from natural graphs that follow a power law distribution, such as where a graph has a few "popular" nodes that have many edges to other nodes, while a large majority of the other nodes have only a few edges. Furthermore, in machine learning datasets, where matrix columns and rows represent features and samples, respectively, it is typical that some features will occur more frequently than others, resulting in skewed non-zeros across columns. Similarly, in user/item matrices used in recommender systems, some users and/or items are more popular than others. Hence, popular users/items will form "denser" rows/columns in an overall sparse matrix.

Figure 2:
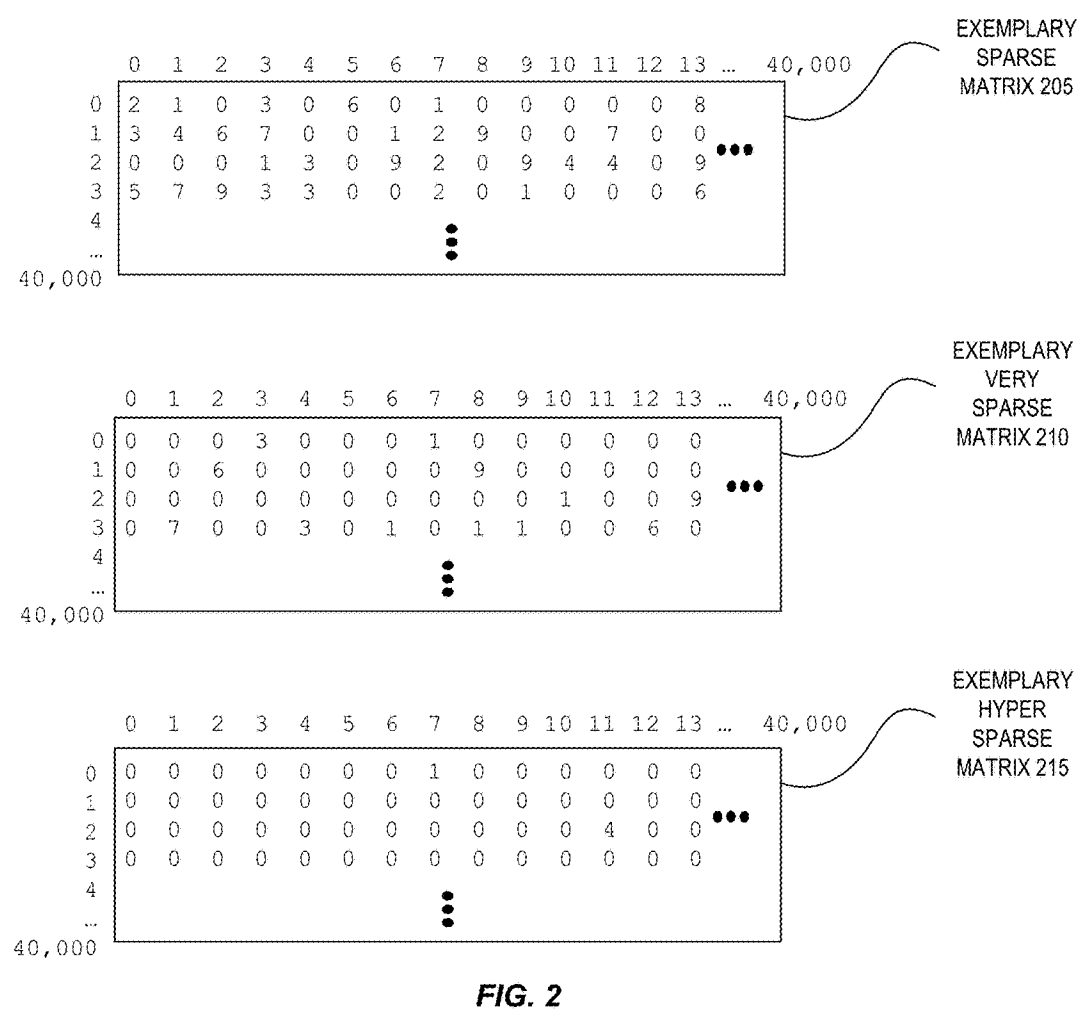

For a further discussion of "sparse," "very-sparse," and "hyper-sparse" matrices, we turn to FIG. 2, which is a block diagram illustrating an exemplary sparse matrix 205, very-sparse matrix 210, and hyper-sparse matrix 215 according to some embodiments.

For the purposes of this description, a differentiation can be made between different types of sparse matrices. As is known in the literature, there are a variety of ways to denote a data structure (e.g., matrix, graph) as being sparse. For example, a graph may be referred to as being sparse if nnz=O(n), where nnz is the number of edges in the graph, and n is the number of vertices.

Another way to distinguish between sparse and not-sparse (or "dense") matrices is based upon how many of the elements of the matrix (or portion of the matrix) are zero. As used herein, a "sparse" matrix or vector is a matrix or vector in which a substantial number of the elements in the region are zero, such that the number/percentage of zeros in that region meets or exceeds a threshold amount (e.g. greater than 10% are zero, 25% or more are zero, etc.). Thus, in some scenarios, a matrix or vector may be sparse when at least half of its elements are zero, though in other scenarios the threshold can be different—e.g., a matrix or vector is sparse if at least thirty percent of its elements are zero, sixty-percent of its elements are zero, etc. Similarly, a "dense" matrix or vector is a matrix or vector in which the number of non-zero elements in a particular space does not exceed this threshold.

The "sparsity" of a matrix/vector may be defined based on the number of zero-valued elements divided by the total number of elements (e.g., m×n for an m×n matrix). Thus, in one implementation, a matrix/vector is considered "sparse" if its sparsity is above a specified threshold.

The category of "sparse" matrices and vectors can further be broken up into sub-segments—e.g., "regular" sparse matrices, "very-sparse" matrices, and "hyper-sparse" matrices.

For example, some literature defines a subset of sparse data structures as being "hyper-sparse" when, for graphs, nnz<n, which is fairly rare in numerical linear algebra but occurs often in computations on graphs, particularly in parallel graph computations. Put another way, a hyper-sparse matrix may be one where an extremely large ratio of the elements of the matrix are zero, such that its sparsity is greater than a particular threshold. Of course, the threshold for determining whether a matrix is hyper-sparse can differ based upon the particular application. For example, a matrix may be deemed hyper-sparse when the sparsity of the matrix is at least 80%, or 90%, or 95%, or 97%, or 99%, or 99.5%, etc.

A further category of sparse matrix deemed a "very-sparse" matrix can be defined as satisfying the threshold for "regular" sparse matrices but not satisfying the sparsity threshold to be considered a "hyper-sparse" matrix. Thus, a "very-sparse" matrix can be one having a sparsity that meets or exceeds a first threshold (e.g., the "regular" sparse threshold) but that does not meet or exceed a second threshold (e.g., the hyper-sparse threshold). Again, the precise formulations may vary based upon the particular application, but in some embodiments a "regular" sparse matrix could be one having a sparsity of 50-70% (i.e., a minimum threshold of 50% and a maximum threshold of 75%), a "very-sparse" matrix could be one having a sparsity greater than 70% but less than 98%, and a hyper-sparse matrix could be one having a sparsity greater than 98%. As another example, a regular sparse matrix could be one having a sparsity between 25-75%, a very-sparse matrix could be one having 75-95%, and a hyper-sparse matrix could be one having a sparsity in excess of 95%. Thus, it is to be understood that there are many different ways to align the particular thresholds.

Accordingly, in FIG. 2 a small portion of an exemplary sparse matrix 205 (40,000×40,000) is illustrated to convey that a substantial number of its values are zero (here, 25 of the 56 values), whereas the small portion of an exemplary "very-sparse" matrix 210 includes more zero values (here, 44 of the 56 values), while the illustrated small portion of the hyper-sparse matrix 215 includes a very large number of zeros (here, 54 of the 56 values). Assuming that the distribution of zeros and non-zeros is shown here is perfectly representative of the rest of these matrices, one possible breakdown of the involved sparsity thresholds could be that "regular" sparse matrices are at least 20% sparse but are less than 50% sparse, "very-sparse" matrices are at least 50% sparse but not more than 90%, and that "hyper-sparse" matrices are greater than 90% sparse.

In addition to categorizing the sparseness of a matrix based upon its sparsity ratio, in some scenarios the sparseness type (or category) can be based (in whole or in part) upon whether a certain number of rows or columns are completely empty. For example, in some embodiments, a very-sparse or hyper-sparse matrix may be defined as a matrix including a particular number of rows and/or columns that are empty. This determination of the sparseness type may be independent of the particular sparsity ratio of the matrix (e.g., a matrix with a very large sparsity ratio may not, in some cases, qualify as a very- or hyper-sparse matrix if it does not have a requisite threshold number of empty rows and/or columns), or may the determination may be a combination of both the sparsity ratio and the row/column-emptiness criteria, or either.

Turning back to FIG. 1, the illustrated matrix 102 is shown with a gradient background where the left side, having a darker shading, indicates parts (or amounts) of the matrix 102 that are generally sparse, meaning that these parts may have small non-sparse sub-portions, but that as a whole, these portions are typically more sparse than not. Similarly, the right side of the illustrated matrix 102, having a lighter shading, indicates parts (or amounts) of the matrix 102 that are generally "very-sparse" and/or "hyper-sparse."

Various techniques exist where, for many different matrix operations, sub-portions of a matrix can be separately processed/operated upon in "blocks" (or "chunks"), and the results of the individual processing of these blocks can be combined (or aggregated) to yield the proper result.

Accordingly, at circle '2', the accelerator can perform matrix partitioning 104 to split the matrix 102 into a set of sparse blocks 106A-106N and a set of very/hyper sparse blocks 108A-108M. Thus, the accelerator can determine block boundaries of the matrix such that parts of the matrix having similar properties are placed in the same block.

In various embodiments, the size of each of the sparse blocks 106A-106N may be the same or different, the size of each of the set of very/hyper sparse blocks 108A-108M may be the same or different, and the sizes of the sparse blocks 106A-106N and the very/hyper sparse blocks 108A-108M may be the same or different.

Additionally, the number of blocks in the set of very/hyper sparse blocks 108A-108M and the set of sparse blocks 106A-106N may be the same or different, and the amount of matrix data included within each of the sets may be the same or different. For example, as illustrated, the size of each of the sparse blocks 106A-106N is larger than the size of the very/hyper sparse blocks 108A-108M.

In some embodiments, however, the size of the particular blocks can be selected based upon properties of the particular type of tile that will act upon it, which will be discussed in additional detail later herein.

During the partitioning 104 phase at circle '2', in some embodiments the accelerator can also perform optimizations to improve the processing efficiency of the blocks. As an example, one optimization used in some embodiments includes changing the matrix format (or representation) for each block. For example, in some embodiments, each hyper-sparse block be reformatted in a doubly-compressed format (e.g., Doubly Compressed Sparse Column (DCSC) format, as discussed below), and in some embodiments, identified "skinny" and tall matrix blocks (e.g., having a small number of columns but many rows) can be reformatted into a matrix representation in a row-oriented format to avoid memory scatter. In some embodiments, other optimizations can include optimizing the scheduling of the blocks for processing and producing scheduling hints for the heterogeneous architecture to use.

At this point, in some embodiments the accelerator can cause one or more sparse tiles 112A-112N to perform one or more matrix operations for the one or more computational tasks using the set of sparse blocks 106A-106N and further cause the one or more very/hyper sparse tiles 114A-114N to perform one or more matrix operations for the one or more computational tasks using the very/hyper sparse blocks 108A-108M. In some embodiments, this includes, at circle '3A', causing the sparse blocks 106A-106N (in a raw matrix format, in a compressed matrix format, etc.) to be placed in one or more memory unit(s) 116A-116M, and at circle '3B', causing the very/hyper sparse blocks 108A-108M to be placed in one or more memory unit(s) 118A-118M.

At circles '4A' and '4B', the accelerator can then cause the sparse tile(s) 112A-112N to begin operating upon the sparse blocks 106A-106N using the memory interface 120 that has been optimized for high bandwidth, and cause the very/hyper-sparse tile(s) 114A-114N to begin operating upon the very/hyper sparse blocks 108A-108M using the memory interface 122 that has been optimized for low-latency, random, short, and/or parallel requests. Details regarding these particular architectures will be presented below. However, with this heterogeneous architecture using both types of tiles, both the sparse tile(s) 112A-112N and the very/hyper-sparse tile(s) 114A-114N can efficiently process their respective blocks to produce results that can be combined to create a final result for the originally-requested computational tasks.

As introduced in the Background, many different kinds of matrix operations are important for machine learning and in other domains, including but not limited to systems implementing graph computations using matrix operations (e.g., breadth first search), bioscience modeling, high performance computing, computer vision, computer graphics, etc. In these applications, it is quite common to utilize extremely large matrices, and it is also common for the involved matrices to be sparse.

In many systems, "raw" matrices are stored as two-dimensional arrays. Each entry in the array represents an element $a_{i,j}$ of the matrix and is accessed by the two indices, i (typically, the row index) and j (typically, the column index). For an m×n matrix, the amount of memory required to store the matrix in this format is somewhat proportional to m×n, though additional data also needs to be stored (e.g., the dimensions of the matrix, data structure "bookkeeping" data).

In the case of sparse matrices, significant memory reductions can be gained by storing only non-zero entries. Various data structures have been developed to do just this, and different ones of these structures can be utilized which, based upon the number and distribution of the non-zero entries, can result in significant savings in memory when compared to the basic array-based approach. However, a trade-off arises in that accessing the individual elements can become more complex (e.g., require additional memory accesses due to following pointers, calculating memory addresses, etc.), and additional data structures may be needed to be able to recover the original matrix in a lossless manner.

For example, many different compressed matrix formats exist, including but not limited to Compressed Sparse Column (CSC), Compressed Sparse Row (CSR), Dictionary of Keys (DOK), List of Lists (LL), Doubly Compressed Sparse Column (DCSC), etc. Examples of CSC and CSR will be presented in further detail with regard to FIG. 10b and FIG. 10c; however, we will briefly discuss them now.

In CSC, a matrix (e.g., a 6×4 matrix, having 6 rows and 4 columns) can be represented using a data structure (e.g., an array, list, vector) that we will call "colptr" includes four values, each of which represents a column of the matrix and stores a pointer to one or more data elements within the column. Each element can have two data elements: a first being a particular value stored in the matrix, and a second being an index of that value as it is stored in the matrix. For example, a column pointer that points to "col0" (the first column) could include three elements—(7, 1), (6, 3), and (2, 4)—indicating that the value "7" is stored in row[1] (i.e., the second row), value "6" is stored in row[3], and value "2" is stored in row[4]. Of course, in many implementations, additional "bookkeeping" type data (and/or data structures) may also be stored and utilized (e.g., to demarcate the beginning/end of an element, to demarcate the end of the elements for a particular column) which will be discussed in further detail later herein.

To perform a matrix computation using a matrix in CSC format, the values of the "colptr" (short for "column pointer") data structure (i.e., the pointers/memory addresses) must be first loaded from memory, and these pointers must be followed (e.g., via another load from memory) to find the particular elements of each corresponding column. Additionally, each element of the columns may or may not be stored contiguously in memory, which could require additional pointer chasing. For example, for a particular column having three elements, these elements may or may not be stored at contiguous memory locations, and thus, there might be additional bookkeeping data (e.g., underlying structural data of the data structure, which could be pointers) that allows for the locations of these elements to be determined. Accordingly, to perform this operation, there may need to be several "loads" of data from memory—loads of metadata/pointers and/or loads of actual elements representing values of the matrix.

Similar to the CSC format, a matrix in CSR format uses a similar representation, but instead the values of the matrix are arranged according to rows, not columns. Thus, a matrix in CSR format could use a "rowptr" (short for "row pointer") data structure including pointers to elements of each of the rows.

Another matrix representation that is commonly utilized is the DCSC format, which is a further-compressed (e.g., a doubly-compressed) version of CSC utilizing another layer of pointers, in which the repetitions in a column pointer structure can be eliminated. For example, a "JC" array (which is parallel to a column pointer array), provides the column numbers, and the column pointer array is compressed to avoid the repetitions of the CSC format. Thus, the DCSC representation can be viewed as a sparse array of sparse columns, whereas the CSC representation is a dense array of sparse columns.

Accordingly, a variety of low-level matrix representations exist that can be used for performing matrix operations that are storage efficient, though perhaps at the expense of some administrative and utilization overheads (e.g., pointer chasing, additional loads). Many of these matrix representations are particularly useful for use with sparse matrices having a significant amount of non-zero values.

Accordingly, various compute architectures can be developed to optimize performance for sparse matrices stored in certain compressed formats.

An interesting observation is that while the various matrix representations commonly utilized provide significant benefits for storing and using sparse matrices, for a subset of sparse matrices, these matrix representations introduce significant overheads and inefficiencies.

Thus, some types of sparse matrices—especially those that have many (or nearly all) non-zeros—are not processed very efficiently with current architectures. Moreover, it has been determined that a particular architecture, while being extremely efficient for sparse data, can be out-performed by a separate architecture when processing very-sparse or hyper-sparse data. Accordingly, as described above, embodiments can use a heterogeneous architecture including sparse tile(s) 112A-112N for efficiently operating upon sparse data and very-/hyper-sparse tile(s) 114A-114N for efficiently operating upon very/hyper-sparse data.

Figure 3:
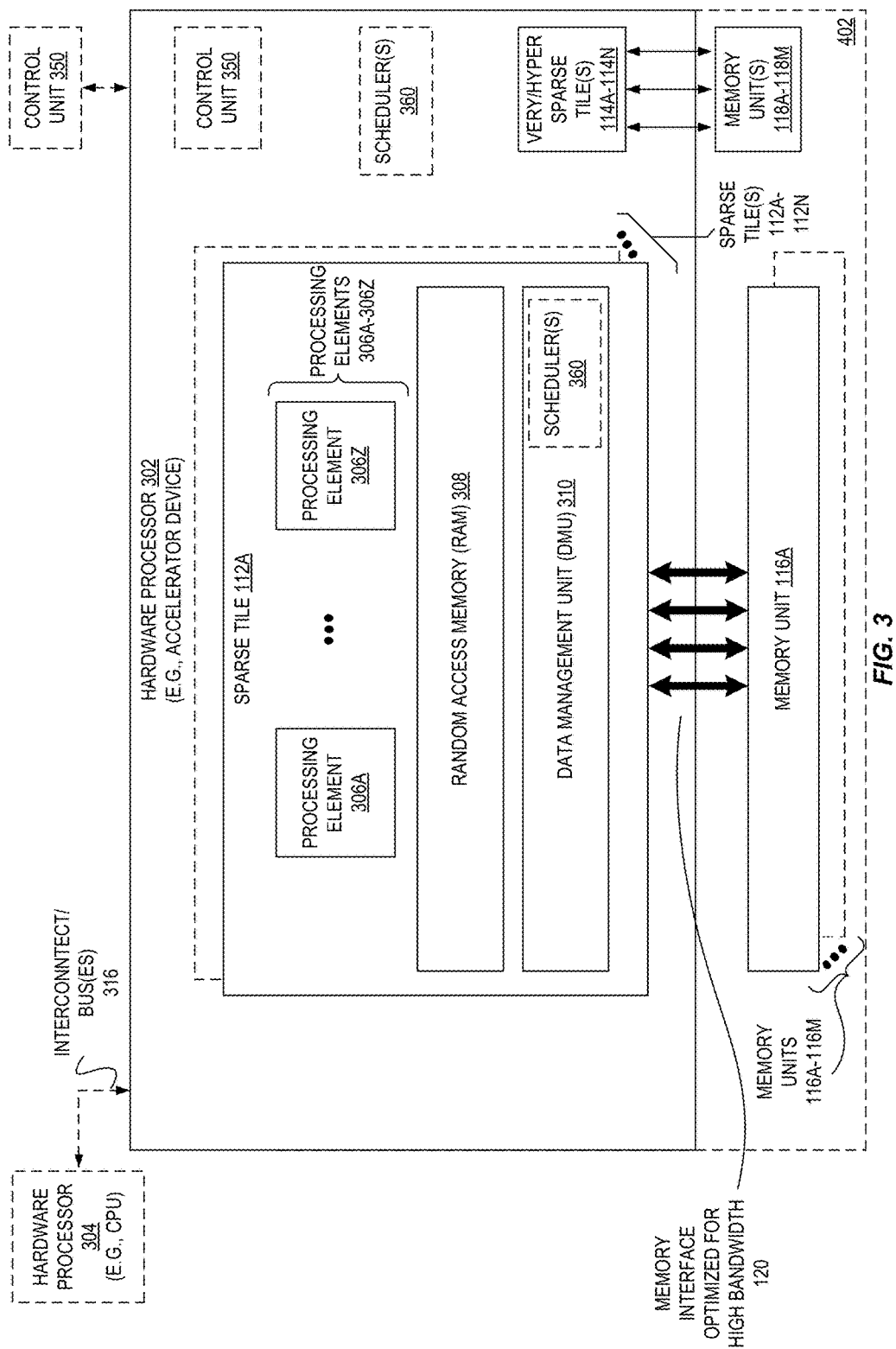
FIG. 3 is a block diagram illustrating components of a sparse tile of a hardware processor according to some embodiments.

FIG. 3 is a block diagram illustrating the components of a sparse tile (e.g., 112A) of a hardware processor 302 according to some embodiments. The hardware processor 302 can be an accelerator device that can perform operations that have been offloaded by another hardware processor 301 (e.g., a CPU 301 via one or more interconnections/buses/etc. 316). Further details regarding accelerators as well as this architecture for processing sparse matrices is presented later herein with regard to later figures.

The hardware processor 302 includes one or more "sparse" tiles 112A-112N. Each of the sparse tiles 112A-112N includes one or more processing elements (PEs) 306A-306Z, though in many embodiments each tile includes multiple PEs. PEs 306A-306Z can be thought of as similar to a processor core, and the details of which are presented in additional detail with regard to the later figures. Each of the processing elements 306A-306Z may comprise circuitry to execute one or more instructions to perform operations, and may or may not be part of a processor core. Thus, a processing element may be thought of as one type of a hardware processor or one part of a hardware processor.

Each sparse tile (e.g., sparse tile 112A) can also include a random access memory (RAM) 308 (e.g., an on-chip cache) as well as a data management unit (DMU) 310 that provides access to one or more (possibly off-tile) memory unit(s) 116A-116M (e.g., storing the matrices involved in the operations) via a memory interface 120 that is optimized for high bandwidth data transfers. Thus, as shown by the dashed lines, the memory unit(s) 116A-116M and/or memory unit(s) 118A-118M may be internal to, or external to, the hardware processor 302 in different embodiments.

The hardware processor 302 can include a control unit 350 (or communicate with an external control unit 350) that can perform the matrix sparsity/skew determination, matrix partitioning, etc., operations disclosed above. The control unit 350 can be implemented in a variety of ways in a straightforward manner, which can be via hardware circuitry, a software module, or a combination of both software and hardware.

The hardware processor 302 can also include one or more hardware schedulers 360, which can dynamically and statically (e.g., using the aforementioned scheduling hints) determine the processing schedule of the matrix blocks on the tiles to improve the overall efficiency (e.g., by minimizing load imbalance across the tiles) of the system.

This hardware processor 302 can utilize a variety of techniques to optimize the execution efficiency of sparse matrix operations. First, in some embodiments, the hardware processor 302 can partition the matrix into small enough blocks such that each vector subset being operated against each block can fit in the on-chip RAMs 308, so that it can be efficiently accessed in an irregular/random manner locally and reused when operated against the non-zero elements in the matrix block. Thus, in some embodiments, the "X" vectors and/or "Y" vectors (e.g., the second operand of a matrix operation, and the result of the matrix operand, respectively) can be kept on-chip in the RAM 308 for very fast, low-latency updates.

Second, in some embodiments, the hardware processor 302 can stream the non-zeros of the rows (or columns) of the sparse blocks 106A-106N from the (possibly off-chip) memory unit(s) 116A-116M to saturate the available, large memory bandwidth. Each of the streamed non-zeros can be applied against the vector subset being kept on-chip, as explained above. Thus, in some embodiments, the values of the sparse blocks 106A-106N can be streamed over a high bandwidth connection to be processed by the processing elements 306A-306Z (as opposed to being requested by the processing elements 306A-306Z using individual random accesses).

Accordingly, these techniques work especially well with sparse matrices where there are sufficient amounts of non-zeros per block. However, this architecture is not as effective for very-sparse and hyper-sparse matrices. This is due to the following reasons:

First, because a very/hyper-sparse matrix has very few non-zeros, it incurs relatively higher blocking overhead (e.g., due to row or column pointers). This means that there is larger overhead for processing "bookkeeping" data (e.g., different data structures, pointers, etc.) as well as making memory accesses to them, relative to the processing of the actual non-zero matrix elements.

Additionally, because very/hyper-sparse matrices have very few non-zeros per column (or row), accessing the columns (or rows) involves making a large number of small (or "short") memory accesses. This is not efficient for an architecture optimizing memory accesses to be high bandwidth (e.g., at the expense of latency). This also means that there is less data reuse on the vector being operated against. For hyper-sparse matrices, there is also a heightened amount of additional short reads when using doubly-compressed formats (e.g., DCSC) to more efficiently represent empty rows/columns.

Further, any data dependence from having to access column (or row) pointer to access the non-zeros of the column (or row) is exposed because there are few non-zeros to be accessed and processed that could potentially hide the access to the next column (or row) pointer. This results in performance being negatively impacted by the relatively-large memory latency. Thus, the very/hyper-sparse tile(s) 114A-114N can be used to process the set of very/hyper sparse blocks 108A-108M.

Figure 4:
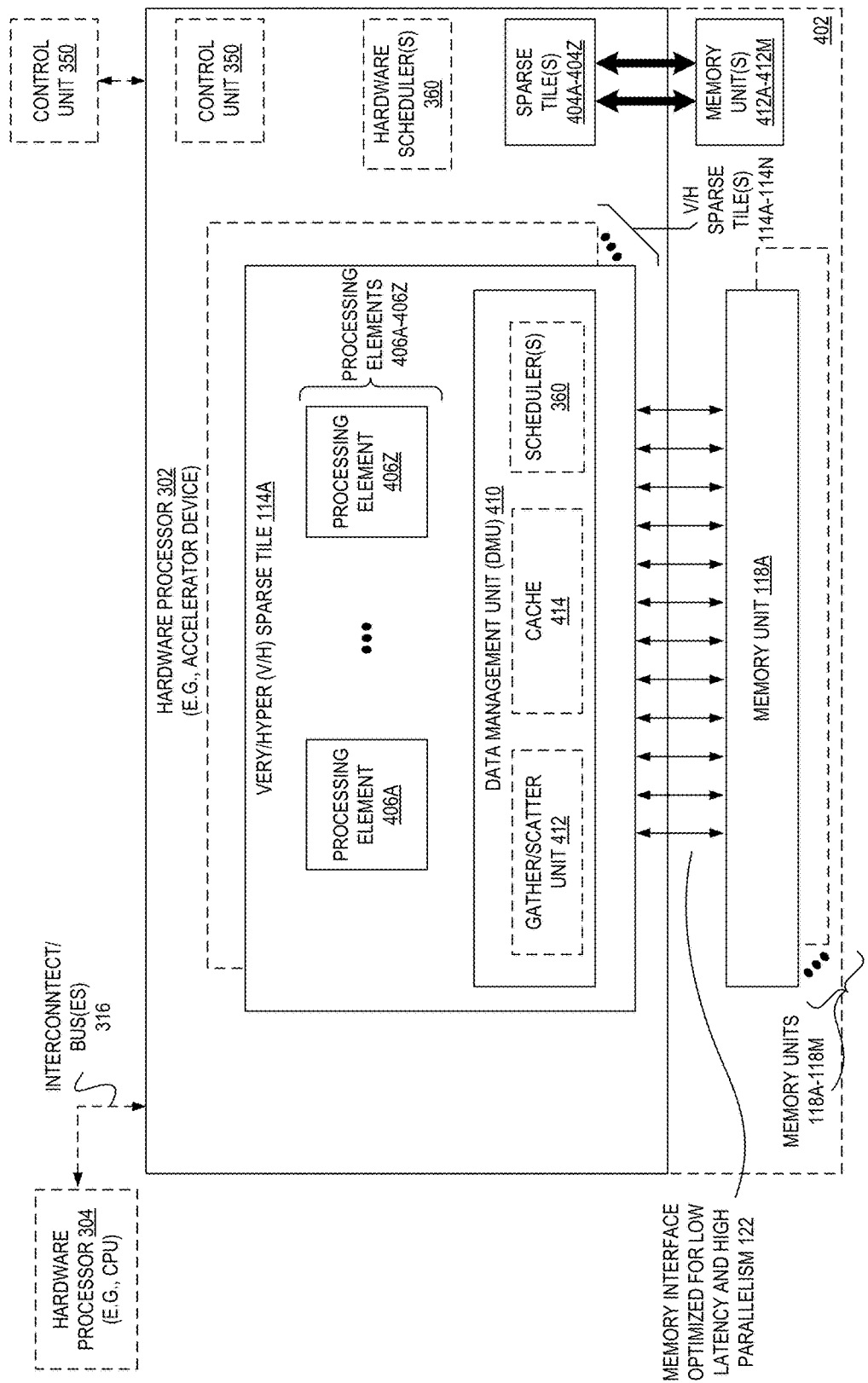
FIG. 4 is a block diagram illustrating components of a very/hyper sparse tile of a hardware processor according to some embodiments.

Accordingly, the alternate architecture for performing sparse matrix operations involving very- and/or hyper-sparse matrices is shown in FIG. 4, which is a block diagram illustrating the components of a very/hyper sparse tile (e.g., 114A) of hardware processor 302 according to some embodiments. This architecture can dramatically improve the processing efficiency of very/hyper-sparse matrix data (i.e., very/hyper sparse blocks 108A-108M) for the processor 302, which can be implemented in a variety of ways, e.g., using Application-Specific Integrated Circuits (ASICs), Field-Programmable Gate Arrays (FPGAs), etc.

As shown in FIG. 4, the hardware processor 302 includes one or more very/hyper-sparse tiles 114A-114N, each including one or more processing elements 406A-406Z (which can be the same or different than processing elements 306A-306Z) and a DMU 410. The DMU 410 can provide the one or more processing elements 406A-406Z access to one or more (possibly off-tile) memory units 118A-118M via a memory interface 122 that is optimized for low-latency random accesses (e.g., as opposed to the high-bandwidth accesses, such as streaming, of the sparse tile(s) 112A-112N) with high parallelism (e.g., using heavily-banked memory). In some embodiments, the DMU 410 can include a gather-scatter unit 412 to perform gathers (e.g., irregular accesses via following pointers, etc.) and scatters without, perhaps, requiring the involvement of the requesting one or more processing elements 406A-406Z.

Using this architecture, the hardware processor 302 is optimized for processing large matrix blocks (e.g., which can be generated by the matrix partitioning phase) with a low-latency memory sub-system capable of handling parallel small/short random memory accesses.

In some embodiments, the hardware processor 302 can minimize blocking overhead by using large blocks, even if it means that the vector subset being operated against the matrix block also becomes large.

In some embodiments, the hardware processor 302 can thus use a larger vector subset, which can be kept in the memory unit(s) 118A-118M (as opposed to brining it onto RAM 408, as is done by the sparse tile(s) 112A-112N and shown in FIG. 3). Hence, the DMU 410 can be adapted (e.g., via gather/scatter unit 412) to efficiently handle parallel gather/scatter (i.e., irregular) memory accesses to this vector subset.

Optionally, in some embodiments the DMU 410 can include a comparatively small on-chip cache 414 to capture the modest data re-use available in this vector subset. For example, when access values of a column of a matrix, in some cases there may be several values of the column stored in contiguous memory locations. Thus, depending upon the granularity of the memory system (e.g., the size/amount of data returned for a read) and the size of the matrix values (e.g., a data type of the values/indices), a memory access may possibly return a next-needed value/index. For example, if a value and an index (representing an element of a matrix) are each 4 bytes in size, a 16-byte memory access may retrieve two elements, the second of which might be a next-needed element, which provides the benefits of spatial locality.

In some embodiments, the DMU 410 is also optimized for low latency to limit exposure to column (or row) pointer chasing dependencies, as well as support parallel memory short accesses tailored for short matrix columns (or rows).

Thus, according to some embodiments, the memory 118A-118M is adapted for low latency, parallel, short, irregular accesses, even if this comes at the expense of lessened bandwidth. To implement these features, there are many memory optimizations known to those of ordinary skill in the art that can be used (smaller rows, narrow prefetch buffers, etc.).

In some embodiments, as these very/hyper-sparse matrix operations are memory-intensive, the number of PEs 406A-406Z involved in the operations can be minimized to match the rate of data capable of being brought from memory unit 118A-118M.

Thus, embodiments using this heterogeneous architecture can perform, using this very/hyper-sparse architecture of FIG. 4, the matrix operations as in the previous sparse architecture of FIG. 3, but at a better execution efficiency for the very-sparse or hyper-sparse in nature.

This results from, among other things, accesses to the very/hyper sparse blocks 108A-108M using short, irregular, low-latency memory accesses, whereas the architecture of the sparse tile(s) 112A-112N as shown in FIG. 3 (which provides efficient sparse matrix computations for "regular" sparse matrices) may stream non-zero elements of the rows (or columns) of the sparse blocks 106A-106N, and/or localizing/re-using the vector subset being operated against in an on-chip memory, e.g., through properly blocking the matrix data.

Again, the number of PEs 406A-406Z can be specifically chosen, for example, based upon the memory connection technology (i.e., the latency and/or bandwidth of the memory providing the low-latency, parallel, random accesses). For example, a simulation modeling can be performed to determine the optimal amount of PEs 406A-406Z to properly saturate the memory to not under-utilize the memory or set of PEs 406A-406Z.

Figure 5:
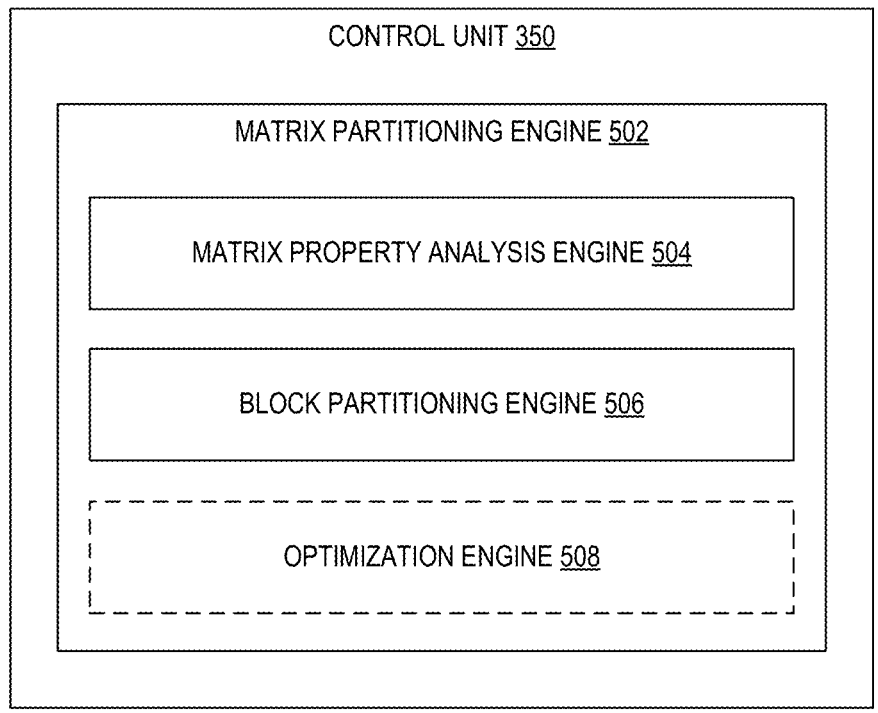
FIG. 5 is a block diagram illustrating components of a control unit according to some embodiments.

As indicated above, the control unit 350 may perform the matrix sparsity/skew determination, matrix partitioning, etc., operations disclosed herein. For further detail, we turn to FIG. 5, which is a block diagram illustrating components of a control unit 350 according to some embodiments.

The control unit 350 can include a matrix partitioning engine 502, which includes a matrix property analysis engine 504, a block partitioning engine 506, and optionally an optimization engine 508.

The matrix property analysis engine 504 can perform the initial matrix analysis as described herein, including determining whether the matrix is sparse (as a whole) and/or determining whether the matrix has a skewed non-zero distribution. For example, the matrix property analysis engine 504 can analyze matrix properties such as the number of non-zeros per row and/or column, or other properties helpful to determine whether (and how) to partition the matrix into blocks.

The block partitioning engine 506 can, in some embodiments, make partitioning decisions based upon the analysis performed by the matrix property analysis engine 504 such that parts of the matrix with similar properties are placed together, which can include identifying the boundaries within the matrix of the various sparse blocks 106A-106N and very/hyper sparse blocks 108A-108M.

The optimization engine 508 can, in some embodiments, make certain optimizations to prepare the data of the various sparse blocks 106A-106N and very/hyper sparse blocks 108A-108M to be processed, which can include changing the representation of this data (e.g., from a "raw" matrix to a compressed representation of a matrix, such as the doubly-compressed format DCSC for the hyper-sparse blocks) or generating and providing hints to the hardware schedulers 360 for use in dynamically and/or statically determine the processing schedule of the matrix blocks on the tiles to improve the overall efficiency (e.g., by minimizing load imbalance across the tiles) of the system.

Figure 6:
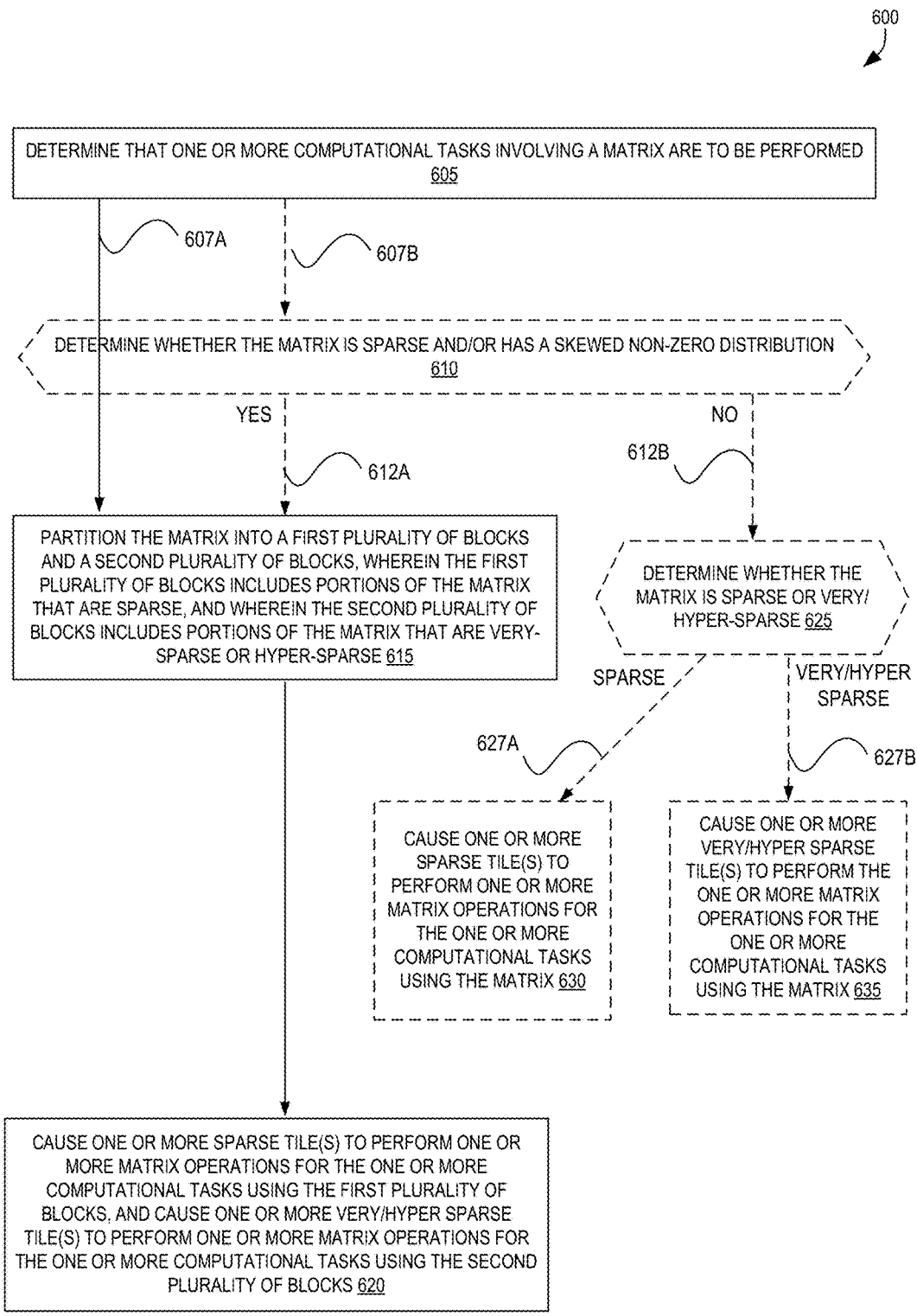
FIG. 6 is a flow diagram illustrating a flow for processing sparse matrix data having skewed non-zero distributions according to some embodiments.

FIG. 6 is a flow diagram illustrating a flow 600 for processing sparse matrix data having skewed non-zero distributions according to some embodiments.

The operations in this and other flow diagrams will be described with reference to the exemplary embodiments of the other figures. However, it should be understood that the operations of the flow diagrams can be performed by embodiments other than those discussed with reference to the other figures, and the embodiments discussed with reference to these other figures can perform operations different than those discussed with reference to the flow diagrams. In some embodiments, this flow 600 is performed by a hardware processor 302 (e.g., hardware accelerator) of FIG. 3 and FIG. 4. In some embodiments, the flow 600 can be performed by a hardware processor 302, or in some embodiments by a control unit 350, which can be a part of the hardware processor 302 or external to the hardware processor 302.

Flow 600 includes, at block 605, determining that one or more computational tasks involving a matrix are to be performed. This determination can be based upon an offload of one or more computational tasks to the hardware processor 302, etc.

In some embodiments, the flow 600 continues via arrow 607A directly to block 615, which includes partitioning the matrix into a first plurality of blocks and a second plurality of blocks. The first plurality of blocks includes portions of the matrix that are sparse, and the second plurality of blocks includes portions of the matrix that are very-sparse or hyper-sparse. In some embodiments, block 615 includes analyzing the amount and/or locations of zeros and/or non-zeros of the matrix to determine whether portions of the matrix are less than or greater than certain thresholds (e.g., thresholds defining the bounds of what is sparse, what is very-sparse, and what is hyper-sparse). In some embodiments, block 615 includes identifying boundaries of the blocks within the matrix according to this analysis, and in some embodiments, block 615 includes performing one or more optimizations based upon these blocks—e.g., changing the matrix representation/format of one or more of the blocks, providing hints to a hardware scheduler, etc.

Flow 600 may then proceed to block 620, which includes causing one or more sparse tiles to perform one or more matrix operations for the one or more computational tasks using the first plurality of blocks, and causing one or more very/hyper sparse tiles to perform one or more matrix operations for the one or more computational tasks using the second plurality of blocks. In some embodiments, block 620 includes copying the blocks to memory units corresponding to the one or more sparse tiles and the one or more very/hyper sparse tiles, but in some embodiments, block 620 includes providing identifiers of the blocks (e.g., memory locations) to the sparse tile(s) and very/hyper-sparse tile(s).

After block 605, in some embodiments the flow 600 may optionally continue via arrow 607B to an optional decision block 610, which includes determining whether the matrix is "generally" sparse (overall) and has a skewed non-zero distribution. Block 610 can include, in some embodiments, analyzing the numbers and locations of the zero and/or non-zero values of the matrix, and may include, determining whether higher frequencies of non-zeros exist at least a threshold amount more at one side of the matrix compared to another side (e.g., the opposite side).

If the matrix is sparse and has a skewed non-zero distribution, the flow 600 may continue via arrow 612A to block 615, and thereafter the flow may continue to block 620. However, if the matrix is not sparse and/or does not have a skewed non-zero distribution, the flow 600 may optionally continue via arrow 612B to another decision block 625.

Decision block 625 includes determining whether the matrix is sparse (as a whole) or if it is very- or hyper-sparse (as a whole). If neither, the flow 600 may terminate (not illustrated). If the matrix is found to be sparse, the flow 600 may continue via arrow 627A to block 630, which includes causing one or more sparse tiles to perform one or more matrix operations for the one or more computational tasks using the "entire" matrix (which may be, for example, only the non-zeros, or could be both the zeros and non-zeros). If, at block 625, it is determined that the matrix as a whole is very-sparse or hyper-sparse, the flow 600 may continue via arrow 627B to block 635, which includes causing one or more very/hyper sparse tiles to perform the one or more matrix operations for the one or more computational tasks using the matrix.

Examples

According to some embodiments, a method in a hardware processor for processing sparse matrix data having a skewed non-zero distribution comprises: determining, by the hardware processor, that one or more computational tasks involving a matrix are to be performed; partitioning, by the hardware processor, the matrix into a first plurality of blocks and a second plurality of blocks, wherein the first plurality of blocks includes one or more sections of the matrix that are sparse, and wherein the second plurality of blocks includes another one or more sections of the matrix that are very- or hyper-sparse; and causing, by the hardware processor, one or more sparse tiles of the hardware processor to perform one or more matrix operations for the one or more computational tasks using the first plurality of blocks and further causing one or more very/hyper sparse tiles of the hardware processor to perform the one or more matrix operations for the one or more computational tasks using the second plurality of blocks.

In some embodiments, the method further comprises determining, by the hardware processor, whether the matrix is sparse and has a skewed non-zero distribution, wherein said partitioning occurs responsive to determining that the matrix is sparse and does have the skewed non-zero distribution. In some embodiments, said partitioning comprises: determining a number of rows or columns of the matrix having only zero values. In some embodiments, said partitioning comprises: determining whether the number satisfies a threshold criteria.

In some embodiments, the method further comprises converting a format of each of the second plurality of blocks into a doubly-compressed format. In some embodiments, said causing the one or more sparse tiles to perform the one or more matrix operations comprises storing the first plurality of blocks in a first memory unit, the first memory unit to stream data of the first plurality of blocks to the one or more sparse tiles over a high-bandwidth interface. In some embodiments, said causing the one or more very/hyper sparse tiles to perform the one or more matrix operations comprises storing the second plurality of blocks in a second memory unit, the second memory unit to provide data of the second plurality of blocks to the one or more very/hyper sparse tiles responsive to random access requests from the one or more very/hyper sparse tiles over a low-latency interface.

According to some embodiments, a hardware processor comprises: one or more sparse tiles comprising a first plurality of processing units to access data from a first memory unit over a high bandwidth interface; one or more very/hyper sparse tiles comprising a second plurality of processing units to randomly access data from a second memory unit over a low-latency interface; and a control unit to: determine that one or more computational tasks involving a matrix are to be performed; partition the matrix into a first plurality of blocks and a second plurality of blocks, wherein the first plurality of blocks includes one or more sections of the matrix that are sparse, and wherein the second plurality of blocks includes another one or more sections of the matrix that are very- or hyper-sparse; and cause the one or more sparse tiles to perform one or more matrix operations for the one or more computational tasks using the first plurality of blocks and further cause the one or more very/hyper sparse tiles to perform the one or more matrix operations for the one or more computational tasks using the second plurality of blocks.

In some embodiments, the control unit is further to determine whether the matrix is sparse and has a skewed non-zero distribution, wherein the control unit is to perform the partition responsive to a determination that the matrix is sparse and does have the skewed non-zero distribution. In some embodiments, to partition the matrix into the first plurality of blocks and the second plurality of blocks, the control unit is to: determine a number of rows or columns of the matrix having only zero values. In some embodiments, to partition the matrix into the first plurality of blocks and the second plurality of blocks, the control unit is further to: determine whether the number satisfies a threshold criteria.

In some embodiments, the control unit is further to convert a format of each of the second plurality of blocks into a doubly-compressed format. In some embodiments, to cause the one or more sparse tiles to perform the one or more matrix operations, the control unit is to cause the first plurality of blocks to be stored in a first memory unit, the first memory unit to stream data of the first plurality of blocks to the one or more sparse tiles over a high-bandwidth interface. In some embodiments, to cause the one or more very/hyper sparse tiles to perform the one or more matrix operations, the control unit is to store the second plurality of blocks in a second memory unit, the second memory unit to provide data of the second plurality of blocks to the one or more very/hyper sparse tiles responsive to random access requests from the one or more very/hyper sparse tiles over a low-latency interface.

According to some embodiments, a system comprises: a first memory unit; a second memory unit; one or more sparse tiles comprising a first plurality of processing units to access data from the first memory unit over a high bandwidth interface; one or more very/hyper sparse tiles comprising a second plurality of processing units to randomly access data from the second memory unit over a low-latency interface; and a control unit to: determine that one or more computational tasks involving a matrix are to be performed; partition the matrix into a first plurality of blocks and a second plurality of blocks, wherein the first plurality of blocks includes one or more sections of the matrix that are sparse, and wherein the second plurality of blocks includes another one or more sections of the matrix that are very- or hyper-sparse; and cause the one or more sparse tiles to perform one or more matrix operations for the one or more computational tasks using the first plurality of blocks and further cause the one or more very/hyper sparse tiles to perform the one or more matrix operations for the one or more computational tasks using the second plurality of blocks.

In some embodiments, the control unit is further to determine whether the matrix is sparse and has a skewed non-zero distribution, wherein the control unit is to perform the partition responsive to a determination that the matrix is sparse and does have the skewed non-zero distribution. In some embodiments, to partition the matrix into the first plurality of blocks and the second plurality of blocks, the control unit is to: determine a number of rows or columns of the matrix having only zero values. In some embodiments, to partition the matrix into the first plurality of blocks and the second plurality of blocks, the control unit is further to: determine whether the number satisfies a threshold criteria.

In some embodiments, the control unit is further to convert a format of each of the second plurality of blocks into a doubly-compressed format. In some embodiments, to cause the one or more sparse tiles to perform the one or more matrix operations, the control unit is to cause the first plurality of blocks to be stored in a first memory unit, the first memory unit to stream data of the first plurality of blocks to the one or more sparse tiles over a high-bandwidth interface. In some embodiments, to cause the one or more very/hyper sparse tiles to perform the one or more matrix operations, the control unit is to store the second plurality of blocks in a second memory unit, the second memory unit to provide data of the second plurality of blocks to the one or more very/hyper sparse tiles responsive to random access requests from the one or more very/hyper sparse tiles over a low-latency interface.

According to some embodiments, a hardware accelerator comprises: a first means comprising a second means to access data from a third means over a high bandwidth interface; a fourth means comprising a fifth means to randomly access data from a sixth means over a low-latency interface; and a seventh means to: determine that one or more computational tasks involving a matrix are to be performed; partition the matrix into a first plurality of blocks and a second plurality of blocks, wherein the first plurality of blocks includes one or more sections of the matrix that are sparse, and wherein the second plurality of blocks includes another one or more sections of the matrix that are very- or hyper-sparse; and cause the first means to perform one or more matrix operations for the one or more computational tasks using the first plurality of blocks and further cause the fourth means to perform the one or more matrix operations for the one or more computational tasks using the second plurality of blocks.

According to some embodiments, a non-transitory machine-readable storage media has instructions which, when executed by one or more processors of device, cause the device to perform operations comprising: determining that one or more computational tasks involving a matrix are to be performed; partitioning the matrix into a first plurality of blocks and a second plurality of blocks, wherein the first plurality of blocks includes one or more sections of the matrix that are sparse, and wherein the second plurality of blocks includes another one or more sections of the matrix that are very- or hyper-sparse; and causing one or more sparse tiles to perform one or more matrix operations for the one or more computational tasks using the first plurality of blocks and further causing one or more very/hyper sparse tiles to perform the one or more matrix operations for the one or more computational tasks using the second plurality of blocks.

According to some embodiments, a device comprises: one or more processors; and a non-transitory machine-readable storage media coupled with the one or more processors and having instructions which, when executed by the one or more processors, cause the device to perform operations comprising: determining that one or more computational tasks involving a matrix are to be performed; partitioning the matrix into a first plurality of blocks and a second plurality of blocks, wherein the first plurality of blocks includes one or more sections of the matrix that are sparse, and wherein the second plurality of blocks includes another one or more sections of the matrix that are very- or hyper-sparse; and causing one or more sparse tiles of a hardware processor to perform one or more matrix operations for the one or more computational tasks using the first plurality of blocks and further causing one or more very/hyper sparse tiles of the hardware processor to perform the one or more matrix operations for the one or more computational tasks using the second plurality of blocks.

Embodiments disclosed herein utilize electronic devices. An electronic device stores and transmits (internally and/or with other electronic devices over a network) code (which is composed of software instructions and which is sometimes referred to as computer program code or a computer program) and/or data using machine-readable media (also called computer-readable media), such as machine-readable storage media (e.g., magnetic disks, optical disks, read only memory (ROM), flash memory devices, phase change memory) and machine-readable transmission media (also called a carrier) (e.g., electrical, optical, radio, acoustical or other form of propagated signals—such as carrier waves, infrared signals). Thus, an electronic device (e.g., a computer) includes hardware and software, such as a set of one or more processors coupled to one or more machine-readable storage media to store code for execution on the set of processors and/or to store data. For instance, an electronic device may include non-volatile memory containing the code since the non-volatile memory can persist code/data even when the electronic device is turned off (when power is removed), and while the electronic device is turned on that part of the code that is to be executed by the processor(s) of that electronic device is typically copied from the slower non-volatile memory into volatile memory (e.g., dynamic random access memory (DRAM), static random access memory (SRAM)) of that electronic device. Typical electronic devices also include a set or one or more physical network interface(s) to establish network connections (to transmit and/or receive code and/or data using propagating signals) with other electronic devices. One or more parts of an embodiment may be implemented using different combinations of software, firmware, and/or hardware.

Exemplary Accelerator Architectures
Overview

In some implementations, an accelerator is coupled to processor cores or other processing elements to accelerate certain types of operations such as graphics operations, machine-learning operations, pattern analysis operations, and (as described in detail below) sparse matrix multiplication operations, to name a few. The accelerator may be communicatively coupled to the processor/cores over a bus or other interconnect (e.g., a point-to-point interconnect) or may be integrated on the same chip as the processor and communicatively coupled to the cores over an internal processor bus/interconnect. Regardless of the manner in which the accelerator is connected, the processor cores may allocate certain processing tasks to the accelerator (e.g., in the form of sequences of instructions or μops) which includes dedicated circuitry/logic for efficiently processing these tasks.

Figure 7:
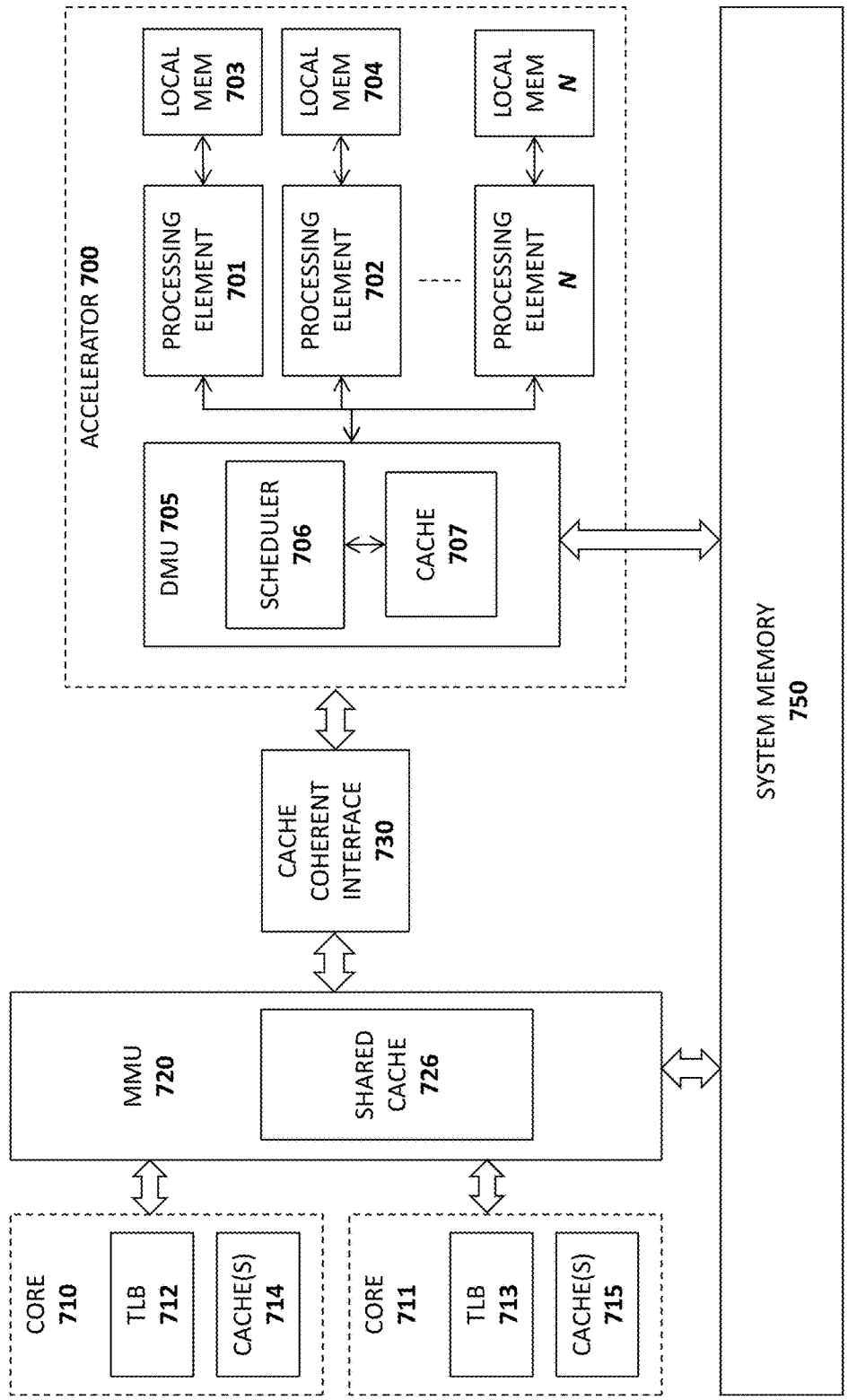
FIG. 7 illustrates an exemplary implementation in which an accelerator is communicatively coupled to a plurality of cores through a cache coherent interface according to some embodiments.

FIG. 7 illustrates an exemplary implementation in which an accelerator 700 is communicatively coupled to a plurality of cores 710-711 through a cache coherent interface 730. Each of the cores 710-711 includes a translation lookaside buffer 712-713 for storing virtual to physical address translations and one or more caches 714-715 (e.g., L1 cache, L2 cache, etc.) for caching data and instructions. A memory management unit 720 manages access by the cores 710-711 to system memory 750 which may be a dynamic random access memory DRAM. A shared cache 726 such as an L3 cache may be shared among the processor cores 710-711 and with the accelerator 700 via the cache coherent interface 730. In one implementation, the cores ATA1010T-1011, MMU 720 and cache coherent interface 730 are integrated on a single processor chip.

The illustrated accelerator 700 includes a data management unit 705 with a cache 707 and scheduler AT006 for scheduling operations to a plurality of processing elements 701-702, N. In the illustrated implementation, each processing element has its own local memory 703-704, N. As described in detail below, each local memory 703-704, N may be implemented as a stacked DRAM.

In one implementation, the cache coherent interface 730 provides cache-coherent connectivity between the cores 710-711 and the accelerator 700, in effect treating the accelerator as a peer of the cores 710-711. For example, the cache coherent interface 730 may implement a cache coherency protocol to ensure that data accessed/modified by the accelerator 700 and stored in the accelerator cache 707 and/or local memories 703-704, N is coherent with the data stored in the core caches 710-711, the shared cache 726 and the system memory 750. For example, the cache coherent interface 730 may participate in the snooping mechanisms used by the cores 710-711 and MMU 720 to detect the state of cache lines within the shared cache 726 and local caches 714-715 and may act as a proxy, providing snoop updates in response to accesses and attempted modifications to cache lines by the processing elements 701-702, N. In addition, when a cache line is modified by the processing elements 701-702, N, the cache coherent interface 730 may update the status of the cache lines if they are stored within the shared cache 726 or local caches 714-715.

In one implementation, the data management unit 1005 includes memory management circuitry providing the accelerator 700 access to system memory 750 and the shared cache 726. In addition, the data management unit 705 may provide updates to the cache coherent interface 730 and receiving updates from the cache coherent interface 730 as needed (e.g., to determine state changes to cache lines). In the illustrated implementation, the data management unit 705 includes a scheduler 706 for scheduling instructions/operations to be executed by the processing elements 701-702, N. To perform its scheduling operations, the scheduler 706 may evaluate dependences between instructions/operations to ensure that instructions/operations are executed in a coherent order (e.g., to ensure that a first instruction executes before a second instruction which is dependent on results from the first instruction). Instructions/operations which are not inter-dependent may be executed in parallel on the processing elements 701-702, N.

Accelerator Architecture for Matrix and Vector Operations

Figure 8:
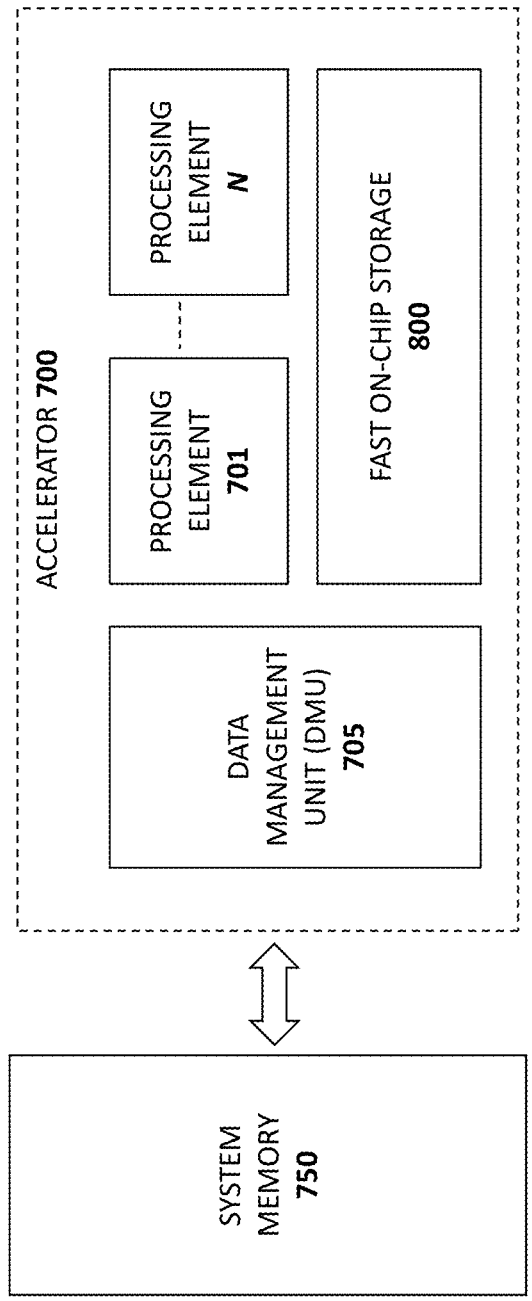
FIG. 8 illustrates another view of an accelerator according to some embodiments.

FIG. 8 illustrates another view of accelerator 700 and other components previously described including a data management unit 705, a plurality of processing elements 701-N, and fast on-chip storage 800 (e.g., implemented using stacked local DRAM in one implementation). In one implementation, the accelerator 700 is a hardware accelerator architecture and the processing elements 701-N include circuitry for performing matrix*vector and vector*vector operations, including operations for sparse/dense matrices. In particular, the processing elements 701-N may include hardware support for column and row-oriented matrix processing and may include microarchitectural support for a "scale and update" operation such as that used in machine learning (ML) algorithms.

The described implementations perform matrix/vector operations which are optimized by keeping frequently used, randomly accessed, potentially sparse (e.g., gather/scatter) vector data in the fast on-chip storage 800 and maintaining large, infrequently used matrix data in off-chip memory (e.g., system memory 750), accessed in a streaming fashion whenever possible, and exposing intra/inter matrix block parallelism to scale up.

Implementations of the processing elements 701-N process different combinations of sparse matrixes, dense matrices, sparse vectors, and dense vectors. As used herein, a "sparse" matrix or vector is a matrix or vector in which most of the elements are zero. By contrast, a "dense" matrix or vector is a matrix or vector in which most of the elements are non-zero. The "sparsity" of a matrix/vector may be defined based on the number of zero-valued elements divided by the total number of elements (e.g., m×n for an m×n matrix). In one implementation, a matrix/vector is considered "sparse" if its sparsity if above a specified threshold.

An exemplary set of operations performed by the processing elements 701-N is illustrated in the table in FIG. 9. In particular, the operation types include a first multiply 900 using a sparse matrix, a second multiply 901 using a dense matrix, a scale and update operation 902m and a dot product operation 903. Columns are provided for a first input operand 910 and a second input operand 911 (each of which may include sparse or dense matrix/vector); an output format 913 (e.g., dense vector or scalar); a matrix data format (e.g., compressed sparse row, compressed sparse column, row-oriented, etc.); and an operation identifier 914.

The runtime-dominating compute patterns found in some current workloads include variations of matrix multiplication against a vector in row-oriented and column-oriented fashion. They work on well-known matrix formats: compressed sparse row (CSR) and compressed sparse column (CSC). FIG. 10a depicts an example of a multiplication between a sparse matrix A against a vector x to produce a vector y. FIG. 10b illustrates the CSR representation of matrix A in which each value is stored as a (value, row index) pair. For example, the (3,2) for row0 indicates that a value of 3 is stored in element position 2 for row 0. FIG. 10c illustrates a CSC representation of matrix A which uses a (value, column index) pair.

FIGS. 11a, 11b, and 11c illustrate pseudo code of each compute pattern, which is described below in detail. In particular, FIG. 11a illustrates a row-oriented sparse matrix dense vector multiply (spMdV_csr); FIG. 11b illustrates a column-oriented sparse matrix sparse vector multiply (spMspC_csc); and FIG. 11c illustrates a scale and update operation (scale_update).

A. Row-Oriented Sparse Matrix Dense Vector Multiplication (spMdV_csr)

This is a well-known compute pattern that is important in many application domains such as high-performance computing. Here, for each row of matrix A, a dot product of that row against vector x is performed, and the result is stored in the y vector element pointed to by the row index. This computation is used in a machine-learning (ML) algorithm that performs analysis across a set of samples (i.e., rows of the matrix). It may be used in techniques such as "mini-batch." There are also cases where ML algorithms perform only a dot product of a sparse vector against a dense vector (i.e., an iteration of the spMdV_csr loop), such as in the stochastic variants of learning algorithms.

A known factor that can affect performance on this computation is the need to randomly access sparse x vector elements in the dot product computation. For a conventional server system, when the x vector is large, this would result in irregular accesses (gather) to memory or last level cache.

To address this, one implementation of a processing element divides matrix A into column blocks and the x vector into multiple subsets (each corresponding to an A matrix column block). The block size can be chosen so that the x vector subset can fit on chip. Hence, random accesses to it can be localized on-chip.

B. Column-Oriented Sparse Matrix Sparse Vector Multiplication (spMspV_csc)

This pattern that multiplies a sparse matrix against a sparse vector is not as well-known as spMdV_csr. However, it is important in some ML algorithms. It is used when an algorithm works on a set of features, which are represented as matrix columns in the dataset (hence, the need for column-oriented matrix accesses).

In this compute pattern, each column of the matrix A is read and multiplied against the corresponding non-zero element of vector x. The result is used to update partial dot products that are kept at the y vector. After all the columns associated with non-zero x vector elements have been processed, the y vector will contain the final dot products.

While accesses to matrix A is regular (i.e., stream in columns of A), the accesses to the y vector to update the partial dot products is irregular. The y element to access depends on the row index of the A vector element being processed. To address this, the matrix A can be divided into row blocks. Consequently, the vector y can be divided into subsets corresponding to these blocks. This way, when processing a matrix row block, it only needs to irregularly access (gather/scatter) its y vector subset. By choosing the block size properly, the y vector subset can be kept on-chip.

C. Scale and Update (scale_update)

This pattern is typically used by ML algorithms to apply scaling factors to each sample in the matrix and reduced them into a set of weights, each corresponding to a feature (i.e., a column in A). Here, the x vector contains the scaling factors. For each row of matrix A (in CSR format), the scaling factors for that row are read from the x vector, and then applied to each element of A in that row. The result is used to update the element of y vector. After all rows have been processed, the y vector contains the reduced weights.

Similar to prior compute patterns, the irregular accesses to the y vector could affect performance when y is large. Dividing matrix A into column blocks and y vector into multiple subsets corresponding to these blocks can help localize the irregular accesses within each y sub set.

One implementation includes a hardware accelerator 1000 that can efficiently perform the compute patterns discussed above. The accelerator 1000 is a hardware IP block that can be integrated with general purpose processors, similar to those found in existing accelerator-based solutions (e.g., IBM® PowerEN, Oracle® M7). In one implementation, the accelerator 700 independently accesses memory 750 through an interconnect shared with the processors to perform the compute patterns. It supports any arbitrarily large matrix datasets that reside in off-chip memory.

Figure 12:
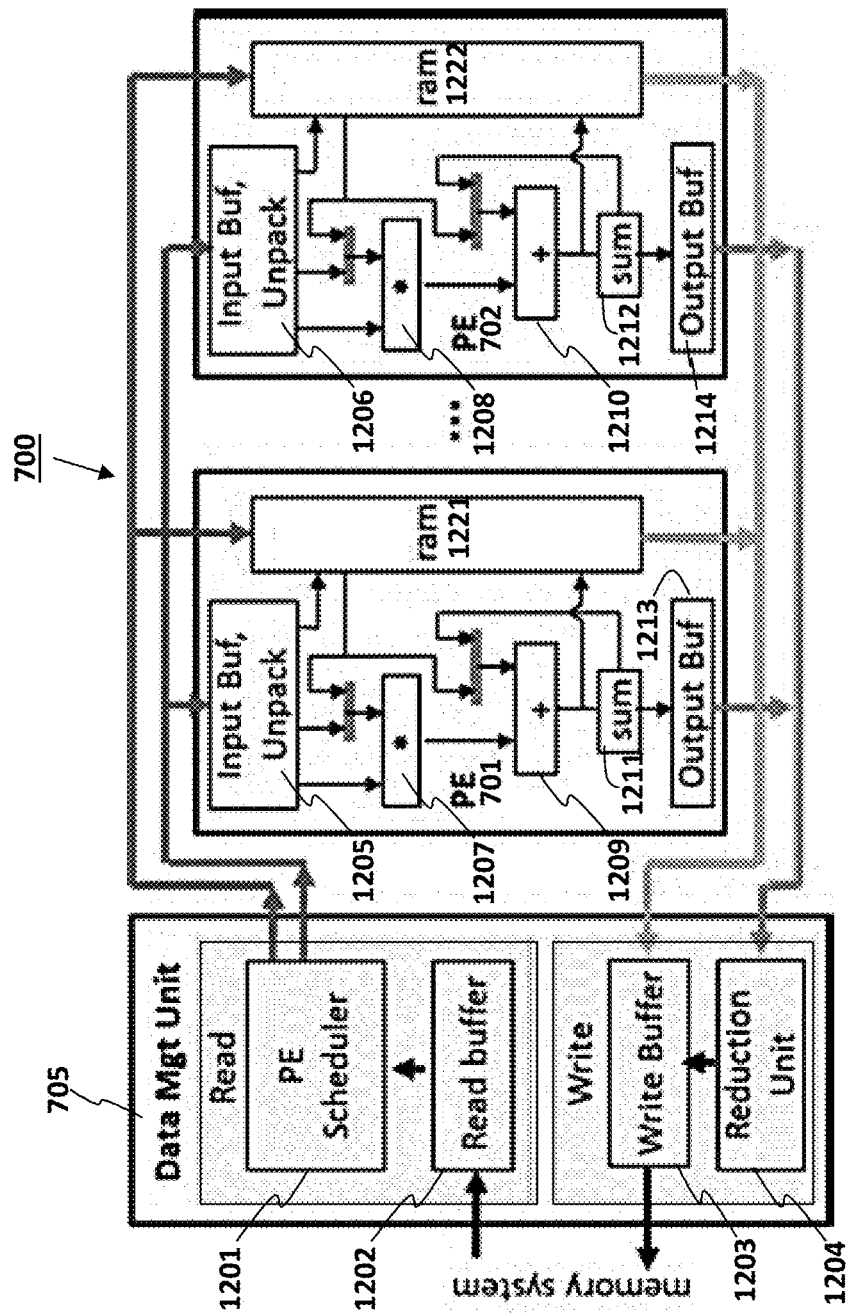
FIG. 12 illustrates the processing flow for one implementation of the data management unit and the processing elements according to some embodiments.

FIG. 12 illustrates the processing flow for one implementation of the data management unit 705 and the processing elements 701-702. In this implementation, the data management unit 705 includes a processing element scheduler 1201, a read buffer 1202, a write buffer 1203 and a reduction unit 1204. Each PE 701-702 includes an input buffer 1205-1206, a multiplier 1207-1208, an adder 1209-1210, a local RAM 1221-1222, a sum register 1211-1212, and an output buffer 1213-1214.

The accelerator supports the matrix blocking schemes discussed above (i.e., row and column blocking) to support any arbitrarily large matrix data. The accelerator is designed to process a block of matrix data. Each block is further divided into sub-blocks which are processed in parallel by the PEs 701-702.

In operation, the data management unit 705 reads the matrix rows or columns from the memory subsystem into its read buffer 1202, which is then dynamically distributed by the PE scheduler 1201 across PEs 701-702 for processing. It also writes results to memory from its write buffer 1203.

Each PE 701-702 is responsible for processing a matrix sub-block. A PE contains an on-chip RAM 1221-1222 to store the vector that needs to be accessed randomly (i.e., a subset of x or y vector, as described above). It also contains a floating point multiply-accumulate (FMA) unit including multiplier 1207-1208 and adder 1209-1210 and unpack logic within input buffers 1205-1206 to extract matrix elements from input data, and a sum register 1211-1212 to keep the accumulated FMA results.

One implementation of the accelerator achieves extreme efficiencies because (1) it places irregularly accessed (gather/scatter) data in on-chip PE RAMs 1221-1222, (2) it utilizes a hardware PE scheduler 1201 to ensure PEs are well utilized, and (3) unlike with general purpose processors, the accelerator consists of only the hardware resources that are essential for sparse matrix operations. Overall, the accelerator efficiently converts the available memory bandwidth provided to it into performance.

Scaling of performance can be done by employing more PEs in an accelerator block to process multiple matrix subblocks in parallel, and/or employing more accelerator blocks (each has a set of PEs) to process multiple matrix blocks in parallel. A combination of these options is considered below. The number of PEs and/or accelerator blocks should be tuned to match the memory bandwidth.

One implementation of the accelerator 700 can be programmed through a software library (similar to Intel® Math Kernel Library). Such library prepares the matrix data in memory, sets control registers in the accelerator 700 with information about the computation (e.g., computation type, memory pointer to matrix data), and starts the accelerator. Then, the accelerator independently accesses matrix data in memory, performs the computation, and writes the results back to memory for the software to consume.

Figure 13B:
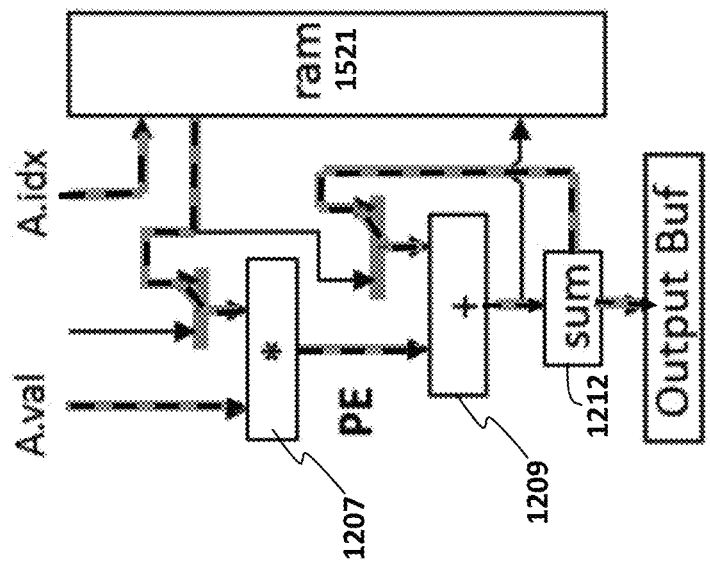
FIG. 13b illustrates paths for a spMdV_csr operation according to some embodiments.
Figure 13A:
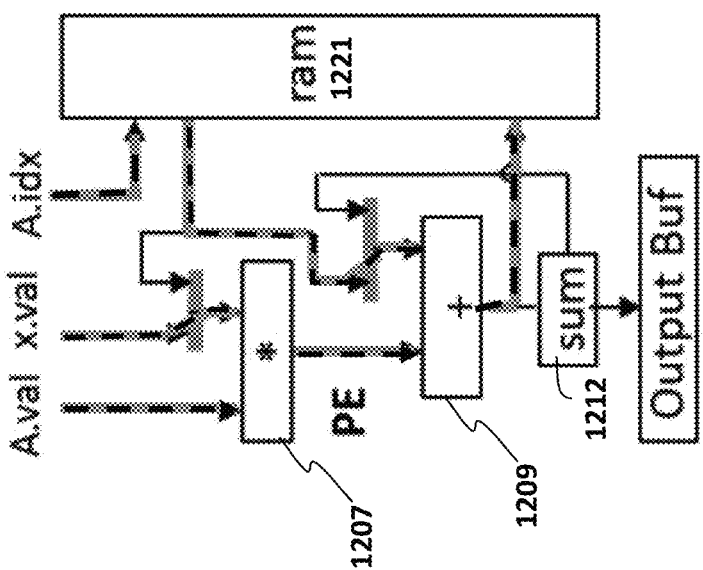
FIG. 13a highlights paths for spMspV_csc and scale_update operations according to some embodiments.

The accelerator handles the different compute patterns by setting its PEs to the proper datapath configuration, as depicted in FIGS. 13a-13b. In particular, FIG. 13a highlights paths (using dotted lines) for spMspV_csc and scale_update operations and FIG. 13b illustrates paths for a spMdV_csr operation. The accelerator operation to perform each compute pattern is detailed below.

For spMspV_csc, the initial y vector subset is loaded in to PE's RAM 1221 by the DMU 705. It then reads x vector elements from memory. For each x element, the DMU 705 streams the elements of the corresponding matrix column from memory and supplies them to the PE 701. Each matrix element contains a value (A.val) and an index (A.idx) which points to they element to read from PE's RAM 1221. The DMU 1005 also provides the x vector element (x.val) that is multiplied against A.val by the multiply-accumulate (FMA) unit. The result is used to update the y element in the PE's RAM pointed to by A.idx. Note that even though not used by our workloads, the accelerator also supports column-wise multiplication against a dense x vector (spMdV_csc) by processing all matrix columns instead of only a subset (since x is dense).

The scale_update operation is similar to the spMspV_csc, except that the DMU 705 reads the rows of an A matrix represented in a CSR format instead of a CSC format. For the spMdV_csr, the x vector subset is loaded in to the PE's RAM 1221. DMU 705 streams in matrix row elements (i.e., {A.val,A.idx} pairs) from memory. A.idx is used to read the appropriate x vector element from RAM 1221, which is multiplied against A.val by the FMA. Results are accumulated into the sum register 1212. The sum register is written to the output buffer each time a PE sees a marker indicating an end of a row, which is supplied by the DMU 705. In this way, each PE produces a sum for the row sub-block it is responsible for. To produce the final sum for the row, the sub-block sums produced by all the PEs are added together by the Reduction Unit 1204 in the DMU (see FIG. 12). The final sums are written to the output buffer 1213-1214, which the DMU 1005 then writes to memory.

Graph Data Processing

In one implementation, the accelerator architectures described herein are configured to process graph data. Graph analytics relies on graph algorithms to extract knowledge about the relationship among data represented as graphs. The proliferation of graph data (from sources such as social media) has led to strong demand for and wide use of graph analytics. As such, being able to do graph analytics as efficient as possible is of critical importance.

To address this need, one implementation automatically maps a user-defined graph algorithm to a hardware accelerator architecture "template" that is customized to the given input graph algorithm. The accelerator may comprise the architectures described above and may be implemented as a FPGA/ASIC, which can execute with extreme efficiency. In summary, one implementation includes:

(1) a hardware accelerator architecture template that is based on a generalized sparse matrix vector multiply (GSPMV) accelerator. It supports arbitrary graph algorithm because it has been shown that graph algorithm can be formulated as matrix operations.

(2) an automatic approach to map and tune a widely-used "vertex centric" graph programming abstraction to the architecture template.

There are existing sparse matrix multiply hardware accelerators, but they do not support customizability to allow mapping of graph algorithms.

One implementation of the design framework operates as follows.

(1) A user specifies a graph algorithm as "vertex programs" following vertex-centric graph programming abstraction. This abstraction is chosen as an example here due to its popularity. A vertex program does not expose hardware details, so users without hardware expertise (e.g., data scientists) can create it.

(2) Along with the graph algorithm in (1), one implementation of the framework accepts the following inputs:

a. The parameters of the target hardware accelerator to be generated (e.g., max amount of on-chip RAMs). These parameters may be provided by a user, or obtained from an existing library of known parameters when targeting an existing system (e.g., a particular FPGA board).

b. Design optimization objectives (e.g., max performance, min area).

c. The properties of the target graph data (e.g., type of graph) or the graph data itself. This is optional, and is used to aid in automatic tuning.

(3) Given above inputs, one implementation of the framework performs auto-tuning to determine the set of customizations to apply to the hardware template to optimize for the input graph algorithm, map these parameters onto the architecture template to produce an accelerator instance in synthesizable RTL, and conduct functional and performance validation of the generated RTL against the functional and performance software models derived from the input graph algorithm specification.

In one implementation, the accelerator architecture described above is extended to support execution of vertex programs by (1) making it a customizable hardware template and (2) supporting the functionalities needed by vertex program. Based on this template, a design framework is described to map a user-supplied vertex program to the hardware template to produce a synthesizable RTL (e.g., Verilog) implementation instance optimized for the vertex program. The framework also performs automatic validation and tuning to ensure the produced RTL is correct and optimized. There are multiple use cases for this framework. For example, the produced synthesizable RTL can be deployed in an FPGA platform (e.g., Xeon-FPGA) to efficiently execute the given vertex program. Or, it can be refined further to produce an ASIC implementation.

It has been shown that graphs can be represented as adjacency matrices, and graph processing can be formulated as sparse matrix operations. FIGS. 14a-14b show an example of representing a graph as an adjacency matrix. Each non-zero in the matrix represents an edge among two nodes in the graph. For example, a 1 in row 0 column 2 represents an edge from node A to C.

One of the most popular models for describing computations on graph data is the vertex programming model. One implementation supports the vertex programming model variant from Graphmat software framework, which formulates vertex programs as generalized sparse matrix vector multiply (GSPMV). As shown in FIG. 14c, a vertex program consists of the types of data associated with edges/vertices in the graph (edata/vdata), messages sent across vertices in the graph (mdata), and temporary data (tdata) (illustrated in the top portion of program code); and stateless user-defined compute functions using pre-defined APIs that read and update the graph data (as illustrated in the bottom portion of program code).

FIG. 14d illustrates exemplary program code for executing a vertex program. Edge data is represented as an adjacency matrix A (as in FIG. 14b), vertex data as vector y, and messages as sparse vector x. FIG. 14e shows the GSPMV formulation, where the multiply( ) and add( ) operations in SPMV is generalized by user-defined PROCESS_MSG( ) and REDUCE( ).

One observation here is that the GSPMV variant needed to execute vertex program performs a column-oriented multiplication of sparse matrix A (i.e., adjacency matrix) against a sparse vector x (i.e., messages) to produce an output vector y (i.e., vertex data). This operation is referred to as col_spMspV (previously described with respect to the above accelerator).

Design Framework.

Figure 15:
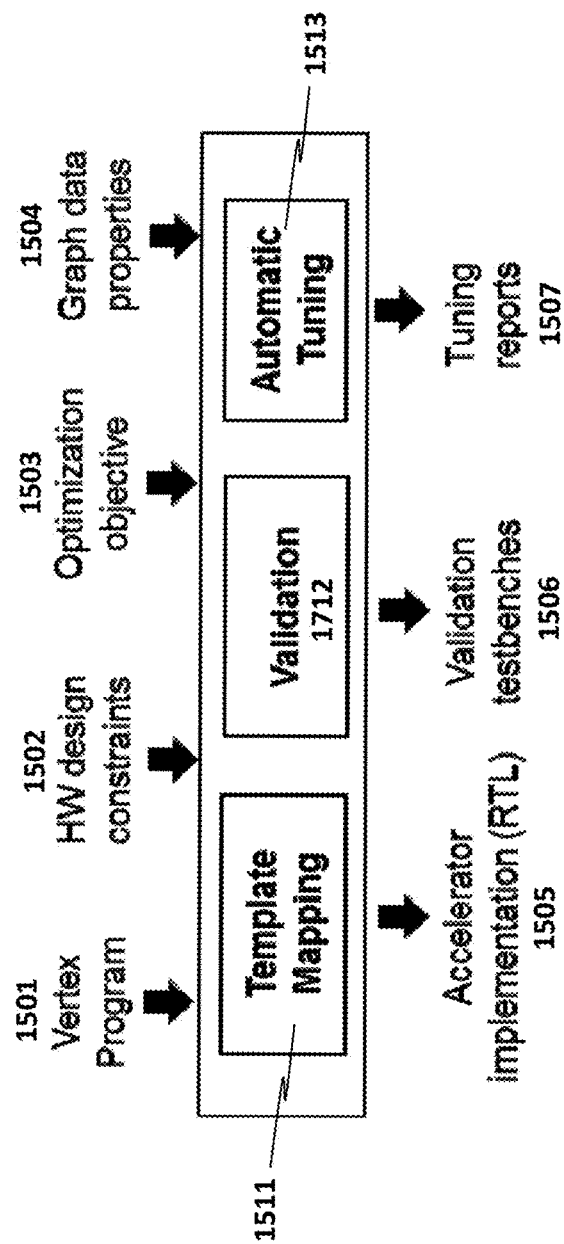
FIG. 15 illustrates one implementation of a design framework for GSPMV according to some embodiments.

One implementation of the framework is shown in FIG. 15 which includes a template mapping component 1511, a validation component 1512 and an automatic tuning component 1513. Its inputs are a user-specified vertex program 1501, design optimization goals 1503 (e.g., max performance, min area), and target hardware design constraints 1502 (e.g., maximum amount of on-chip RAMs, memory interface width). As an optional input to aid automatic-tuning, the framework also accepts graph data properties 1504 (e.g., type=natural graph) or a sample graph data.

Given these inputs, the template mapping component 1511 of the framework maps the input vertex program to a hardware accelerator architecture template, and produces an RTL implementation 1505 of the accelerator instance optimized for executing the vertex program 1501. The automatic tuning component 1513 performs automatic tuning 1513 to optimize the generated RTL for the given design objectives, while meeting the hardware design constraints. Furthermore, the validation component 1512 automatically validates the generated RTL against functional and performance models derived from the inputs. Validation test benches 1506 and tuning reports 1507 are produced along with the RTL.

Figure 16:
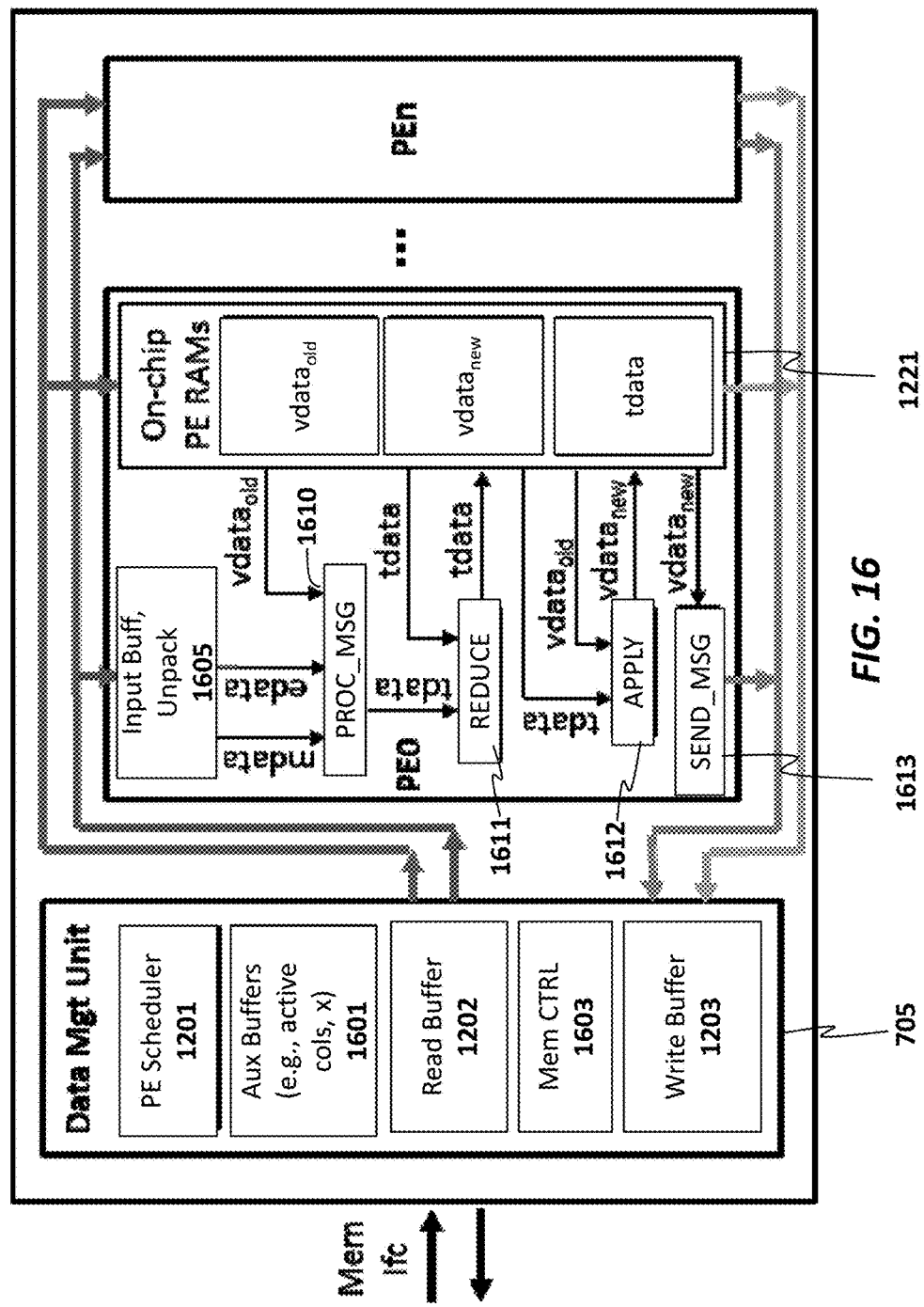
FIG. 16 shows one implementation of an architecture template for GSPMV according to some embodiments.

Generalized Sparse Matrix Vector Multiply (GSPMV) Hardware Architecture Template One implementation of an architecture template for GSPMV is shown in FIG. 16, which is based on the accelerator architecture described above (see, e.g., FIG. 12 and associated text). Many of the components illustrated in FIG. 16 are customizable (as highlighted with grey lines). In one implementation, the architecture to support execution of vertex programs has been extended as follows.

As illustrated in FIG. 16, customizable logic blocks are provided inside each PE to support PROCESS_MSG( ) 1910, REDUCE( ) 1611, APPLY 1612, and SEND_MSG( ) 1613 needed by the vertex program. In addition, one implementation provides customizable on-chip storage structures and pack/unpack logic 1605 to support user-defined graph data (i.e., vdata, edata, mdata, tdata). The data management unit 705 illustrated in FIG. 16 includes a PE scheduler 1201 (for scheduling PEs as described above), aux buffers 1601 for storing active column, x data), a read buffer 1202, a memory controller 1603 for controlling access to system memory, and a write buffer 1204. In addition, in the implementation shown in FIG. 16 old and new vdata and tdata is stored within the local PE memory 1221. Various control state machines may be modified to support executing vertex programs, abiding to the functionalities specified by the algorithms in FIGS. 14d and 14e.

Figure 17:
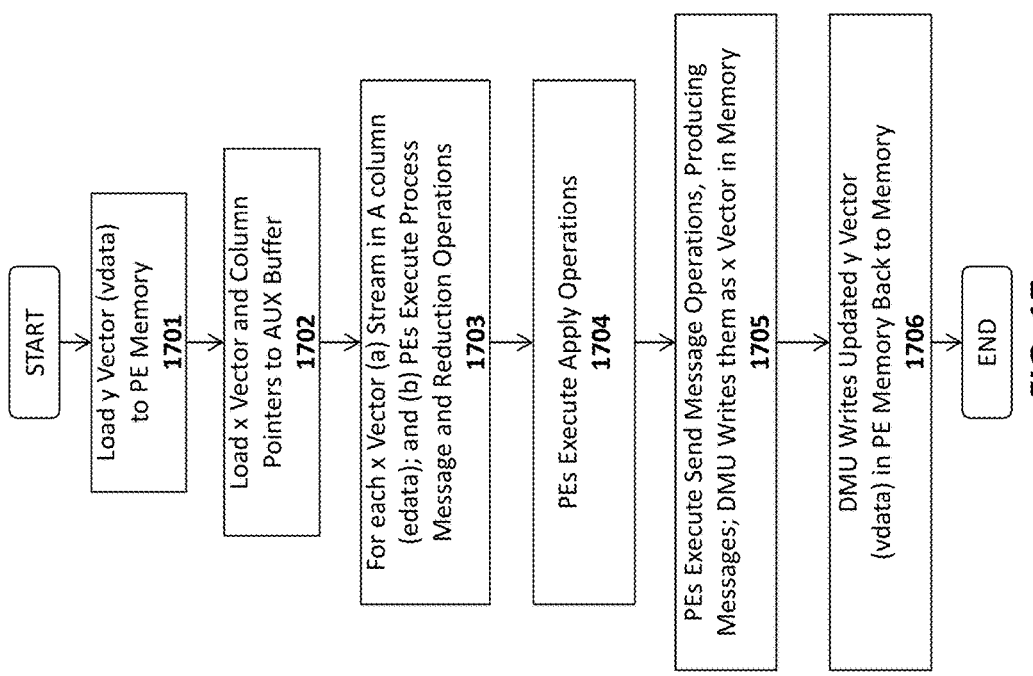
FIG. 17 illustrates a summarization of the operation of each accelerator tile according to some embodiments.

The operation of each accelerator tile is summarized in FIG. 17. At 1701, the y vector (vdata) is loaded to the PE RAM 1221. At 1702, the x vector and column pointers are loaded to the aux buffer 1601. At 1703, for each x vector element, the A column is streamed in (edata) and the PEs execute PROC_MSG( ) 1610 and REDUCE( ) 1611. At 1704, the PEs execute APPLY( ) 1612. At 1705, the PEs execute SEND_MSG( ) 1613, producing messages, and the data management unit 705 writes them as x vectors in memory. At 1706, the data management unit 705 writes the updated y vectors (vdata) stored in the PE RAMs 1221 back to memory. The above techniques conform to the vertex program execution algorithm shown in FIGS. 14d and 14e. To scale up performance, the architecture allows increasing the number of PEs in a tile and/or the number of tiles in the design. This way, the architecture can take advantage of multiple levels of parallelisms in the graph (i.e., across subgraphs (across blocks of adjacency matrix) or within each subgraph). The Table in FIG. 18a summarizes the customizable parameters of one implementation of the template. It is also possible to assign asymmetric parameters across tiles for optimization (e.g., one tile with more PEs than another tile).

Automatic Mapping, Validation, and Tuning

Tuning.

Based on the inputs, one implementation of the framework performs automatic tuning to determine the best design parameters to use to customize the hardware architecture template in order to optimize it for the input vertex program and (optionally) graph data. There are many tuning considerations, which are summarized in the table in FIG. 18b. As illustrated, these include locality of data, graph data sizes, graph compute functions, graph data structure, graph data access attributes, graph data types, and graph data patterns.

Template Mapping.

In this phase, the framework takes the template parameters determined by the tuning phase, and produces an accelerator instance by "filling" in the customizable portions of the template. The user-defined compute functions (e.g., FIG. 14c) may be mapped from the input specification to the appropriate PE compute blocks using existing High-Level Synthesis (HLS) tools. The storage structures (e.g., RAMs, buffers, cache) and memory interfaces are instantiated using their corresponding design parameters. The pack/unpack logic may automatically be generated from the data type specifications (e.g., FIG. 14a). Parts of the control finite state machines (FSMs) are also generated based on the provided design parameters (e.g., PE scheduling schemes).

Validation.

In one implementation, the accelerator architecture instance (synthesizable RTL) produced by the template mapping is then automatically validated. To do this, one implementation of the framework derives a functional model of the vertex program to be used as the "golden" reference. Test benches are generated to compare the execution of this golden reference against simulations of the RTL implementation of the architecture instance. The framework also performs performance validation by comparing RTL simulations against analytical performance model and cycle-accurate software simulator. It reports runtime breakdown and pinpoint the bottlenecks of the design that affect performance.

Accelerator Architecture for Processing Sparse Data

Introduction

Computations on sparse datasets—vectors or matrices most of whose values are zero—are critical to an increasing number of commercially-important applications, but typically achieve only a few percent of peak performance when run on today's CPUs. In the scientific computing arena, sparse-matrix computations have been key kernels of linear solvers for decades. More recently, the explosive growth of machine learning and graph analytics has moved sparse computations into the mainstream. Sparse-matrix computations are central to many machine-learning applications and form the core of many graph algorithms.

Sparse-matrix computations tend to be memory bandwidth-limited rather than compute-limited, making it difficult for CPU changes to improve their performance. They execute few operations per matrix data element and often iterate over an entire matrix before re-using any data, making caches ineffective. In addition, many sparse-matrix algorithms contain significant numbers of data-dependent gathers and scatters, such as the result[row]+=matrix[row][i].value*vector[matrix[row][i].index] operation found in sparse matrix-vector multiplication, which are hard to predict and reduce the effectiveness of prefetchers.

To deliver better sparse-matrix performance than conventional microprocessors, a system must provide significantly higher memory bandwidth than current CPUs and a very energy-efficient computing architecture. Increasing memory bandwidth makes it possible to improve performance, but the high energy/bit cost of DRAM accesses limits the amount of power available to process that bandwidth. Without an energy-efficient compute architecture, a system might find itself in the position of being unable to process the data from a high-bandwidth memory system without exceeding its power budget.

One implementation comprises an accelerator for sparse-matrix computations which uses stacked DRAM to provide the bandwidth that sparse-matrix algorithms require combined with a custom compute architecture to process that bandwidth in an energy-efficient manner.

Sparse-Matrix Overview

Many applications create data sets where the vast majority of the values are zero. Finite-element methods model objects as a mesh of points where the state of each point is a function of the state of the points near it in the mesh. Mathematically, this becomes a system of equations that is represented as a matrix where each row describes the state of one point and the values in the row are zero for all of the points that do not directly affect the state of the point the row describes. Graphs can be represented as an adjacency matrix, where each element $\{i,j\}$ in the matrix gives the weight of the edge between vertices i and j in the graph. Since most vertexes connect to only a small fraction of the other vertices in the graph, the vast majority of the elements in the adjacency matrix are zeros. In machine learning, models are typically trained using datasets that consist of many samples, each of which contains a set of features (observations of the state of a system or object) and the desired output of the model for that set of features. It is very common for most of the samples to only contain a small subset of the possible features, for example when the features represent different words that might be present in a document, again creating a dataset where most of the values are zero.

Datasets where most of the values are zero are described as "sparse," and it is very common for sparse datasets to be extremely sparse, having non-zero values in less than 1% of their elements. These datasets are often represented as matrices, using data structures that only specify the values of the non-zero elements in the matrix. While this increases the amount of space required to represent each non-zero element, since it is necessary to specify both the element's location and its value, the overall space (memory) savings can be substantial if the matrix is sparse enough. For example, one of the most straightforward representations of a sparse matrix is the coordinate list (COO) representation, in which each non-zero is specified by a {row index, column index, value} tuple. While this triples the amount of storage required for each non-zero value, if only 1% of the elements in a matrix have non-zero values, the COO representation will take up only 3% of the space that a dense representation (one that represents the value of each element in the matrix) would take.

Figure 19:
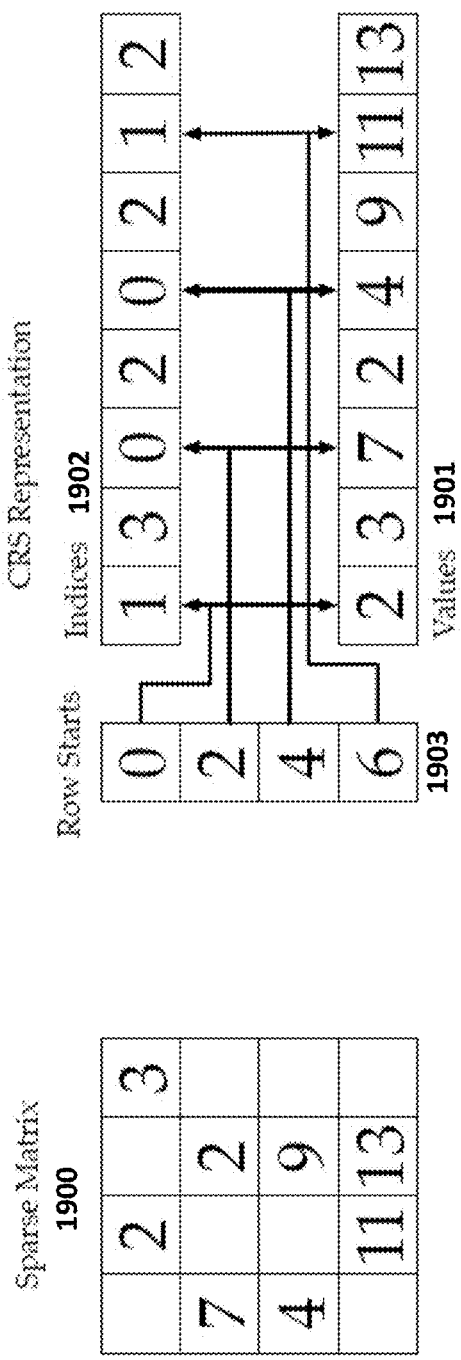
FIG. 19 illustrates the compressed row storage sparse-matrix format according to some embodiments.

FIG. 19 illustrates one of the most common sparse-matrix formats, the compressed row storage (CRS, sometimes abbreviated CSR) format. In CRS format, the matrix 1900 is described by three arrays: a values array 1901, which contains the values of the non-zero elements, an indices array 1902, which specifies the position of each non-zero element within its row of the matrix, and a row starts array 1903, which specifies where each row of the matrix starts in the lists of indices and values. Thus, the first non-zero element of the second row of the example matrix can be found at position 2 in the indices and values arrays, and is described by the tuple {0, 7}, indicating that the element occurs at position 0 within the row and has value 7. Other commonly-used sparse-matrix formats include compressed sparse column (CSC), which is the column-major dual to CRS, and ELLPACK, which represents each row of the matrix as a fixed-width list of non-zero values and their indices, padding with explicit zeros when a row has fewer non-zero elements than the longest row in the matrix.

Computations on sparse matrices have the same structure as their dense-matrix counterparts, but the nature of sparse data tends to make them much more bandwidth-intensive than their dense-matrix counterparts. For example, both the sparse and dense variants of matrix-matrix multiplication find C=A·B by computing $C_{i,j}=A_i·B_{,j}$ for all i, j. In a dense matrix-matrix computation, this leads to substantial data re-use, because each element of A participates in N multiply-add operations (assuming N×N matrices), as does each element of B. As long as the matrix-matrix multiplication is blocked for cache locality, this re-use causes the computation to have a low bytes/op ratio and to be compute-limited. However, in the sparse variant, each element of A only participates in as many multiply-add operations as there are non-zero values in the corresponding row of B, while each element of B only participates in as many multiply-adds as there are non-zero elements in the corresponding column of A. As the sparseness of the matrices increases, so does the bytes/op ratio, making the performance of many sparse matrix-matrix computations limited by memory bandwidth in spite of the fact that dense matrix-matrix multiplication is one of the canonical compute-bound computations.

Four operations make up the bulk of the sparse-matrix computations seen in today's applications: sparse matrix-dense vector multiplication (SpMV), sparse matrix-sparse vector multiplication, sparse matrix-sparse matrix multiplication, and relaxation/smoother operations, such as the Gauss-Seidel smoother used in Intel's implementation of the High-Performance Conjugate Gradient benchmark. These operations share two characteristics that make a sparse-matrix accelerator practical. First, they are dominated by vector dot-products, which makes it possible to implement simple hardware that can implement all four important computations. For example, a matrix-vector multiplication is performed by taking the dot-product of each row in the matrix with the vector, while a matrix-matrix multiplication takes the dot-product of each row of one matrix with each column of the other. Second, applications generally perform multiple computations on the same matrix, such as the thousands of multi-plications of the same matrix by different vectors that a support vector machine algorithm performs with training a model. This repeated use of the same matrix makes it practical to transfer matrices to/from an accelerator during program execution and/or to re-format the matrix in a way that simplifies the hardware's task, since the cost of data transfers/transformations can be amortized across many operations on each matrix.

Figure 20:
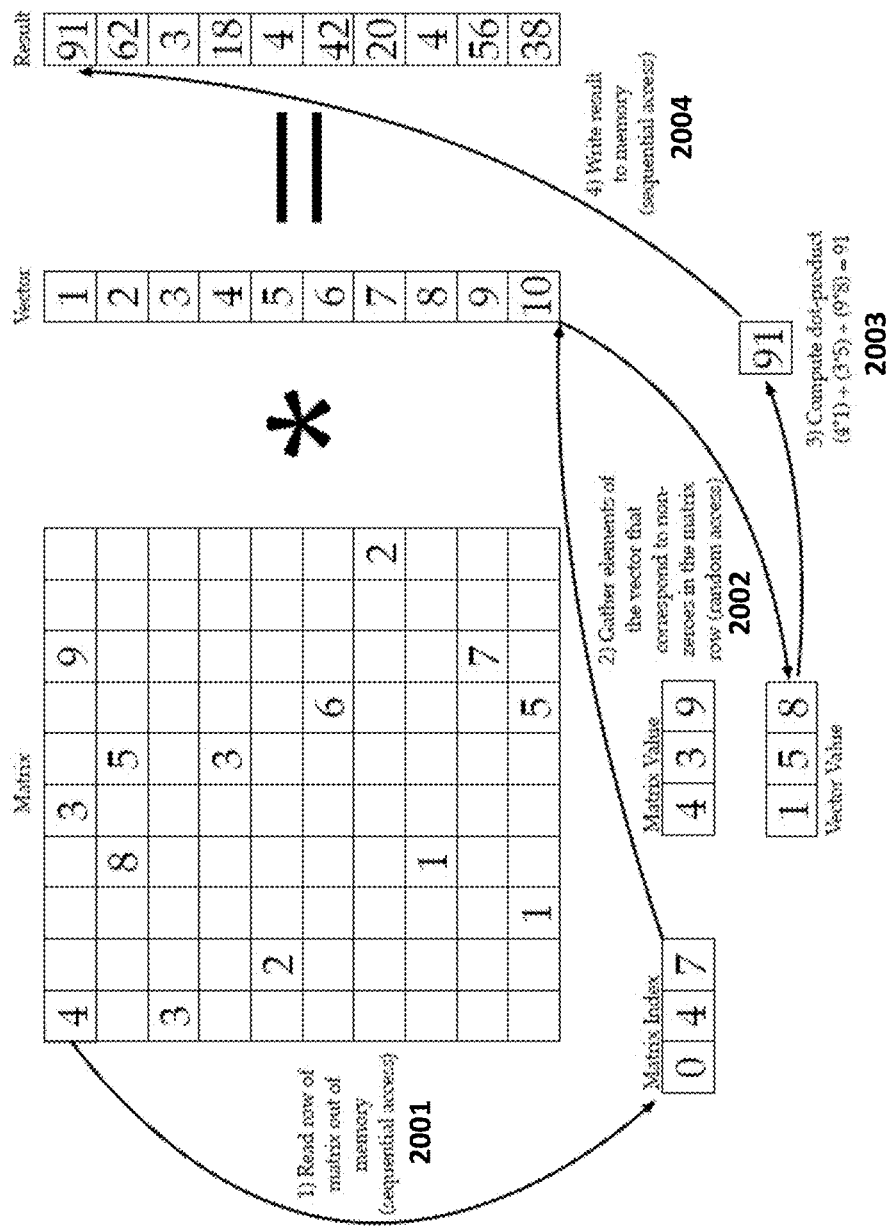
FIG. 20 shows exemplary steps involved in an implementation of sparse matrix-dense vector multiplication using the CRS data format according to some embodiments.

Sparse-matrix computations typically achieve only a few percent of the peak performance of the system they run on. To demonstrate why this occurs, FIG. 20 shows the steps 2001-2004 involved in an implementation of sparse matrix-dense vector multiplication using the CRS data format. First, at 2001, the data structure that represents a row of the matrix is read out of memory, which usually involves a set of sequential reads that are easy to predict and prefetch. Second, at 2002, the indices of the non-zero elements in the matrix row are used to gather the corresponding elements of the vector, which requires a number of data-dependent, hard-to-predict memory accesses (a gather operation). Moreover, these memory accesses often touch only one or two words in each referenced cache line, resulting in significant wasted bandwidth when the vector does not fit in the cache.

Third, at 2003, the processor computes the dot-product of the non-zero elements of the matrix row and the corresponding elements of the vector. Finally, at 2004, the result of the dot-product is written into the result vector, which is also accessed sequentially, and the program proceeds to the next row of the matrix. Note that this is a conceptual/algorithmic view of the computation, and the exact sequence of operations the program executes will depend on the processor's ISA and vector width.

This example illustrates a number of important characteristics of sparse-matrix computations. Assuming 32-bit data types and that neither the matrix nor the vector fit in the cache, computing the first element of the output row requires reading 36 bytes from DRAM, but only five compute instructions (three multiplies and two adds), for a bytes/op ratio of 7.2:1.

Memory bandwidth is not the only challenge to high-performance sparse-matrix computations, however. As FIG. 20 shows, the accesses to the vector in SpMV are data-dependent and hard to predict, exposing the latency of vector accesses to the application. If the vector does not fit in the cache, SpMV performance becomes sensitive to DRAM latency as well as bandwidth unless the processor provides enough parallelism to saturate the DRAM bandwidth even when many threads are stalled waiting for data.

Thus, an architecture for sparse-matrix computations must provide several things to be effective. It must deliver high memory bandwidth to meet the bytes/op needs of sparse computations. It must also support high-bandwidth gathers out of large vectors that may not fit in the cache. Finally, while performing enough arithmetic operations/second to keep up with DRAM bandwidth is not a challenge in and of itself, the architecture must perform those operations and all of the memory accesses they require in an energy-efficient manner in order to remain within system power budgets.

Implementations

Figure 21:
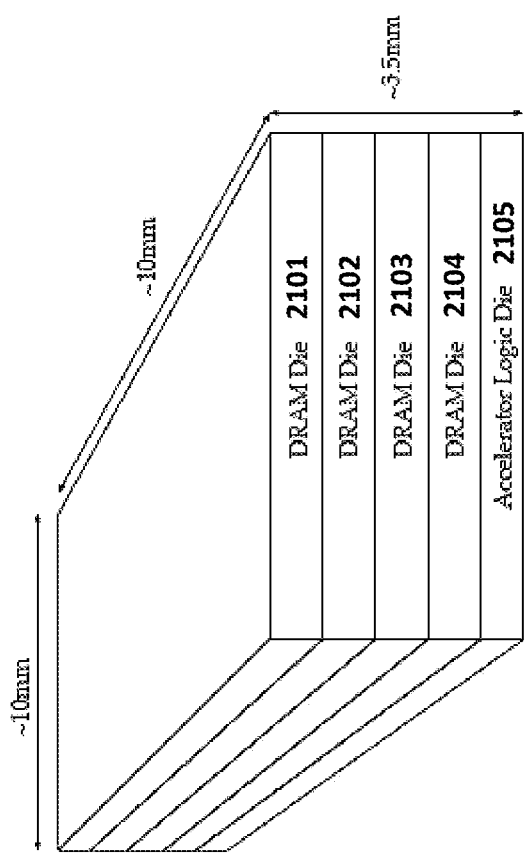
FIG. 21 illustrates one implementation of an accelerator includes an accelerator logic die and one of more stacks of DRAM die according to some embodiments.

One implementation comprises an accelerator designed to provide the three features necessary for high sparse-matrix performance: high memory bandwidth, high-bandwidth gathers out of large vectors, and energy-efficient computation. As illustrated in FIG. 21, one implementation of the accelerator includes an accelerator logic die 2105 and one of more stacks 2101-2104 of DRAM die. Stacked DRAM, which is described in more detail below, provides high memory bandwidth at low energy/bit. For example, stacked DRAMs are expected to deliver 256-512 GB/sec at 2.5 pJ/bit, while LPDDR4 DIMMs are only expected to deliver 68 GB/sec and will have an energy cost of 12 pJ/bit.

The accelerator logic chip 2105 at the bottom of the accelerator stack is customized to the needs of sparse-matrix computations, and is able to consume the bandwidth offered by a DRAM stack 2101-2104 while only expending 2-4 Watts of power, with energy consumption proportional to the bandwidth of the stack. To be conservative, a stack bandwidth of 273 GB/sec is assumed (the expected bandwidth of WIO3 stacks) for the remainder of this application. Designs based on higher-bandwidth stacks would incorporate more parallelism in order to consume the memory bandwidth.

Figure 22:
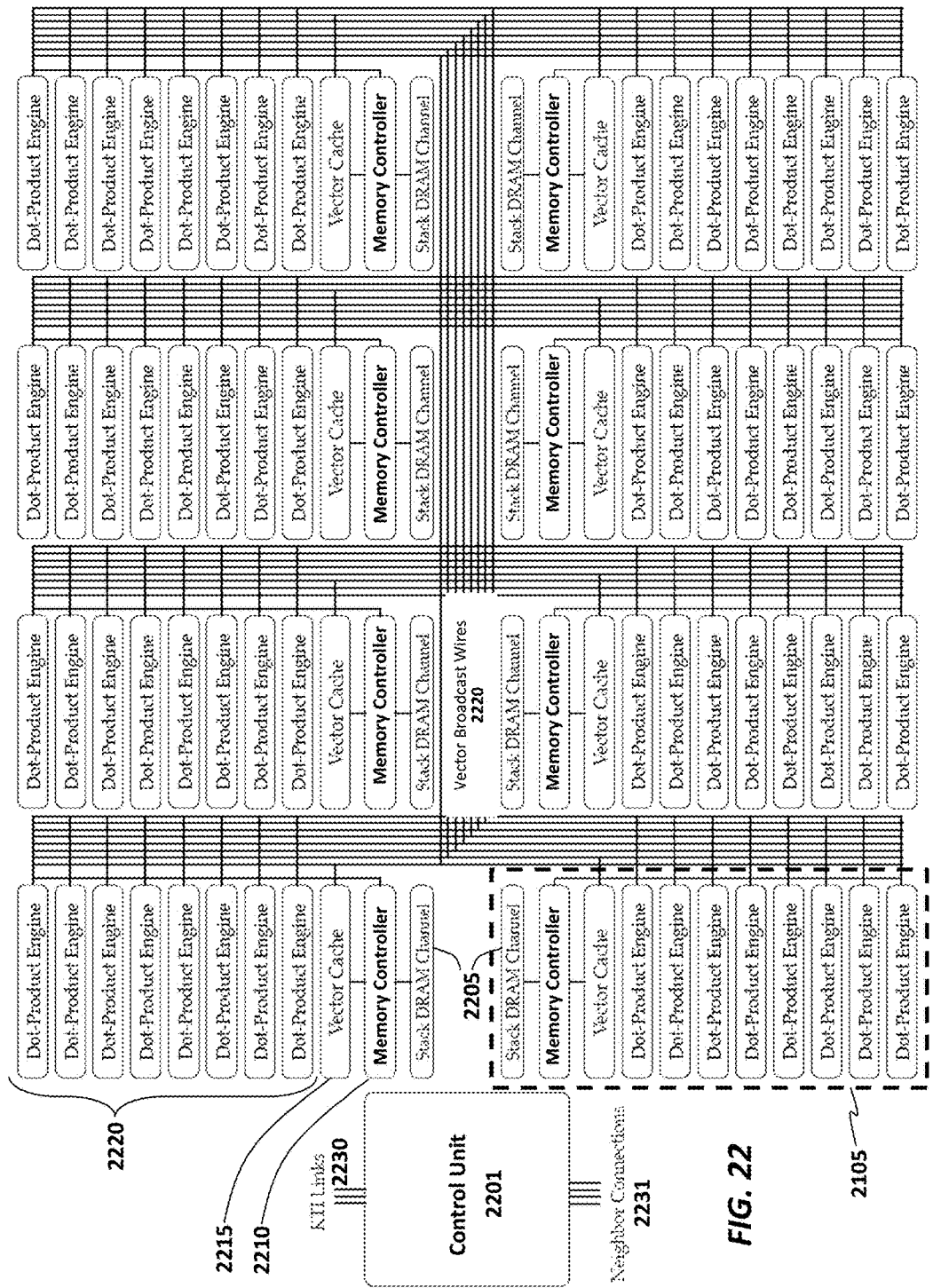
FIG. 22 illustrates one implementation of the accelerator logic chip, oriented from a top perspective through the stack of DRAM die according to some embodiments.

FIG. 22 illustrates one implementation of the accelerator logic chip 2105, oriented from a top perspective through the stack of DRAM die 2101-2104. The stack DRAM channel blocks 2205 towards the center of the diagram represent the through-silicon vias that connect the logic chip 2105 to the DRAMs 2101-2104, while the memory controller blocks 1210 contain the logic that generates the control signals for the DRAM channels. While eight DRAM channels 2205 are shown in the figure, the actual number of channels implemented on an accelerator chip will vary depending on the stacked DRAMs used. Most of the stack DRAM technologies being developed provide either four or eight channels.

Figure 23:
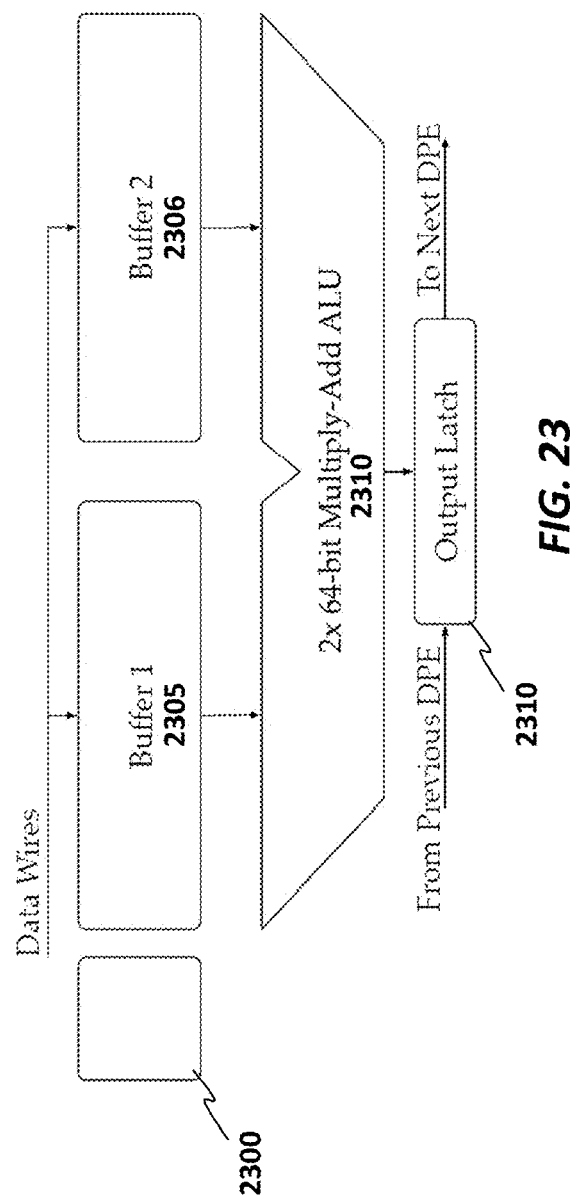
FIG. 23 provides a high-level overview of a dot-product engine (DPE) which contains two buffers, two 64-bit multiply-add arithmetic logic units (ALUs), and control logic according to some embodiments.

The dot-product engines (DPEs) 2220 are the computing elements of the architecture. In the particular implementation shown in FIG. 22, each set of eight DPEs is associated with a vector cache 2215. FIG. 23 provides a high-level overview of a DPE which contains two buffers 2305-2306, two 64-bit multiply-add ALUs 2310, and control logic 2300. During computations, the chip control unit 2300 streams chunks of the data being processed into the buffer memories 2305-2306. Once each buffer is full, the DPE's control logic sequences through the buffers, computing the dot-products of the vectors they contain and writing the results out to the DPE's result latch 2310, which is connected in a daisy-chain with the result latches of the other DPE's to write the result of a computation back to the stack DRAM 2101-2104.

In one implementation, the accelerator logic chip 2405 operates at approximately 1 GHz and 0.65V to minimize power consumption (although the particular operating frequency and voltage may be modified for different applications). Analysis based on 14 nm design studies shows that 32-64 KB buffers meet this frequency spec at that voltage, although strong ECC may be required to prevent soft errors. The multiply-add unit may be operated at half of the base clock rate in order to meet timing with a 0.65V supply voltage and shallow pipeline. Having two ALUs provides a throughput of one double-precision multiply-add/cycle per DPE.

At 273 GB/second and a clock rate of 1.066 MHz, the DRAM stack 2101-2104 delivers 256 bytes of data per logic chip clock cycle. Assuming that array indices and values are at least 32-bit quantities, this translates to 32 sparse-matrix elements per cycle (4 bytes of index+4 bytes of value=8 bytes/element), requiring that the chip perform 32 multiply-adds per cycle to keep up. (This is for matrix-vector multiplication and assumes a high hit rate in the vector cache so that 100% of the stack DRAM bandwidth is used to fetch the matrix.) The 64 DPEs shown in FIG. 22 provide 2-4× the required compute throughput, allowing the chip to process data at the peak stack DRAM bandwidth even if the ALUs 2310 are not used 100% of the time.

In one implementation, the vector caches 2215 cache elements of the vector in a matrix-vector multiplication. This significantly increases the efficiency of the matrix-blocking scheme described below. In one implementation, each vector cache block contains 32-64 KB of cache, for a total capacity of 256-512 KB in an eight-channel architecture.

The chip control unit 2201 manages the flow of a computation and handles communication with the other stacks in an accelerator and with other sockets in the system. To reduce complexity and power consumption, the dot-product engines never request data from memory. Instead, the chip control unit 2201 manages the memory system, initiating transfers that push the appropriate blocks of data to each of the DPEs.

In one implementation, the stacks in a multi-stack accelerator communicate with each other via a network of KTI links 2230 that is implemented using the neighbor connections 2231 shown in the figure. The chip also provides three additional KTI links that are used to communicate with the other socket(s) in a multi-socket system. In a multi-stack accelerator, only one of the stacks' off-package KTI links 2230 will be active. KTI transactions that target memory on the other stacks will be routed to the appropriate stack over the on-package KTI network.

Implementing Sparse-Matrix Operations

In this section, we describe the techniques and hardware required to implement sparse matrix-dense vector and sparse matrix-sparse vector multiplication on one implementation of the accelerator. This design is also extended to support matrix-matrix multiplication, relaxation operations, and other important functions to create an accelerator that supports all of the key sparse-matrix operations.

While sparse-sparse and sparse-dense matrix-vector multiplications execute the same basic algorithm (taking the dot product of each row in the matrix and the vector), there are significant differences in how this algorithm is implemented when the vector is sparse as compared to when it is dense, which are summarized in Table 1 below.

TABLE 1

|  | Sparse-Sparse SpMV | Sparse-Dense SpMV |
| --- | --- | --- |
| Size of Vector | Typically Small | Often large (5-10% of matrix size) |
| Location of Vector Elements | Unpredictable | Determined by Index |
| Number of operations per matrix element | Unpredictable | Fixed |

In a sparse matrix-dense vector multiplication, the size of the vector is fixed and equal to the number of columns in the matrix. Since many of the matrices found in scientific computations average approximately 10 non-zero elements per row, it is not uncommon for the vector in a sparse matrix-dense vector multiplication to take up 5-10% as much space as the matrix itself. Sparse vectors, on the other hand, are often fairly short, containing similar numbers of non-zero values to the rows of the matrix, which makes them much easier to cache in on-chip memory.

In a sparse matrix-dense vector multiplication the location of each element in the vector is determined by its index, making it feasible to gather the vector elements that correspond to the non-zero values in a region of the matrix and to pre-compute the set of vector elements that need to be gathered for any dense vector that the matrix will be multiplied by. The location of each element in a sparse vector, however is unpredictable and depends on the distribution of non-zero elements in the vector. This makes it necessary to examine the non-zero elements of the sparse vector and of the matrix to determine which non-zeros in the matrix correspond to non-zero values in the vector.

It is helpful to compare the indices of the non-zero elements in the matrix and the vector because the number of instructions/operations required to compute a sparse matrix-sparse vector dot-product is unpredictable and depends on the structure of the matrix and vector. For example, consider taking the dot-product of a matrix row with a single non-zero element and a vector with many non-zero elements. If the row's non-zero has a lower index than any of the non-zeros in the vector, the dot-product only requires one index comparison. If the row's non-zero has a higher index than any of the non-zeros in the vector, computing the dot-product requires comparing the index of the row's non-zero with every index in the vector. This assumes a linear search through the vector, which is common practice. Other searches, such as binary search, would be faster in the worst case, but would add significant overhead in the common case where the non-zeros in the row and the vector overlap. In contrast, the number of operations required to perform a sparse matrix-dense vector multiplication is fixed and determined by the number of non-zero values in the matrix, making it easy to predict the amount of time required for the computation.

Figure 24:
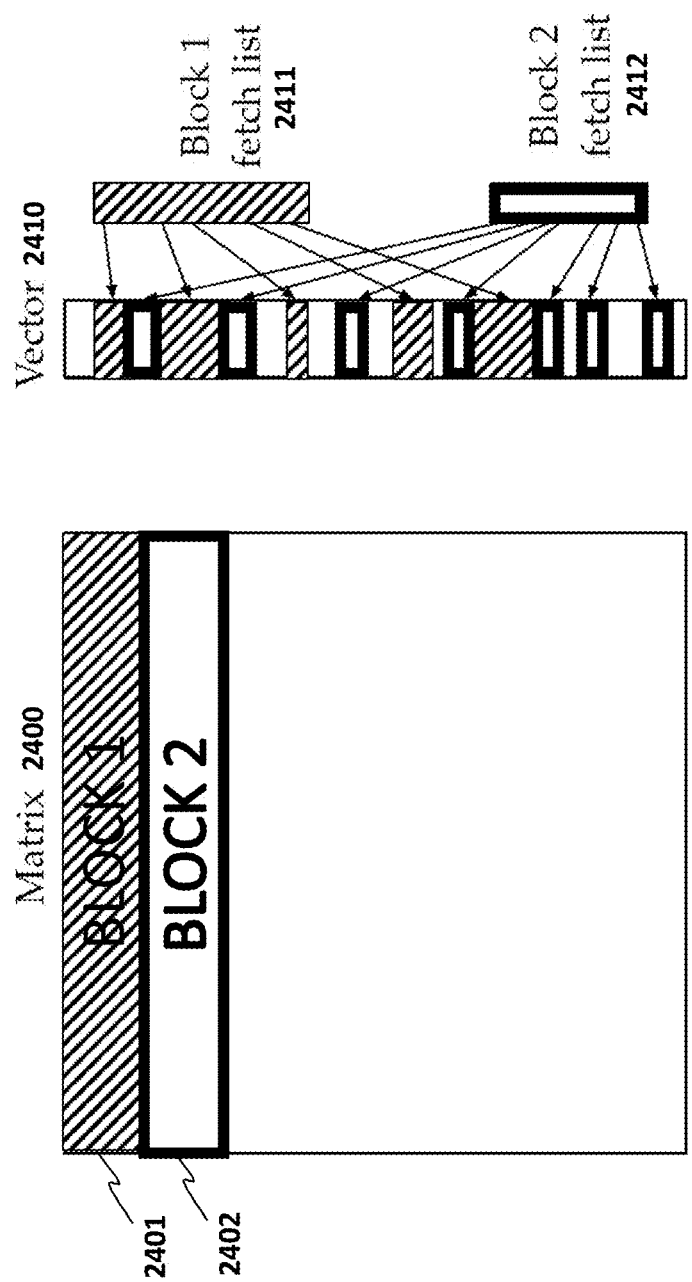
FIG. 24 illustrates a blocking scheme for large sparse-matrix computations according to some embodiments.

Because of these differences, one implementation of the accelerator uses the same high-level algorithm to implement sparse matrix-dense vector and sparse matrix-sparse vector multiplication, with differences in how the vector is distributed across the dot-product engines and how the dot-product is computed. Because the accelerator is intended for large sparse-matrix computations, it cannot be assumed that either the matrix or the vector will fit in on-chip memory. Instead, one implementation uses the blocking scheme outlined in FIG. 24.

In particular, in this implementation, the accelerator will divide matrices into fixed-size blocks of data 2401-2402, sized to fit in the on-chip memory, and will multiply the rows in the block by the vector to generate a chunk of the output vector before proceeding to the next block. This approach poses two challenges. First, the number of non-zeros in each row of a sparse matrix varies widely between datasets, from as low as one to as high as 46,000 in the datasets studied. This makes it impractical to assign one or even a fixed number of rows to each dot-product engine. Therefore, one implementation assigns fixed-size chunks of matrix data to each dot product engine and handles the case where a chunk contains multiple matrix rows and the case where a single row is split across multiple chunks.

The second challenge is that fetching the entire vector from stack DRAM for each block of the matrix has the potential to waste significant amounts of bandwidth (i.e., fetching vector elements for which there is no corresponding non-zero in the block). This is particularly an issue for sparse matrix-dense vector multiplication, where the vector can be a significant fraction of the size of the sparse matrix. To address this, one implementation constructs a fetch list 2411-2412 for each block 2401-2402 in the matrix, which lists the set of vector 2410 elements that correspond to non-zero values in the block, and only fetch those elements when processing the block. While the fetch lists must also be fetched from stack DRAM, it has been determined that the fetch list for most blocks will be a small fraction of the size of the block. Techniques such as run-length encoding may also be used to reduce the size of the fetch list.

Thus, a matrix-vector multiplication on Accelerator will involve the following sequence of operations:

1. Fetch a block of matrix data from the DRAM stack and distribute it across the dot-product engines;
2. Generate fetch list based on non-zero elements in the matrix data;
3. Fetch each vector element in the fetch list from stack DRAM and distribute it to the dot-product engines;
4. Compute the dot-product of the rows in the block with the vector and write the results out to stack DRAM; and
5. In parallel with the computation, fetch the next block of matrix data and repeat until the entire matrix has been processed.

When an accelerator contains multiple stacks, "partitions" of the matrix may be statically assigned to the different stacks and then the blocking algorithm may be executed in parallel on each partition. This blocking and broadcast scheme has the advantage that all of the memory references originate from a central control unit, which greatly simplifies the design of the on-chip network, since the network does not have to route unpredictable requests and replies between the dot product engines and the memory controllers. It also saves energy by only issuing one memory request for each vector element that a given block needs, as opposed to having individual dot product engines issue memory requests for the vector elements that they require to perform their portion of the computation. Finally, fetching vector elements out of an organized list of indices makes it easy to schedule the memory requests that those fetches require in a way that maximizes page hits in the stacked DRAM and thus bandwidth usage.

Implementing Sparse Matrix-Dense Vector Multiplication

One challenge in implementing sparse matrix-dense vector multiplication on the accelerator implementations described herein is matching the vector elements being streamed from memory to the indices of the matrix elements in each dot-product engine's buffers. In one implementation, 256 bytes (32-64 elements) of the vector arrive at the dot-product engine per cycle, and each vector element could correspond to any of the non-zeros in the dot-product engine's matrix buffer since fixed-size blocks of matrix data were fetched into each dot-product engine's matrix buffer.

Performing that many comparisons each cycle would be prohibitively expensive in area and power. Instead, one implementation takes advantage of the fact that many sparse-matrix applications repeatedly multiply the same matrix by either the same or different vectors and pre-compute the elements of the fetch list that each dot-product engine will need to process its chunk of the matrix, using the format shown in FIG. 25. In the baseline CRS format, a matrix is described by an array of indices 2502 that define the position of each non-zero value within its row, an array containing the values of each non-zero 2503, and an array 2501 that indicates where each row starts in the index and values arrays. To that, one implementation adds an array of block descriptors 2505 that identify which bursts of vector data each dot-product engine needs to capture in order to perform its fraction of the overall computation.

Figure 25:
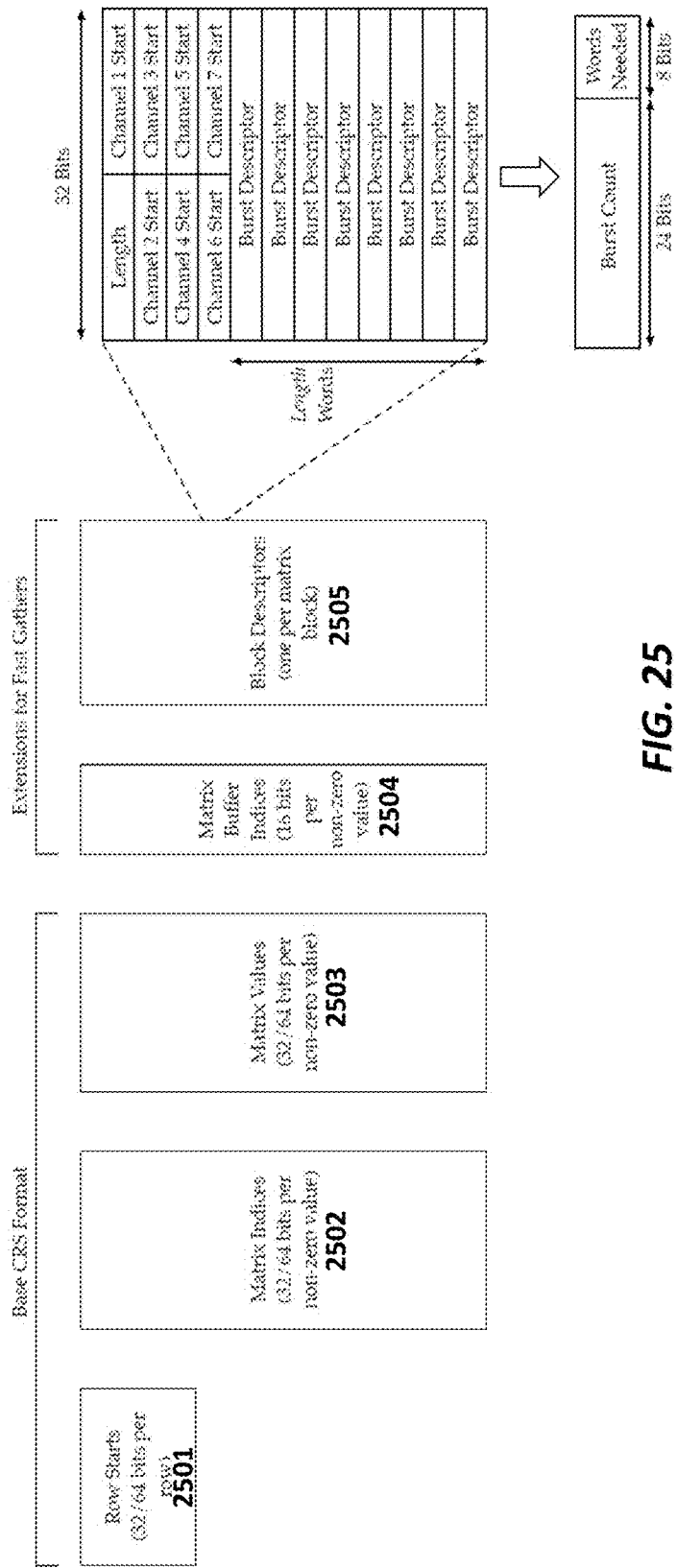
FIG. 25 illustrates a format of block descriptors according to some embodiments.

As shown in FIG. 25, each block descriptor consists of eight 16-bit values and a list of burst descriptors. The first 16-bit value tells the hardware how many burst descriptors are in the block descriptor, while the remaining seven identify the start points within the burst descriptor list for all of the stack DRAM data channels except the first. The number of these values will change depending on the number of data channels the stacked DRAM provides. Each burst descriptor contains a 24-bit burst count that tells the hardware which burst of data it needs to pay attention to and a "Words Needed" bit-vector that identifies the words within the burst that contain values the dot-processing engine needs.

The other data structure included in one implementation is an array of matrix buffer indices (MBIs) 2504, one MBI per non-zero in the matrix. Each MBI gives the position at which the dense vector element that corresponds to the non-zero will be stored in the relevant dot-product engine's vector value buffer (see, e.g., FIG. 27). When performing a sparse matrix-dense vector multiplication, the matrix buffer indices, rather than the original matrix indices, are loaded into the dot-product engine's matrix index buffer 2504, and serve as the address used to look up the corresponding vector value when computing the dot product.

Figure 26:
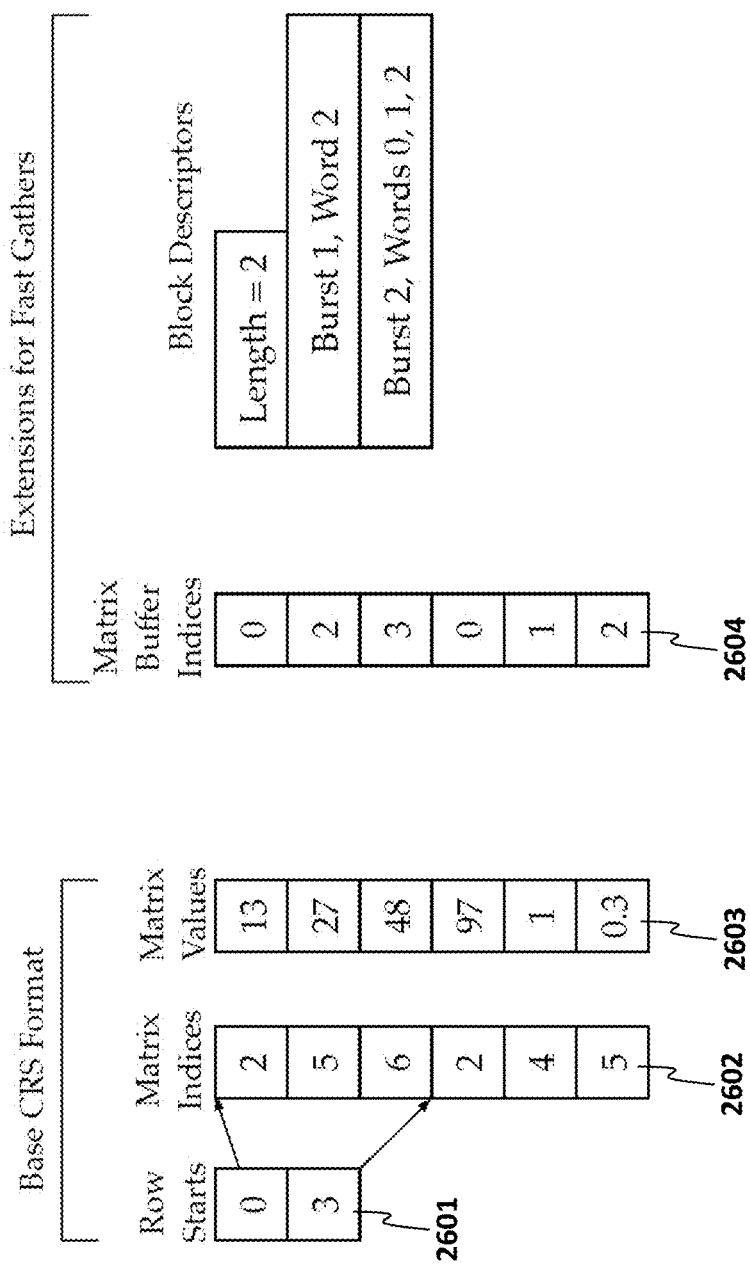
FIG. 26 illustrates the use of block descriptors for a two-row matrix that fits within the buffers of a single dot-product engine, on a system with only one stacked dynamic random access memory (DRAM) data channel and four-word data bursts, according to some embodiments.

FIG. 26 illustrates how this works for a two-row matrix that fits within the buffers of a single dot-product engine, on a system with only one stacked DRAM data channel and four-word data bursts. The original CRS representation including row start values 2601, matrix indices 2602 and matrix values 2603 are shown on the left of the figure. Since the two rows have non-zero elements in columns {2, 5, 6} and {2, 4, 5}, elements 2, 4, 5, and 6 of the vector are required to compute the dot-products. The block descriptors reflect this, indicating that word 2 of the first four-word burst (element 2 of the vector) and words 0, 1, and 2 of the second four-word burst (elements 4-6 of the vector) are required. Since element 2 of the vector is the first word of the vector that the dot-product engine needs, it will go in location 0 in the vector value buffer. Element 4 of the vector will go in location 1, and so on.

The matrix buffer index array data 2604 holds the location within the vector value buffer where the hardware will find the value that corresponds to the non-zero in the matrix. Since the first entry in the matrix indices array has value "2", the first entry in the matrix buffer indices array gets the value "0", corresponding to the location where element 2 of the vector will be stored in the vector value buffer. Similarly, wherever a "4" appears in the matrix indices array, a "1" will appear in the matrix buffer indices, each "5" in the matrix indices array will have a corresponding "2" in the matrix buffer indices, and each "6" in the matrix indices array will correspond to a "3" in the matrix buffer indices.

One implementation of the invention performs the pre-computations required to support fast gathers out of dense vectors when a matrix is loaded onto the accelerator, taking advantage of the fact that the total bandwidth of a multi-stack accelerator is much greater than the bandwidth of the KTI links used to transfer data from the CPU to the accelerator. This pre-computed information increases the amount of memory required to hold a matrix by up to 75%, depending on how often multiple copies of the same matrix index occur within the chunk of the matrix mapped onto a dot-product engine. However, because the 16-bit matrix buffer indices array is fetched instead of the matrix indices array when a matrix-vector multiplication is performed, the amount of data fetched out of the stack DRAMs will often be less than in the original CRS representation, particularly for matrices that use 64-bit indices.

Figure 27:
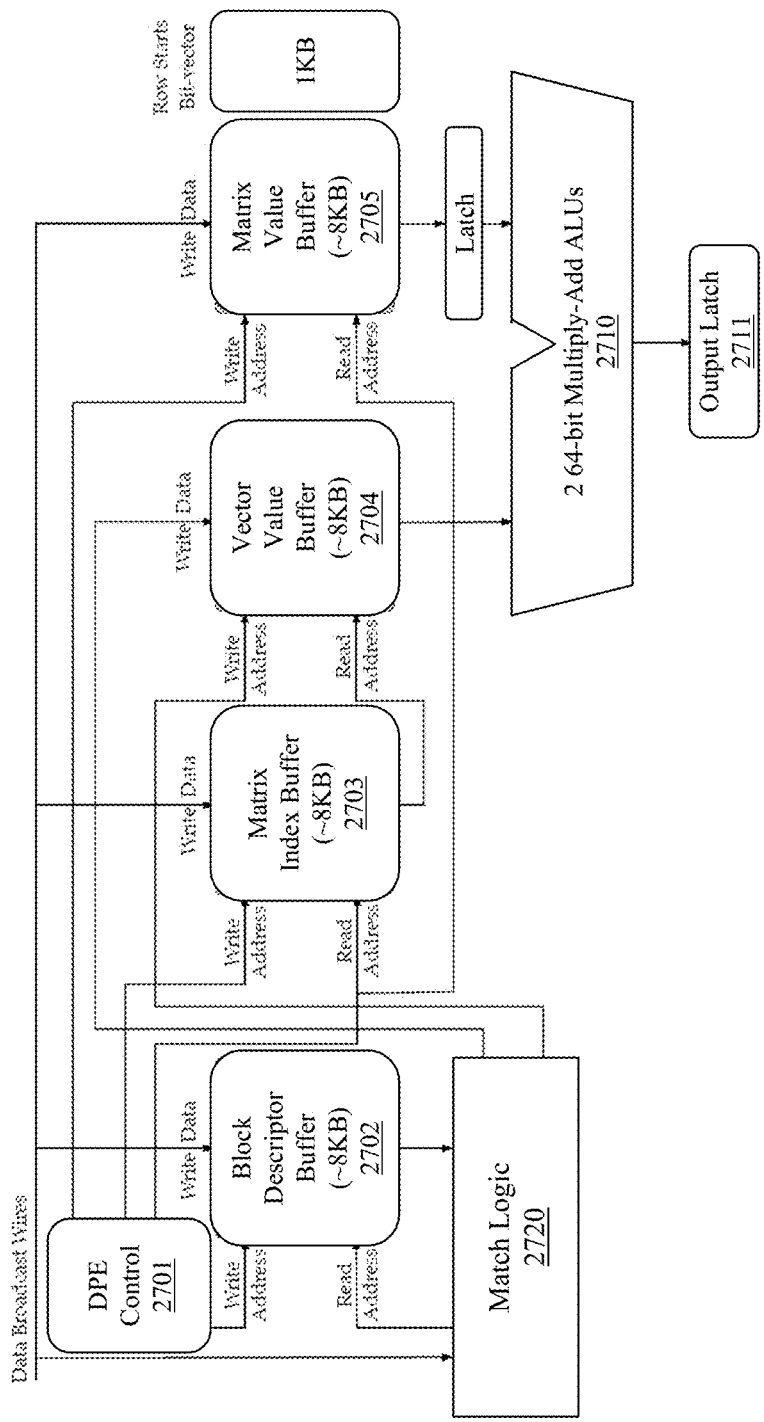
FIG. 27 illustrates one implementation of the hardware in a dot-product engine according to some embodiments.

FIG. 27 illustrates one implementation of the hardware in a dot-product engine that uses this format. To perform a matrix-vector multiplication, the chunks of the matrix that make up a block are copied into the matrix index buffer 3003 and matrix value buffer 3005 (copying the matrix buffer indices instead of the original matrix indices), and the relevant block descriptor is copied into the block descriptor buffer 3002. Then, the fetch list is used to load the required elements from the dense vector and broadcast them to the dot-product engines. Each dot-product engine counts the number of bursts of vector data that go by on each data channel. When the count on a given data channel matches the value specified in a burst descriptor, the match logic 3020 captures the specified words and stores them in its vector value buffer 3004.

Figure 28:
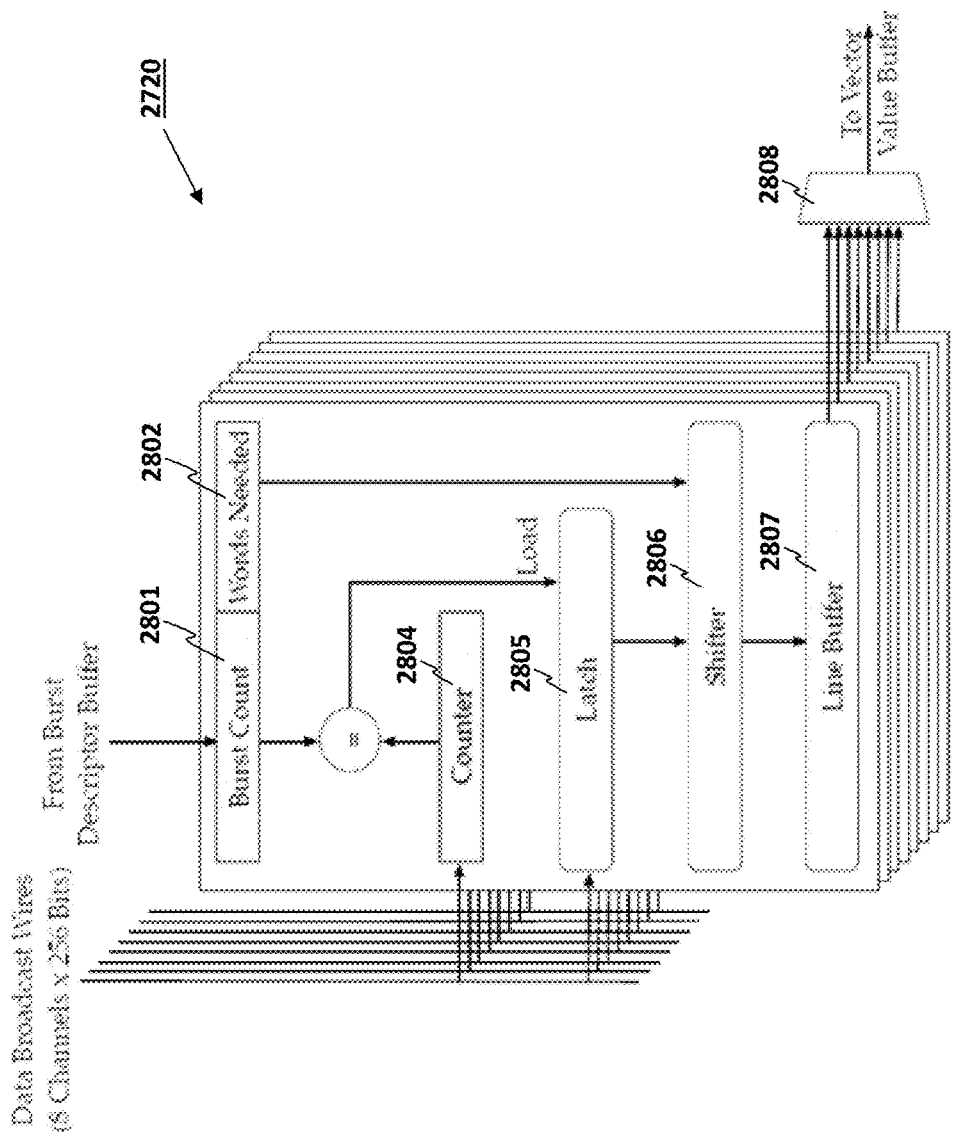
FIG. 28 illustrates the contents of the match logic 3020 unit that does capturing according to some embodiments.

FIG. 28 shows the contents of the match logic 3020 unit that does this capturing. A latch 3105 captures the value on the data channel's wires when the counter matches the value in the burst descriptor. A shifter 3106 extracts the required words 3102 out of the burst 3101 and routes them to the right location in a line buffer 3107 whose size matches the rows in the vector value buffer. A load signal is generated when the burst count 3101 is equal to an internal counter 3104. When the line buffer fills up, it is stored in the vector value buffer 3004 (through mux 3108). Assembling the words from multiple bursts into lines in this way reduces the number of writes/cycle that the vector value buffer needs to support, reducing its size.

Once all of the required elements of the vector have been captured in the vector value buffer, the dot-product engine computes the required dot-product(s) using the ALUs 3010. The control logic 3001 steps through the matrix index buffer 3003 and matrix value buffer 3004 in sequence, one element per cycle. The output of the matrix index buffer 3003 is used as the read address for the vector value buffer 3004 on the next cycle, while the output of the matrix value buffer 3004 is latched so that it reaches the ALUs 3010 at the same time as the corresponding value from the vector value buffer 3004. For example, using the matrix from FIG. 26, on the first cycle of the dot-product computation, the hardware would read the matrix buffer index "0" out of the matrix index buffer 3003 along with the value "13" from the matrix value buffer 3005. On the second cycle, the value "0" from the matrix index buffer 3003 acts as the address for the vector value buffer 3004, fetching the value of vector element "2", which is then multiplied by "13" on cycle 3.

The values in the row starts bit-vector 2901 tell the hardware when a row of the matrix ends and a new one begins. When the hardware reaches the end of the row, it places the accumulated dot-product for the row in its output latch 3011 and begins accumulating the dot-product for the next row. The dot-product latches of each dot-product engine are connected in a daisy chain that assembles the output vector for writeback.

Implementing Sparse Matrix-Sparse Vector Multiplication

In sparse matrix-sparse vector multiplication, the vector tends to take up much less memory than in sparse matrix-dense vector multiplication, but, because it is sparse, it is not possible to directly fetch the vector element that corresponds to a given index. Instead, the vector must be searched, making it impractical to route only the elements that each dot-product engine needs to the dot-product engine and making the amount of time required to compute the dot-products of the matrix data assigned to each dot-product engine unpredictable. Because of this, the fetch list for a sparse matrix-sparse vector multiplication merely specifies the index of the lowest and highest non-zero elements in the matrix block and all of the non-zero elements of the vector between those points must be broadcast to the dot-product engines.

Figure 29:
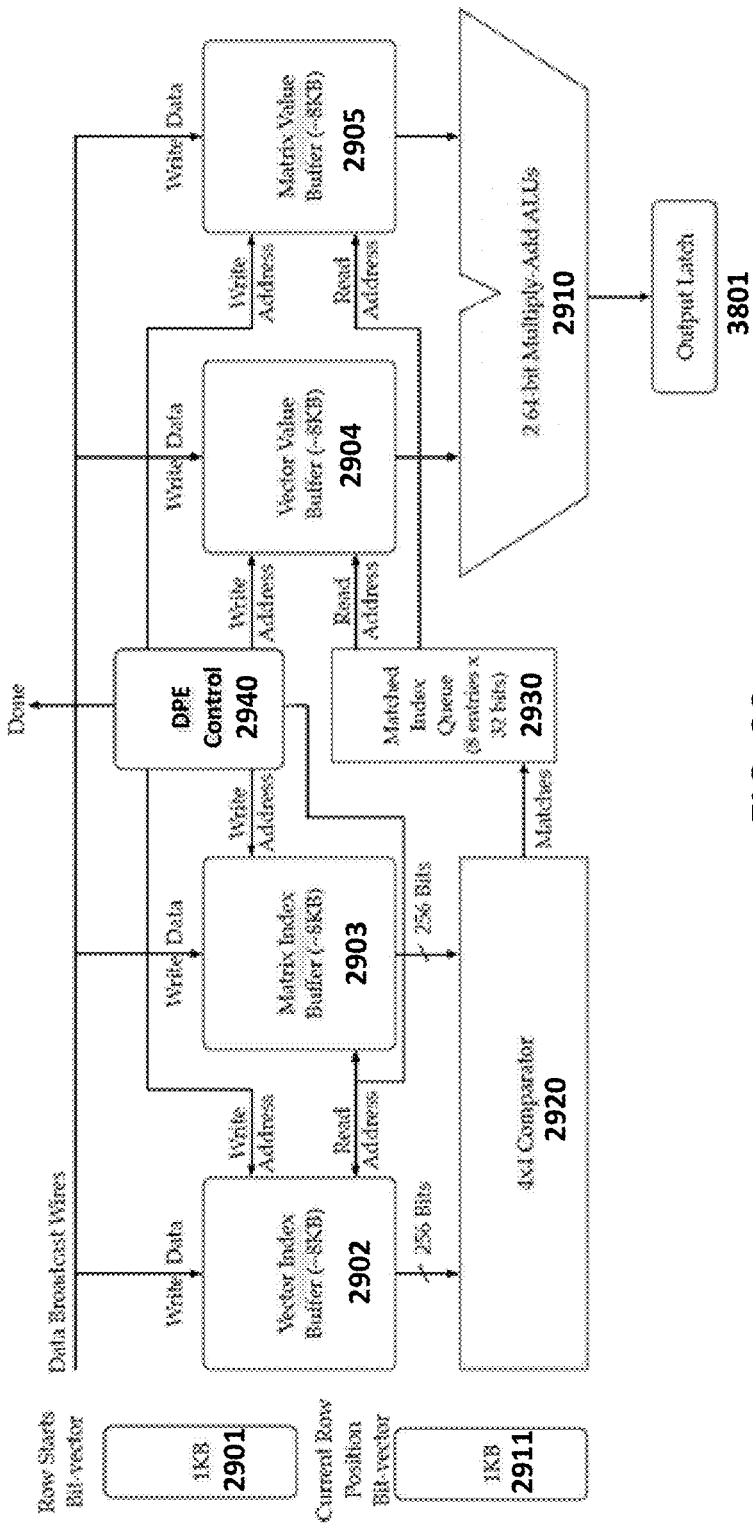
FIG. 29 illustrates the details of a dot-product engine design to support sparse matrix-sparse vector multiplication according to some embodiments.

FIG. 29 shows the details of a dot-product engine design to support sparse matrix-sparse vector multiplication. To process a block of matrix data, the indices (not the matrix buffer indices used in a sparse-dense multiplication) and values of the dot-product engine's chunk of the matrix are written into the matrix index and value buffers, as are the indices and values of the region of the vector required to process the block. The dot-product engine control logic 2940 then sequences through the index buffers 2902-2903, which output blocks of four indices to the 4×4 comparator 2920. The 4×4 comparator 2920 compares each of the indices from the vector 2902 to each of the indices from the matrix 2903, and outputs the buffer addresses of any matches into the matched index queue 2930. The outputs of the matched index queue 2930 drive the read address inputs of the matrix value buffer 2905 and vector value buffer 2904, which output the values corresponding to the matches into the multiply-add ALU 2910. This hardware allows the dot-product engine to consume at least four and as many as eight indices per cycle as long as the matched index queue 2930 has empty space, reducing the amount of time required to process a block of data when index matches are rare.

As with the sparse matrix-dense vector dot-product engine, a bit-vector of row starts 2901 identifies entries in the matrix buffers 2992-2903 that start a new row of the matrix. When such an entry is encountered, the control logic 2940 resets to the beginning of the vector index buffer ATA3202 and starts examining vector indices from their lowest value, comparing them to the outputs of the matrix index buffer 2903. Similarly, if the end of the vector is reached, the control logic 2940 advances to the beginning of the next row in the matrix index buffer 2903 and resets to the beginning of the vector index buffer 2902. A "done" output informs the chip control unit when the dot-product engine has finished processing a block of data or a region of the vector and is ready to proceed to the next one. To simplify one implementation of the accelerator, the control logic 2940 will not proceed to the next block/region until all of the dot-product engines have finished processing.

In many cases, the vector buffers will be large enough to hold all of the sparse vector that is required to process the block. In one implementation, buffer space for 1,024 or 2,048 vector elements is provided, depending on whether 32- or 64-bit values are used.

When the required elements of the vector do not fit in the vector buffers, a multipass approach may be used. The control logic 2940 will broadcast a full buffer of the vector into each dot-product engine, which will begin iterating through the rows in its matrix buffers. When the dot-product engine reaches the end of the vector buffer before reaching the end of the row, it will set a bit in the current row position bit-vector 2911 to indicate where it should resume processing the row when the next region of the vector arrives, will save the partial dot-product it has accumulated in the location of the matrix values buffer 2905 corresponding to the start of the row unless the start of the row has a higher index value than any of the vector indices that have been processed so far, and will advance to the next row. After all of the rows in the matrix buffer have been processed, the dot-product engine will assert its done signal to request the next region of the vector, and will repeat the process until the entire vector has been read.

Figure 30:
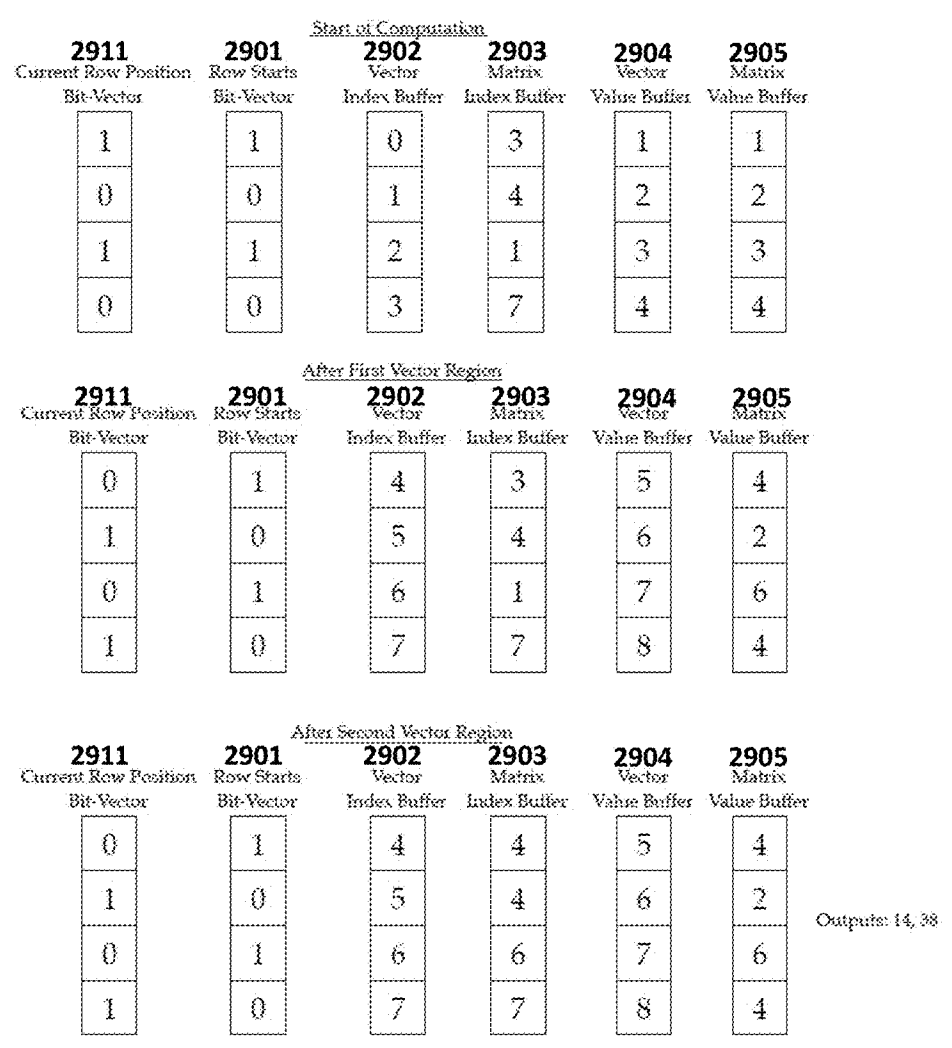

FIG. 30 illustrates an example using specific values. At the start of the computation 3001, a four-element chunk of the matrix has been written into the matrix buffers 2903, 2905, and a four-element region of the vector has been written into the vector buffers 2902, 2904. The row starts 2901 and current row position bit-vectors 2911 both have the value "1010," indicating that the dot-product engine's chunk of the matrix contains two rows, one of which starts at the first element in the matrix buffer, and one of which starts at the third.

When the first region is processed, the first row in the chunk sees an index match at index 3, computes the product of the corresponding elements of the matrix and vector buffers (4×1=4) and writes that value into the location of the matrix value buffer 2905 that corresponds to the start of the row. The second row sees one index match at index 1, computes the product of the corresponding elements of the vector and matrix, and writes the result (6) into the matrix value buffer 2905 at the position corresponding to its start. The state of the current row position bit-vector changes to "0101," indicating that the first element of each row has been processed and the computation should resume with the second elements. The dot-product engine then asserts its done line to signal that it is ready for another region of the vector.

When the dot-product engine processes the second region of the vector, it sees that row 1 has an index match at index 4, computes the product of the corresponding values of the matrix and vector (5×2=10), adds that value to the partial dot-product that was saved after the first vector region was processed, and outputs the result (14). The second row finds a match at index 7, and outputs the result 38, as shown in the figure. Saving the partial dot-products and state of the computation in this way avoids redundant work processing elements of the matrix that cannot possibly match indices in later regions of the vector (because the vector is sorted with indices in ascending order), without requiring significant amounts of extra storage for partial products.

Unified Dot-Product Engine Design

Figure 31:
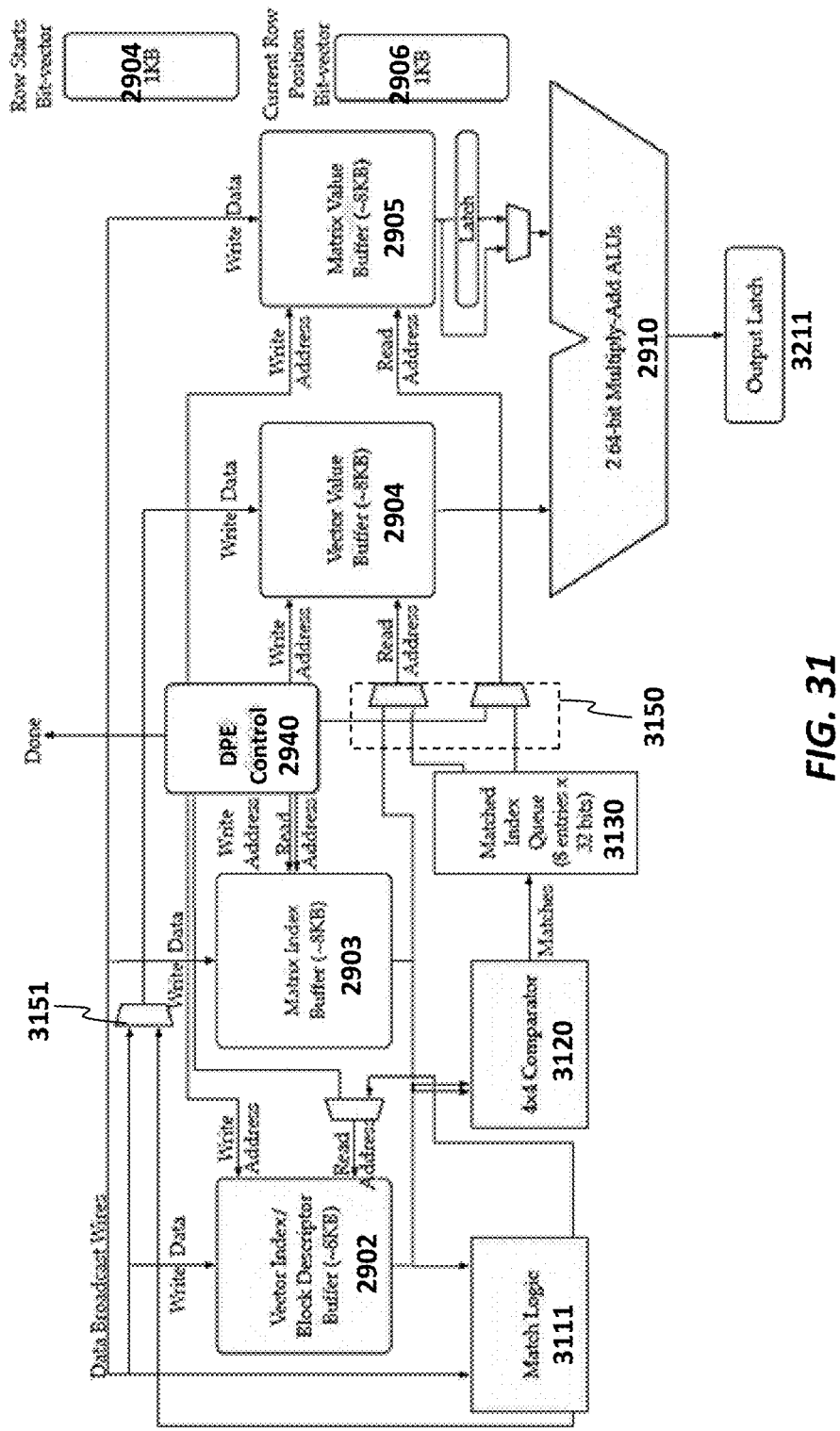
FIG. 31 illustrates how the sparse-dense and sparse-sparse dot-product engines described above can be combined to yield a dot-product engine that can handle both types of computations according to some embodiments.

FIG. 31 shows how the sparse-dense and sparse-sparse dot-product engines described above are combined to yield a dot-product engine that can handle both types of computations. Given the similarity between the two designs, the only required changes are to instantiate both the sparse-dense dot-product engine's match logic 3111 and the sparse-sparse dot-product engine's comparator 3120 and matched index queue 3130, along with a set of multiplexors 3150 that determine which modules drive the read address and write data inputs of the buffers 2904-2905 and a multiplexor 3151 that selects whether the output of the matrix value buffer or the latched output of the matrix value buffer is sent to the multiply-add ALUs 2910. In one implementation, these multiplexors are controlled by a configuration bit in the control unit 2940 that is set at the beginning of a matrix-vector multiplication and remain in the same configuration throughout the operation.

Instruction Sets

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2014; and see Intel® Advanced Vector Extensions Programming Reference, October 2014).

Exemplary Register Architecture

Figure 32:
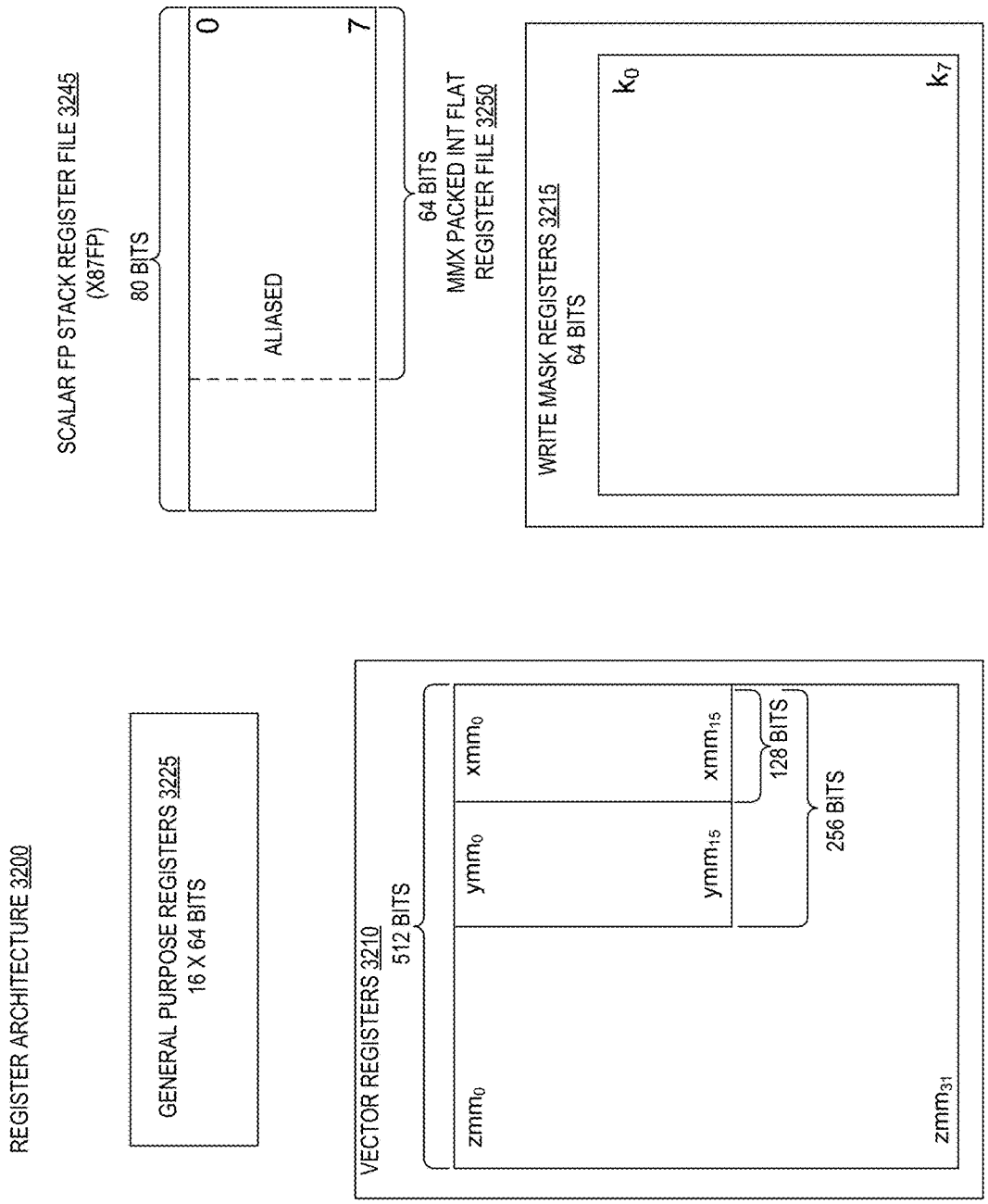
FIG. 32 is a block diagram of a register architecture according to some embodiments.

FIG. 32 is a block diagram of a register architecture 3200 according to one embodiment of the invention. In the embodiment illustrated, there are 32 vector registers 3210 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15.

Write mask registers 3215—in the embodiment illustrated, there are 8 write mask registers (k0 through k7), each 64 bits in size. In an alternate embodiment, the write mask registers 3215 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 3225—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 3245, on which is aliased the MMX packed integer flat register file 3250—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 33A is a block diagram illustrating both an exemplary in-order pipeline and an exemplary register renaming, out-of-order issue/execution pipeline according to embodiments of the invention. FIG. 33B is a block diagram illustrating both an exemplary embodiment of an in-order architecture core and an exemplary register renaming, out-of-order issue/execution architecture core to be included in a processor according to embodiments of the invention. The solid lined boxes in FIGS. 33A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 33A, a processor pipeline 3300 includes a fetch stage 3302, a length decode stage 3304, a decode stage 3306, an allocation stage 3308, a renaming stage 3310, a scheduling (also known as a dispatch or issue) stage 3312, a register read/memory read stage 3314, an execute stage 3316, a write back/memory write stage 3318, an exception handling stage 3322, and a commit stage 3324.

FIG. 33B shows processor core 3390 including a front end unit 3330 coupled to an execution engine unit 3350, and both are coupled to a memory unit 3370. The core 3390 may be a reduced instruction set computing (RISC) core, a complex instruction set computing (CISC) core, a very long instruction word (VLIW) core, or a hybrid or alternative core type. As yet another option, the core 3390 may be a special-purpose core, such as, for example, a network or communication core, compression engine, coprocessor core, general purpose computing graphics processing unit (GPGPU) core, graphics core, or the like.

The front end unit 3330 includes a branch prediction unit 3332 coupled to an instruction cache unit 3334, which is coupled to an instruction translation lookaside buffer (TLB) 3336, which is coupled to an instruction fetch unit 3338, which is coupled to a decode unit 3340. The decode unit 3340 (or decoder) may decode instructions, and generate as an output one or more micro-operations, micro-code entry points, microinstructions, other instructions, or other control signals, which are decoded from, or which otherwise reflect, or are derived from, the original instructions. The decode unit 3340 may be implemented using various different mechanisms. Examples of suitable mechanisms include, but are not limited to, look-up tables, hardware implementations, programmable logic arrays (PLAs), microcode read only memories (ROMs), etc. In one embodiment, the core 3390 includes a microcode ROM or other medium that stores microcode for certain macroinstructions (e.g., in decode unit 3340 or otherwise within the front end unit 3330). The decode unit 3340 is coupled to a rename/allocator unit 3352 in the execution engine unit 3350.

The execution engine unit 3350 includes the rename/allocator unit 3352 coupled to a retirement unit 3354 and a set of one or more scheduler unit(s) 3356. The scheduler unit(s) 3356 represents any number of different schedulers, including reservations stations, central instruction window, etc. The scheduler unit(s) 3356 is coupled to the physical register file(s) unit(s) 3358. Each of the physical register file(s) units 3358 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 3358 comprises a vector registers unit, a write mask registers unit, and a scalar registers unit. These register units may provide architectural vector registers, vector mask registers, and general purpose registers. The physical register file(s) unit(s) 3358 is overlapped by the retirement unit 3354 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 3354 and the physical register file(s) unit(s) 3358 are coupled to the execution cluster(s) 3360. The execution cluster(s) 3360 includes a set of one or more execution units 3362 and a set of one or more memory access units 3364. The execution units 3362 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 3356, physical register file(s) unit(s) 3358, and execution cluster(s) 3360 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 3364). It should also be understood that where separate pipelines are used, one or more of these pipelines may be out-of-order issue/execution and the rest in-order.

The set of memory access units 3364 is coupled to the memory unit 3370, which includes a data TLB unit 3372 coupled to a data cache unit 3374 coupled to a level 2 (L2) cache unit 3376. In one exemplary embodiment, the memory access units 3364 may include a load unit, a store address unit, and a store data unit, each of which is coupled to the data TLB unit 3372 in the memory unit 3370. The instruction cache unit 3334 is further coupled to a level 2 (L2) cache unit 3376 in the memory unit 3370. The L2 cache unit 3376 is coupled to one or more other levels of cache and eventually to a main memory.

By way of example, the exemplary register renaming, out-of-order issue/execution core architecture may implement the pipeline 3300 as follows: 1) the instruction fetch 3338 performs the fetch and length decoding stages 3302 and 3304; 2) the decode unit 3340 performs the decode stage 3306; 3) the rename/allocator unit 3352 performs the allocation stage 3308 and renaming stage 3310; 4) the scheduler unit(s) 3356 performs the schedule stage 3312; 5) the physical register file(s) unit(s) 3358 and the memory unit 3370 perform the register read/memory read stage 3314; the execution cluster 3360 perform the execute stage 3316; 6) the memory unit 3370 and the physical register file(s) unit(s) 3358 perform the write back/memory write stage 3318; 7) various units may be involved in the exception handling stage 3322; and 8) the retirement unit 3354 and the physical register file(s) unit(s) 3358 perform the commit stage 3324.

The core 3390 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 3390 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 3334/3374 and a shared L2 cache unit 3376, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary in-Order Core Architecture

Figure 34A:
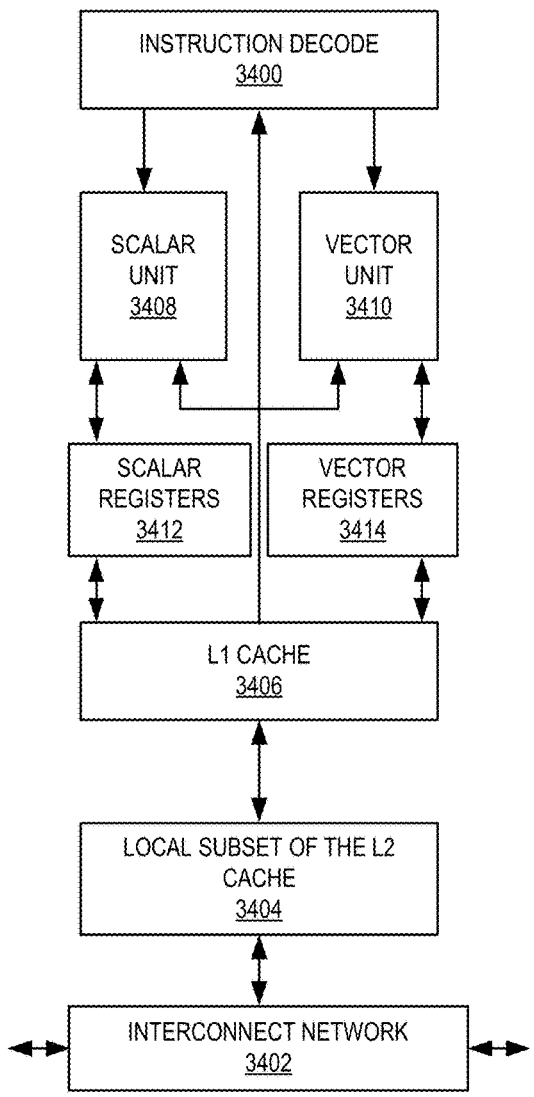
FIGS. 34A-B illustrate a block diagram of a more specific exemplary in-order core architecture, which core would be one of several logic blocks (including other cores of the same type and/or different types) in a chip.
Figure 34B:
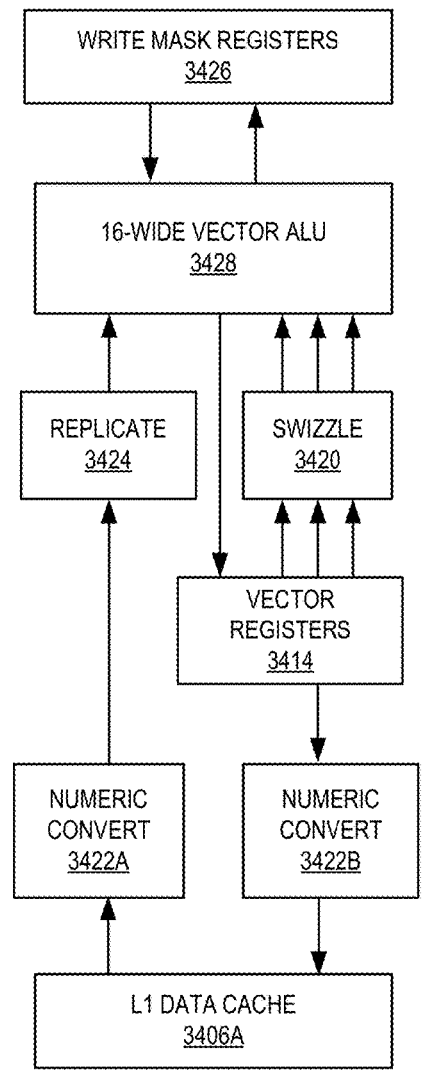

FIGS. 34A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 34A is a block diagram of a single processor core, along with its connection to the on-die interconnect network 3402 and with its local subset of the Level 2 (L2) cache 3404, according to embodiments of the invention. In one embodiment, an instruction decoder 3400 supports the x86 instruction set with a packed data instruction set extension. An L1 cache 3406 allows low-latency accesses to cache memory into the scalar and vector units. While in one embodiment (to simplify the design), a scalar unit 3408 and a vector unit 3410 use separate register sets (respectively, scalar registers 3412 and vector registers 3414) and data transferred between them is written to memory and then read back in from a level 1 (L1) cache 3406, alternative embodiments of the invention may use a different approach (e.g., use a single register set or include a communication path that allow data to be transferred between the two register files without being written and read back).

The local subset of the L2 cache 3404 is part of a global L2 cache that is divided into separate local subsets, one per processor core. Each processor core has a direct access path to its own local subset of the L2 cache 3404. Data read by a processor core is stored in its L2 cache subset 3404 and can be accessed quickly, in parallel with other processor cores accessing their own local L2 cache subsets. Data written by a processor core is stored in its own L2 cache subset 3404 and is flushed from other subsets, if necessary. The ring network ensures coherency for shared data. The ring network is bi-directional to allow agents such as processor cores, L2 caches and other logic blocks to communicate with each other within the chip. Each ring datapath is 1012-bits wide per direction.

FIG. 34B is an expanded view of part of the processor core in FIG. 34A according to embodiments of the invention. FIG. 34B includes an L1 data cache 3406A part of the L1 cache 3404, as well as more detail regarding the vector unit 3410 and the vector registers 3414. Specifically, the vector unit 3410 is a 16-wide vector processing unit (VPU) (see the 16-wide ALU 3428), which executes one or more of integer, single-precision float, and double-precision float instructions. The VPU supports swizzling the register inputs with swizzle unit 3420, numeric conversion with numeric convert units 3422A-B, and replication with replication unit 3424 on the memory input. Write mask registers 3426 allow predicating resulting vector writes.

Figure 35:
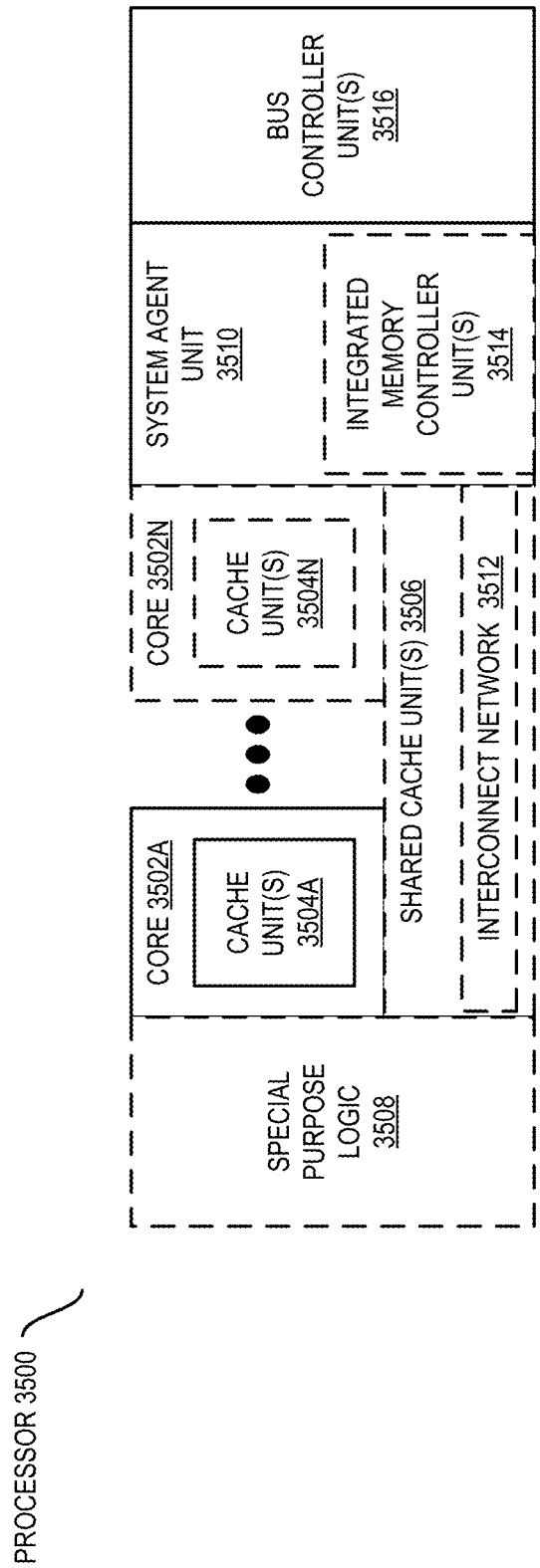
FIG. 35 is a block diagram of a processor that may have more than one core, may have an integrated memory controller, and may have integrated graphics according to some embodiments.

FIG. 35 is a block diagram of a processor 3500 that may have more than one core, may have an integrated memory controller, and may have integrated graphics according to embodiments of the invention. The solid lined boxes in FIG. 35 illustrate a processor 3500 with a single core 3502A, a system agent 3510, a set of one or more bus controller units 3516, while the optional addition of the dashed lined boxes illustrates an alternative processor 3500 with multiple cores 3502A-N, a set of one or more integrated memory controller unit(s) 3514 in the system agent unit 3510, and special purpose logic 3508.

Thus, different implementations of the processor 3500 may include: 1) a CPU with the special purpose logic 3508 being integrated graphics and/or scientific (throughput) logic (which may include one or more cores), and the cores 3502A-N being one or more general purpose cores (e.g., general purpose in-order cores, general purpose out-of-order cores, a combination of the two); 2) a coprocessor with the cores 3502A-N being a large number of special purpose cores intended primarily for graphics and/or scientific (throughput); and 3) a coprocessor with the cores 3502A-N being a large number of general purpose in-order cores. Thus, the processor 3500 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 3500 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 3506, and external memory (not shown) coupled to the set of integrated memory controller units 3514. The set of shared cache units 3506 may include one or more mid-level caches, such as level 2 (L2), level 3 (L3), level 4 (L4), or other levels of cache, a last level cache (LLC), and/or combinations thereof. While in one embodiment a ring based interconnect unit 3512 interconnects the special purpose logic 3508 (e.g., integrated graphics logic), the set of shared cache units 3506, and the system agent unit 3510/ integrated memory controller unit(s) 3514, alternative embodiments may use any number of well-known techniques for interconnecting such units. In one embodiment, coherency is maintained between one or more cache units 3506 and cores 3502-A-N.

In some embodiments, one or more of the cores 3502A-N are capable of multithreading. The system agent 3510 includes those components coordinating and operating cores 3502A-N. The system agent unit 3510 may include for example a power control unit (PCU) and a display unit. The PCU may be or include logic and components needed for regulating the power state of the cores 3502A-N and the integrated graphics logic 3508. The display unit is for driving one or more externally connected displays.

The cores 3502A-N may be homogenous or heterogeneous in terms of architecture instruction set; that is, two or more of the cores 3502A-N may be capable of execution the same instruction set, while others may be capable of executing only a subset of that instruction set or a different instruction set.

Exemplary Computer Architectures

FIGS. 36-39 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 36:
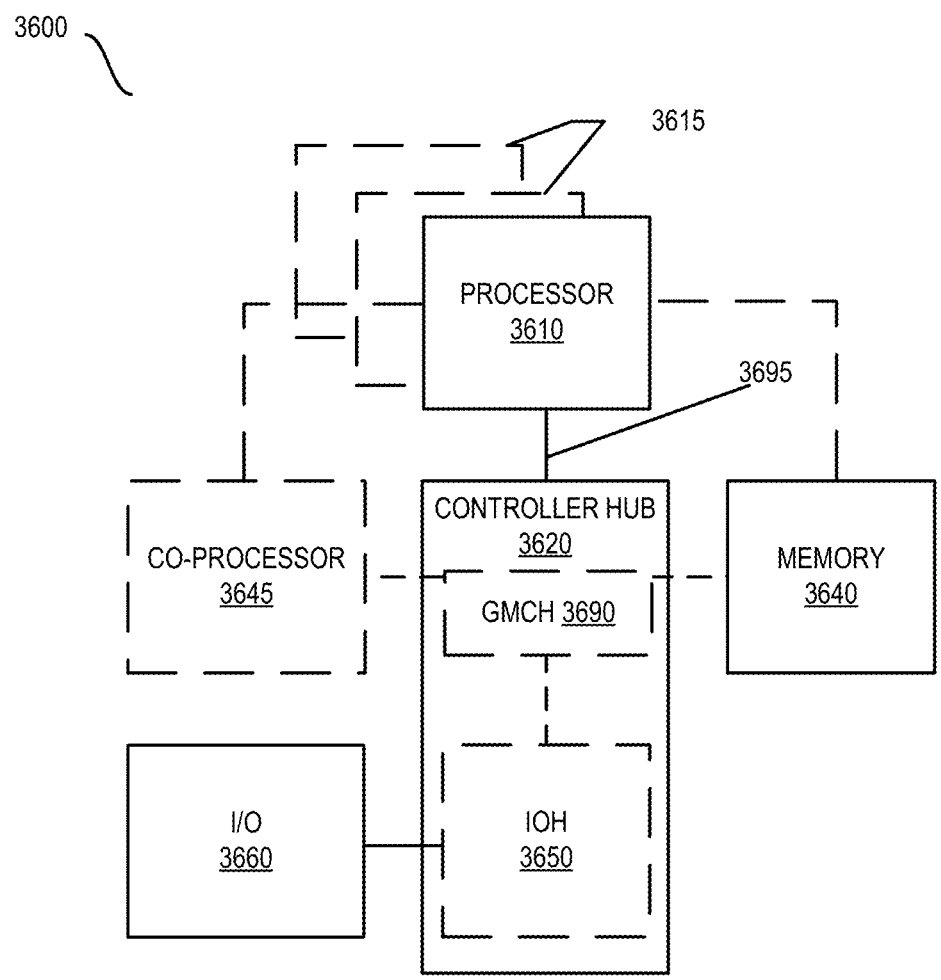
FIGS. 36-39 are block diagrams of exemplary computer architectures.

Referring now to FIG. 36, shown is a block diagram of a system 3600 in accordance with one embodiment of the present invention. The system 3600 may include one or more processors 3610, 3615, which are coupled to a controller hub 3620. In one embodiment the controller hub 3620 includes a graphics memory controller hub (GMCH) 3690 and an Input/Output Hub (IOH) 3650 (which may be on separate chips); the GMCH 3690 includes memory and graphics controllers to which are coupled memory 3640 and a coprocessor 3645; the IOH 3650 couples input/output (I/O) devices 3660 to the GMCH 3690. Alternatively, one or both of the memory and graphics controllers are integrated within the processor (as described herein), the memory 3640 and the coprocessor 3645 are coupled directly to the processor 3610, and the controller hub 3620 in a single chip with the IOH 3650.

The optional nature of additional processors 3615 is denoted in FIG. 36 with broken lines. Each processor 3610, 3615 may include one or more of the processing cores described herein and may be some version of the processor 3500.

The memory 3640 may be, for example, dynamic random access memory (DRAM), phase change memory (PCM), or a combination of the two. For at least one embodiment, the controller hub 3620 communicates with the processor(s) 3610, 3615 via a multi-drop bus, such as a frontside bus (FSB), point-to-point interface such as QuickPath Interconnect (QPI), or similar connection 3695.

In one embodiment, the coprocessor 3645 is a special-purpose processor, such as, for example, a high-throughput MIC processor, a network or communication processor, compression engine, graphics processor, GPGPU, embedded processor, or the like. In one embodiment, controller hub 3620 may include an integrated graphics accelerator.

There can be a variety of differences between the physical resources 3610, 3615 in terms of a spectrum of metrics of merit including architectural, microarchitectural, thermal, power consumption characteristics, and the like.

In one embodiment, the processor 3610 executes instructions that control data processing operations of a general type. Embedded within the instructions may be coprocessor instructions. The processor 3610 recognizes these coprocessor instructions as being of a type that should be executed by the attached coprocessor 3645. Accordingly, the processor 3610 issues these coprocessor instructions (or control signals representing coprocessor instructions) on a coprocessor bus or other interconnect, to coprocessor 3645. Coprocessor(s) 3645 accept and execute the received coprocessor instructions.

Figure 37:
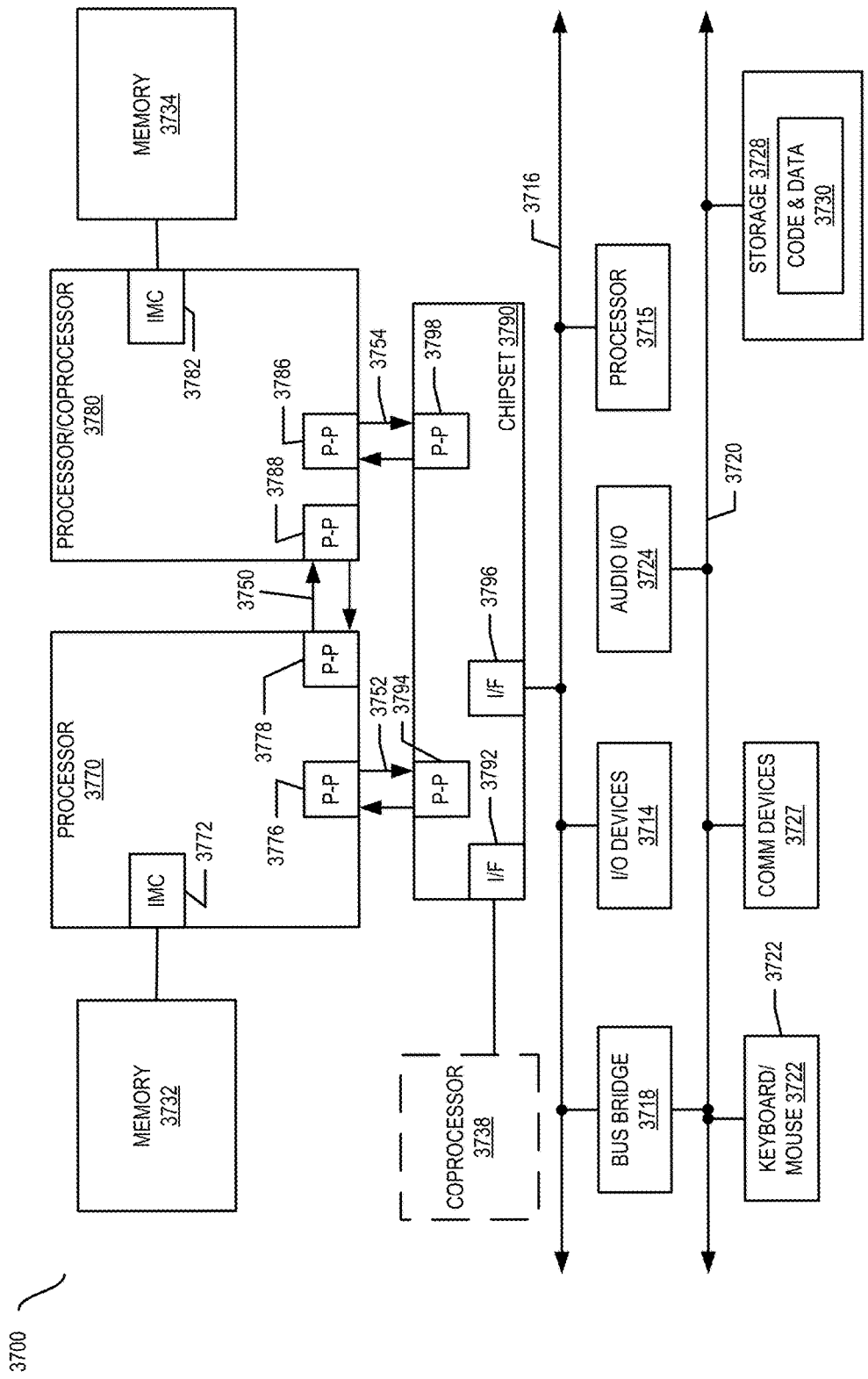

Referring now to FIG. 37, shown is a block diagram of a first more specific exemplary system 3700 in accordance with an embodiment of the present invention. As shown in FIG. 37, multiprocessor system 3700 is a point-to-point interconnect system, and includes a first processor 3770 and a second processor 3780 coupled via a point-to-point interconnect 3750. Each of processors 3770 and 3780 may be some version of the processor 3500. In one embodiment of the invention, processors 3770 and 3780 are respectively processors 3610 and 3615, while coprocessor 3738 is coprocessor 3645. In another embodiment, processors 3770 and 3780 are respectively processor 3610 coprocessor 3645.

Processors 3770 and 3780 are shown including integrated memory controller (IMC) units 3772 and 3782, respectively. Processor 3770 also includes as part of its bus controller units point-to-point (P-P) interfaces 3776 and 3778; similarly, second processor 3780 includes P-P interfaces 3786 and 3788. Processors 3770, 3780 may exchange information via a point-to-point (P-P) interface 3750 using P-P interface circuits 3778, 3788. As shown in FIG. 37, IMCs 3772 and 3782 couple the processors to respective memories, namely a memory 3732 and a memory 3734, which may be portions of main memory locally attached to the respective processors.

Processors 3770, 3780 may each exchange information with a chipset 3790 via individual P-P interfaces 3752, 3754 using point to point interface circuits 3776, 3794, 3786, 3798. Chipset 3790 may optionally exchange information with the coprocessor 3738 via a high-performance interface 3792. In one embodiment, the coprocessor 3738 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 3790 may be coupled to a first bus 3716 via an interface 3796. In one embodiment, first bus 3716 may be a Peripheral Component Interconnect (PCI) bus, or a bus such as a PCI Express bus or another third generation I/O interconnect bus, although the scope of the present invention is not so limited.

As shown in FIG. 37, various I/O devices 3714 may be coupled to first bus 3716, along with a bus bridge 3718 which couples first bus 3716 to a second bus 3720. In one embodiment, one or more additional processor(s) 3715, such as coprocessors, high-throughput MIC processors, GPGPU's, accelerators (such as, e.g., graphics accelerators or digital signal processing (DSP) units), field programmable gate arrays, or any other processor, are coupled to first bus 3716. In one embodiment, second bus 3720 may be a low pin count (LPC) bus. Various devices may be coupled to a second bus 3720 including, for example, a keyboard and/or mouse 3722, communication devices 3727 and a storage unit 3728 such as a disk drive or other mass storage device which may include instructions/code and data 3730, in one embodiment. Further, an audio I/O 3724 may be coupled to the second bus 3720. Note that other architectures are possible. For example, instead of the point-to-point architecture of FIG. 37, a system may implement a multi-drop bus or other such architecture.

Figure 38:
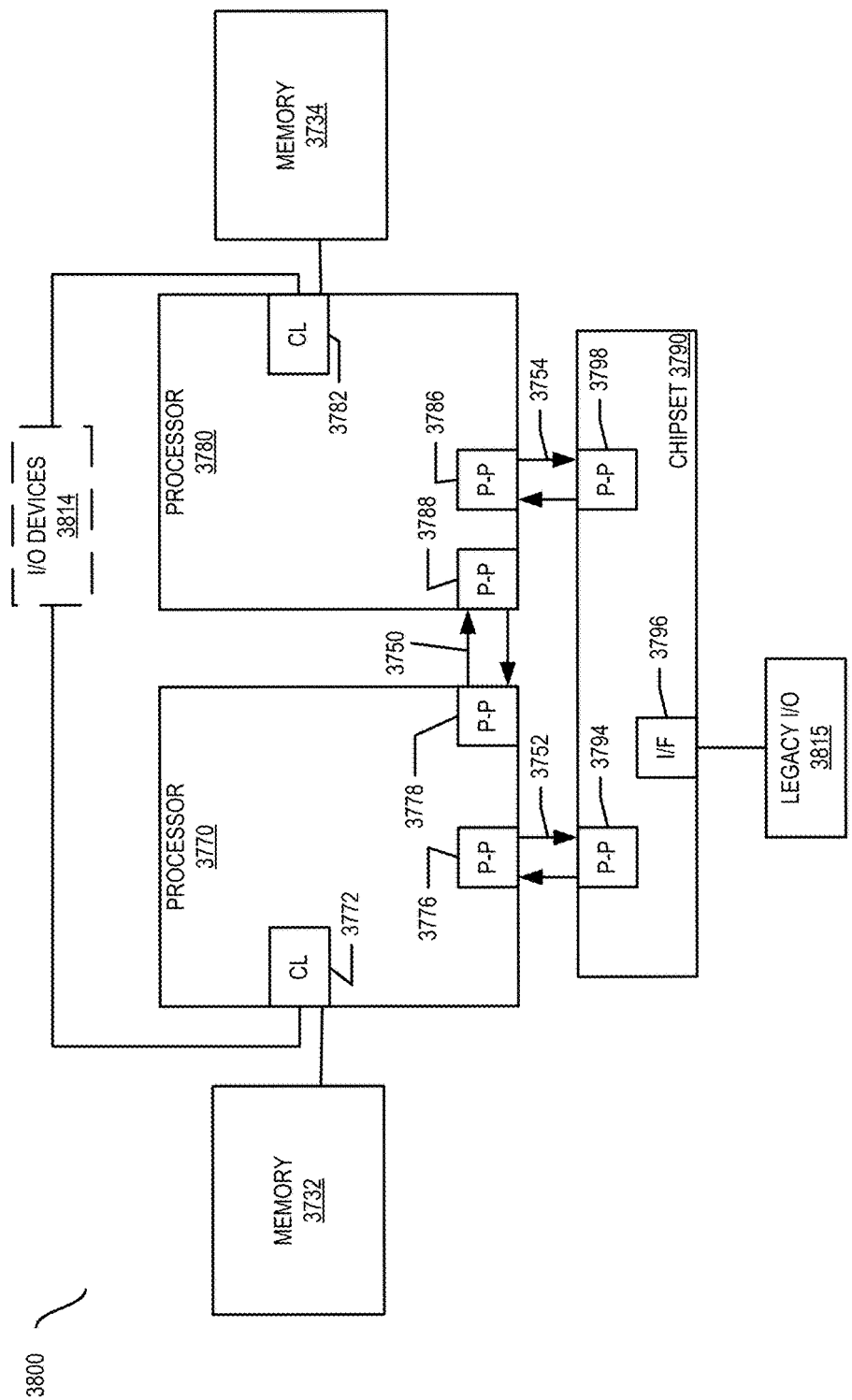

Referring now to FIG. 38, shown is a block diagram of a second more specific exemplary system 3800 in accordance with an embodiment of the present invention. Like elements in FIGS. 37 and 38 bear like reference numerals, and certain aspects of FIG. 37 have been omitted from FIG. 38 in order to avoid obscuring other aspects of FIG. 38.

FIG. 38 illustrates that the processors 3770, 3780 may include integrated memory and I/O control logic ("CL") 3772 and 3782, respectively. Thus, the CL 3772, 3782 include integrated memory controller units and include I/O control logic. FIG. 38 illustrates that not only are the memories 3732, 3734 coupled to the CL 3772, 3782, but also that I/O devices 3814 are also coupled to the control logic 3772, 3782. Legacy I/O devices 3815 are coupled to the chipset 3790.

Figure 39:
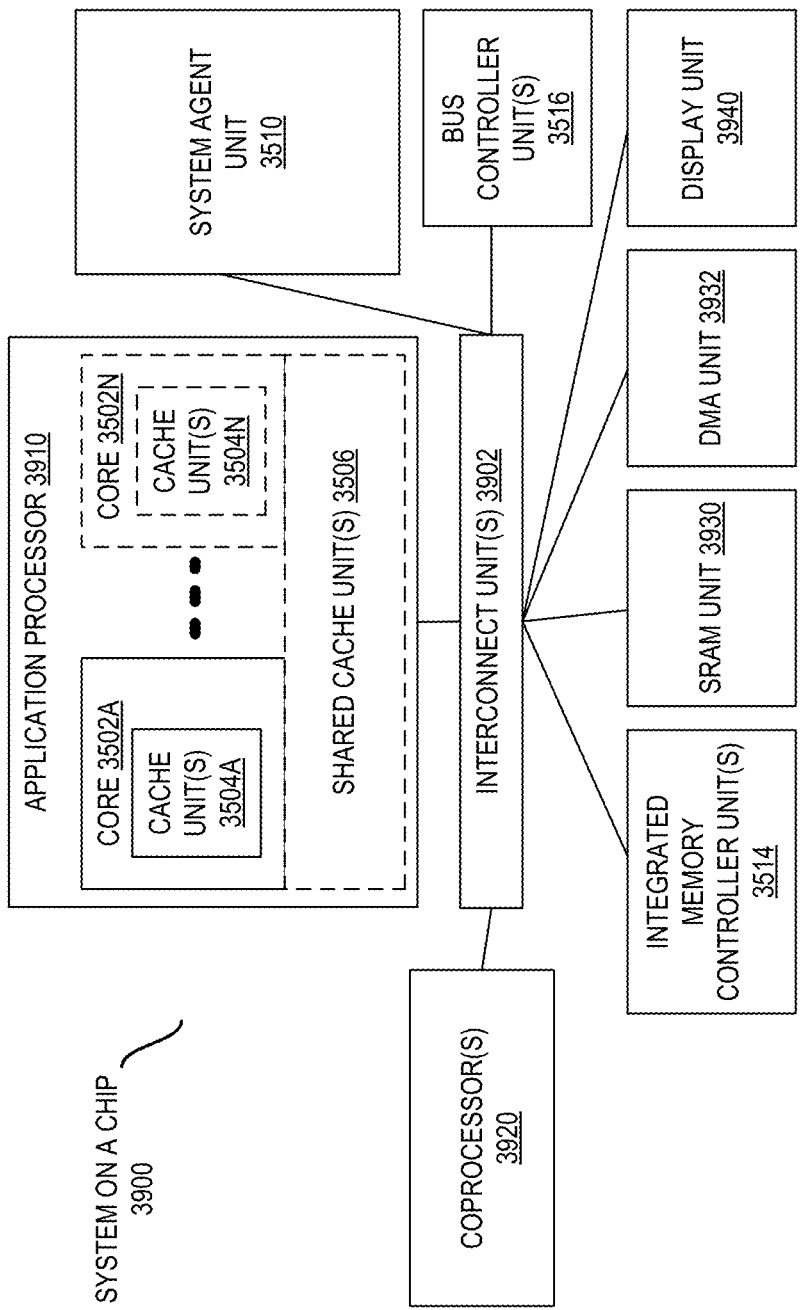

Referring now to FIG. 39, shown is a block diagram of a SoC 3900 in accordance with an embodiment of the present invention. Similar elements in FIG. 35 bear like reference numerals. Also, dashed lined boxes are optional features on more advanced SoCs. In FIG. 39, an interconnect unit(s) 3902 is coupled to: an application processor 3910 which includes a set of one or more cores 3502A-N, which include cache units 3504A-N, and shared cache unit(s) 3506; a system agent unit 3510; a bus controller unit(s) 3516; an integrated memory controller unit(s) 3514; a set or one or more coprocessors 3920 which may include integrated graphics logic, an image processor, an audio processor, and a video processor; an static random access memory (SRAM) unit 3930; a direct memory access (DMA) unit 3932; and a display unit 3940 for coupling to one or more external displays. In one embodiment, the coprocessor(s) 3920 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 3730 illustrated in FIG. 37, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 40:
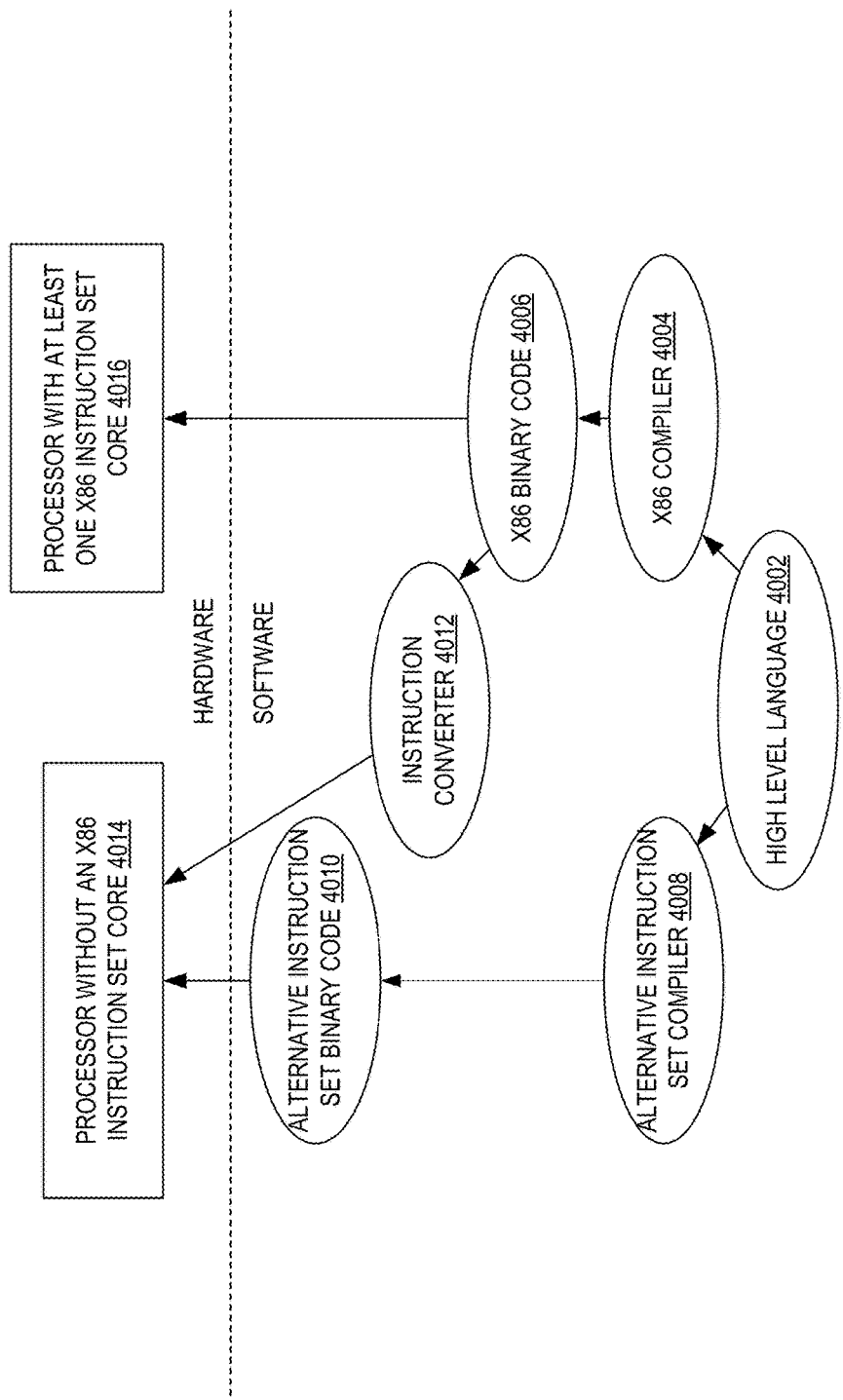
FIG. 40 is a block diagram contrasting the use of a software instruction converter to convert binary instructions in a source instruction set to binary instructions in a target instruction set according to some embodiments.

FIG. 40 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 40 shows a program in a high level language 4002 may be compiled using an x86 compiler 4004 to generate x86 binary code 4006 that may be natively executed by a processor with at least one x86 instruction set core 4016. The processor with at least one x86 instruction set core 4016 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 4004 represents a compiler that is operable to generate x86 binary code 4006 (e.g., object code) that can, with or without additional linkage processing, be executed on the processor with at least one x86 instruction set core 4016. Similarly, FIG. 40 shows the program in the high level language 4002 may be compiled using an alternative instruction set compiler 4008 to generate alternative instruction set binary code 4010 that may be natively executed by a processor without at least one x86 instruction set core 4014 (e.g., a processor with cores that execute the MIPS instruction set of MIPS Technologies of Sunnyvale, Calif. and/or that execute the ARM instruction set of ARM Holdings of Sunnyvale, Calif.). The instruction converter 4012 is used to convert the x86 binary code 4006 into code that may be natively executed by the processor without an x86 instruction set core 4014. This converted code is not likely to be the same as the alternative instruction set binary code 4010 because an instruction converter capable of this is difficult to make; however, the converted code will accomplish the general operation and be made up of instructions from the alternative instruction set. Thus, the instruction converter 4012 represents software, firmware, hardware, or a combination thereof that, through emulation, simulation or any other process, allows a processor or other electronic device that does not have an x86 instruction set processor or core to execute the x86 binary code 4006.

Though the flow diagrams in the figures show a particular order of operations performed by certain embodiments, it should be understood that such order is exemplary. Thus, alternative embodiments may perform the operations in a different order, combine certain operations, overlap certain operations, etc.

Additionally, although the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A method in a hardware processor for processing sparse matrix data from a matrix having a skewed non-zero distribution comprising:
   determining, by the hardware processor, that one or more computational tasks involving the matrix are to be performed;
   partitioning, by the hardware processor, the matrix into a first plurality of blocks and a second plurality of blocks, wherein the first plurality of blocks includes one or more sections of the matrix that are sparse, and wherein the second plurality of blocks includes another one or more sections of the matrix that are very- or hyper-sparse; and
   causing, by the hardware processor, one or more sparse tiles of the hardware processor to perform one or more matrix operations for the one or more computational tasks using the first plurality of blocks and further causing one or more very/hyper sparse tiles of the hardware processor to perform the one or more matrix operations for the one or more computational tasks using the second plurality of blocks, wherein the one or more sparse tiles access ones of the first plurality of blocks over a first interface that has a higher bandwidth than that of a second interface, and wherein the one or more very/hyper sparse tiles access ones of the second plurality of blocks over the second interface that has a lower latency than that of the first interface.

2. The method of claim 1, further comprising:
   after determining that the one or more computational tasks involving the matrix are to be performed, determining, by the hardware processor, that the matrix is sparse and has a skewed non-zero distribution, wherein said partitioning of the matrix into the first plurality of blocks and the second plurality of blocks occurs responsive to determining that the matrix is sparse and does have the skewed non-zero distribution.

3. The method of claim 1, wherein said partitioning comprises:
   determining a number of rows or columns of the matrix having only zero values.

4. The method of claim 3, wherein said partitioning comprises:
   determining whether the number satisfies a threshold criteria.

5. The method of claim 1, further comprising converting a format of each of the second plurality of blocks into a doubly-compressed format.

6. The method of claim 1, wherein said causing the one or more sparse tiles to perform the one or more matrix operations comprises storing the first plurality of blocks in a first memory unit, the first memory unit to stream data of the first plurality of blocks to the one or more sparse tiles over the first interface.

7. The method of claim 6, wherein said causing the one or more very/hyper sparse tiles to perform the one or more matrix operations comprises storing the second plurality of blocks in a second memory unit, the second memory unit to provide data of the second plurality of blocks to the one or more very/hyper sparse tiles responsive to random access requests from the one or more very/hyper sparse tiles over the second interface.

8. A hardware processor comprising:
   one or more sparse tiles comprising a first plurality of processing units to access data from a first memory unit over a high bandwidth interface;
   one or more very/hyper sparse tiles comprising a second plurality of processing units to randomly access data from a second memory unit over a low-latency interface; and
   a control unit to:
      determine that one or more computational tasks involving a matrix are to be performed;
      partition the matrix into a first plurality of blocks and a second plurality of blocks, wherein the first plurality of blocks includes one or more sections of the matrix that are sparse, and wherein the second plurality of blocks includes another one or more sections of the matrix that are very- or hyper-sparse; and
cause the one or more sparse tiles to perform one or more matrix operations for the one or more computational tasks using the first plurality of blocks and further cause the one or more very/hyper sparse tiles to perform the one or more matrix operations for the one or more computational tasks using the second plurality of blocks.

9. The hardware processor of claim 8, wherein the control unit is further to determine whether the matrix is sparse and has a skewed non-zero distribution, wherein the control unit is to perform the partition responsive to a determination that the matrix is sparse and does have the skewed non-zero distribution.

10. The hardware processor of claim 8, wherein, to partition the matrix into the first plurality of blocks and the second plurality of blocks, the control unit is to:
determine a number of rows or columns of the matrix having only zero values.

11. The hardware processor of claim 10, wherein, to partition the matrix into the first plurality of blocks and the second plurality of blocks, the control unit is further to:
determine whether the number satisfies a threshold criteria.

12. The hardware processor of claim 8, wherein the control unit is further to convert a format of each of the second plurality of blocks into a doubly-compressed format.

13. The hardware processor claim 8, wherein, to cause the one or more sparse tiles to perform the one or more matrix operations, the control unit is to cause the first plurality of blocks to be stored in a first memory unit, the first memory unit to stream data of the first plurality of blocks to the one or more sparse tiles over a high-bandwidth interface.

14. The hardware processor of claim 13, wherein, to cause the one or more very/hyper sparse tiles to perform the one or more matrix operations, the control unit is to store the second plurality of blocks in a second memory unit, the second memory unit to provide data of the second plurality of blocks to the one or more very/hyper sparse tiles responsive to random access requests from the one or more very/hyper sparse tiles over a low-latency interface.

15. A system comprising:
a first memory unit;
a second memory unit;
one or more sparse tiles comprising a first plurality of processing units to access data from the first memory unit over a high bandwidth interface;
one or more very/hyper sparse tiles comprising a second plurality of processing units to randomly access data from the second memory unit over a low-latency interface; and
a control unit to:
determine that one or more computational tasks involving a matrix are to be performed;
partition the matrix into a first plurality of blocks and a second plurality of blocks, wherein the first plurality of blocks includes one or more sections of the matrix that are sparse, and wherein the second plurality of blocks includes another one or more sections of the matrix that are very- or hyper-sparse; and
cause the one or more sparse tiles to perform one or more matrix operations for the one or more computational tasks using the first plurality of blocks and further cause the one or more very/hyper sparse tiles to perform the one or more matrix operations for the one or more computational tasks using the second plurality of blocks.

16. The system of claim 15, wherein the control unit is further to determine whether the matrix is sparse and has a skewed non-zero distribution, wherein the control unit is to perform the partition responsive to a determination that the matrix is sparse and does have the skewed non-zero distribution.

17. The system of claim 15, wherein, to partition the matrix into the first plurality of blocks and the second plurality of blocks, the control unit is to:
determine a number of rows or columns of the matrix having only zero values.

18. The system of claim 17, wherein, to partition the matrix into the first plurality of blocks and the second plurality of blocks, the control unit is further to:
determine whether the number satisfies a threshold criteria.

19. The system of claim 15, wherein the control unit is further to convert a format of each of the second plurality of blocks into a doubly-compressed format.

20. The system of claim 15, wherein, to cause the one or more sparse tiles to perform the one or more matrix operations, the control unit is to cause the first plurality of blocks to be stored in a first memory unit, the first memory unit to stream data of the first plurality of blocks to the one or more sparse tiles over a high-bandwidth interface.

* * * * *